US012701983B2

(12) United States Patent
Lin et al.

(10) Patent No.: US 12,701,983 B2
(45) Date of Patent: Aug. 4, 2026

(54) INTEGRATED CIRCUIT DEVICE AND MANUFACTURING METHOD

(71) Applicant: TAIWAN SEMICONDUCTOR MANUFACTURING COMPANY, LTD., Hsinchu (TW)

(72) Inventors: Chin-Shen Lin, Hsinchu (TW); Luk Lu, Hsinchu (TW); Hao-Tien Kan, Hsinchu (TW); Ren-Zheng Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 834 days.

(21) Appl. No.: 17/929,397

(22) Filed: Sep. 2, 2022

(65) Prior Publication Data

US 2023/0420369 A1     Dec. 28, 2023

Related U.S. Application Data

(60) Provisional application No. 63/356,153, filed on Jun. 28, 2022.

(51) Int. Cl.
H10W 70/65          (2026.01)
H10W 20/00          (2026.01)
(Continued)

(52) U.S. Cl.
CPC ....... H10W 20/427 (2026.01); H10W 20/023 (2026.01); H10W 20/20 (2026.01); H10W 20/435 (2026.01)

(58) Field of Classification Search
CPC ........... H01L 23/5286; H01L 21/76898; H01L 23/481; H01L 23/5283; H01L 23/5226;
(Continued)

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |

(Continued)

FOREIGN PATENT DOCUMENTS

| | | |
|---|---|---|
| CN | 210956674 | 7/2020 |
| DE | 10 2019 127 073 | 3/2021 |

(Continued)

*Primary Examiner* — Dale E Page
*Assistant Examiner* — Cristian A Tivarus
(74) *Attorney, Agent, or Firm* — Hauptman Ham, LLP

(57)          ABSTRACT

An integrated circuit (IC) device includes a substrate with a power control circuit, front and back side metal layers, and first and second feed through vias (FTVs). The front side metal layer has first and second front side power rails. The back side metal layer has first and second back side power rails. The first FTV extends through the substrate, and couples the first front side power rail to the first back side power rail. The second FTV extends through the substrate, and couples the second front side power rail to the second back side power rail. The power control circuit is coupled to the first and second front side power rails, and is controllable to electrically connect the first front side power rail to the second front side power rail, or electrically disconnect the first front side power rail from the second front side power rail.

20 Claims, 26 Drawing Sheets

(51) Int. Cl.

| | |
|---|---|
| *H10W 20/20* | (2026.01) |
| *H10W 20/41* | (2026.01) |
| *H10W 70/685* | (2026.01) |

(58) Field of Classification Search
CPC . H01L 21/768; H01L 23/535; H01L 23/5383; H01L 23/5386; H01L 2224/0231; H10D 30/60; H10D 64/254; H10D 84/85; G06F 30/39; H10W 20/20; H10W 20/427; H10W 20/023; H10W 20/435; H10W 20/212; H10W 20/2134; H10W 20/481; H10W 70/65; H10W 70/685
See application file for complete search history.

(56) References Cited

U.S. PATENT DOCUMENTS

| | | | |
|---|---|---|---|
| 10,872,820 B2 | 12/2020 | Block et al. | |
| 10,950,546 B1 | 3/2021 | Doornbos | |
| 11,810,856 B2 | 11/2023 | Li et al. | |
| 11,948,886 B2 | 4/2024 | Wu et al. | |
| 2014/0040838 A1 | 2/2014 | Liu et al. | |
| 2015/0278429 A1 | 10/2015 | Chang | |
| 2017/0070225 A1 | 3/2017 | Kim et al. | |
| 2020/0020779 A1* | 1/2020 | Trang | H10D 64/411 |
| 2021/0098361 A1* | 4/2021 | Doornbos | H10D 88/01 |
| 2021/0305130 A1* | 9/2021 | Cho | H01L 21/76898 |
| 2022/0005800 A1 | 1/2022 | Lee | |
| 2022/0077134 A1* | 3/2022 | Chen | H01L 23/5286 |
| 2022/0122970 A1* | 4/2022 | Do | H01L 23/50 |
| 2022/0208757 A1* | 6/2022 | Do | H01L 23/535 |
| 2023/0075756 A1* | 3/2023 | Kim | H10D 30/6735 |

FOREIGN PATENT DOCUMENTS

| | | |
|---|---|---|
| DE | 10 2021 111 423 | 4/2022 |
| KR | 10-2018-0051592 | 5/2018 |
| KR | 10-2019-0036521 | 4/2019 |
| KR | 10-2021-0148892 | 12/2021 |
| KR | 10-2022-0050267 | 4/2022 |
| KR | 10-2022-0054165 | 5/2022 |
| TW | 202141486 | 11/2021 |
| TW | I767841 | 6/2022 |
| TW | 202315022 | 4/2023 |
| WO | 2021111604 | 6/2021 |

* cited by examiner

1100B(1100)

330

331

333
320    321
M1  V0  M0  VG  TVDD
318
VD
MD
311
310
312

322
VVDD  VD  P31  PO
319  MD

332

314 317 315 316 313

Z-axis 321    320    318
VG    VD
PO    MD
P31
322
VD
MD
319

311
310
312

313

314 317 315 316

1100A(1100)

Z-axis

1200A 1202 generate a layout diagram 1204 make, based on the layout diagram, one or more photolithographic exposures
OR
fabricate, based on the layout diagram, one or more masks
OR
fabricate, based on the layout diagram, one or more components of IC

1200B 1202
generate a layout diagram 1212
selecting, from a plurality of FTV cells having different configurations, an FTV cell 1214
placing the selected FTV cell in association with a circuit in a layout diagram of an IC device, the placed FTV cell providing at least one electrical connection between the circuit and a back side power rail of the IC device

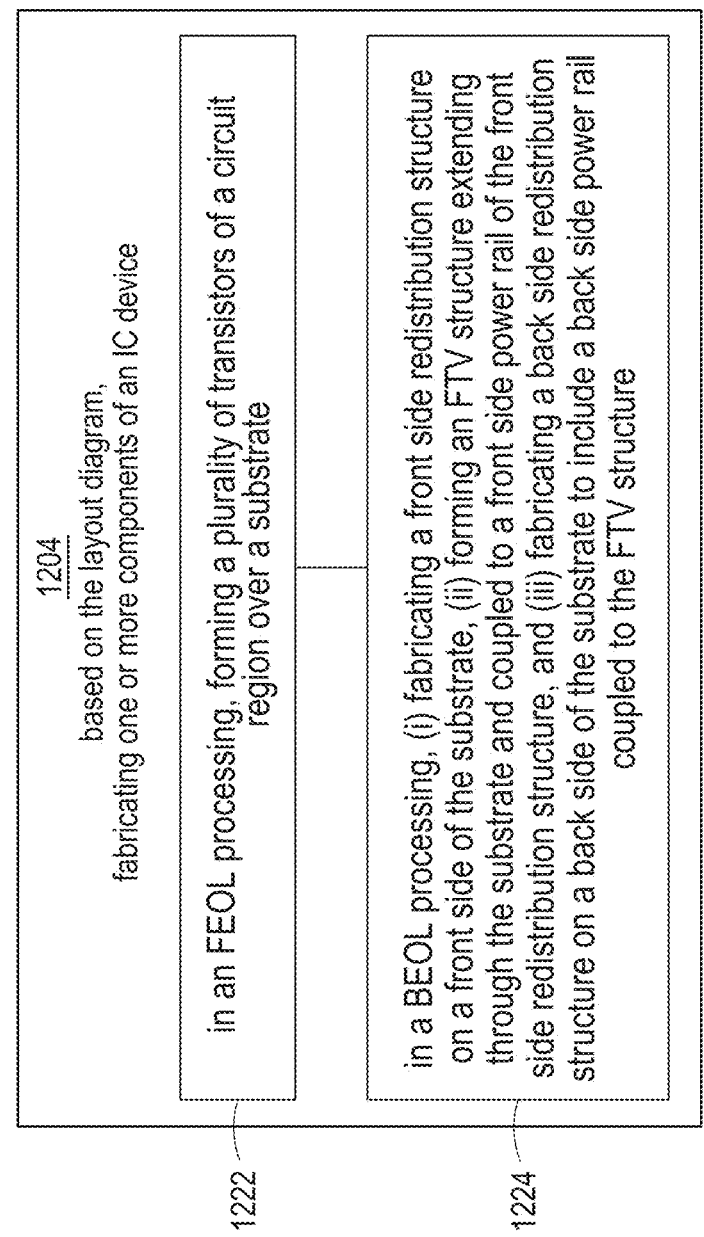

1200C

1204
based on the layout diagram,
fabricating one or more components of an IC device 1222 — in an FEOL processing, forming a plurality of transistors of a circuit region over a substrate 1224 — in a BEOL processing, (i) fabricating a front side redistribution structure on a front side of the substrate, (ii) forming an FTV structure extending through the substrate and coupled to a front side power rail of the front side redistribution structure, and (iii) fabricating a back side redistribution structure on a back side of the substrate to include a back side power rail coupled to the FTV structure

FIG. 12C

INTEGRATED CIRCUIT DEVICE AND MANUFACTURING METHOD

RELATED APPLICATION(S)

The instant application claims the benefit of U.S. Provisional Application No. 63/356,153, filed Jun. 28, 2022, the entirety of which is incorporated by reference herein.

BACKGROUND

An integrated circuit ("IC") device or semiconductor device includes one or more devices represented in an IC layout diagram (also referred to as a "layout diagram"). A layout diagram is hierarchical and includes modules which carry out higher-level functions in accordance with the IC design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

Minimization of power consumption of a semiconductor device is a design consideration. An approach involves including a header circuit (also referred to as "header switch") and/or a footer circuit (also referred to as "footer switch") between a power supply node (or rail) and a functional circuit. The power consumption is reduced by turning OFF the header switch and/or the footer switch when the functional circuit is in a non-active state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12A-12C are flowcharts of various methods, in accordance with some embodiments.

DETAILED DESCRIPTION

Figure 2:
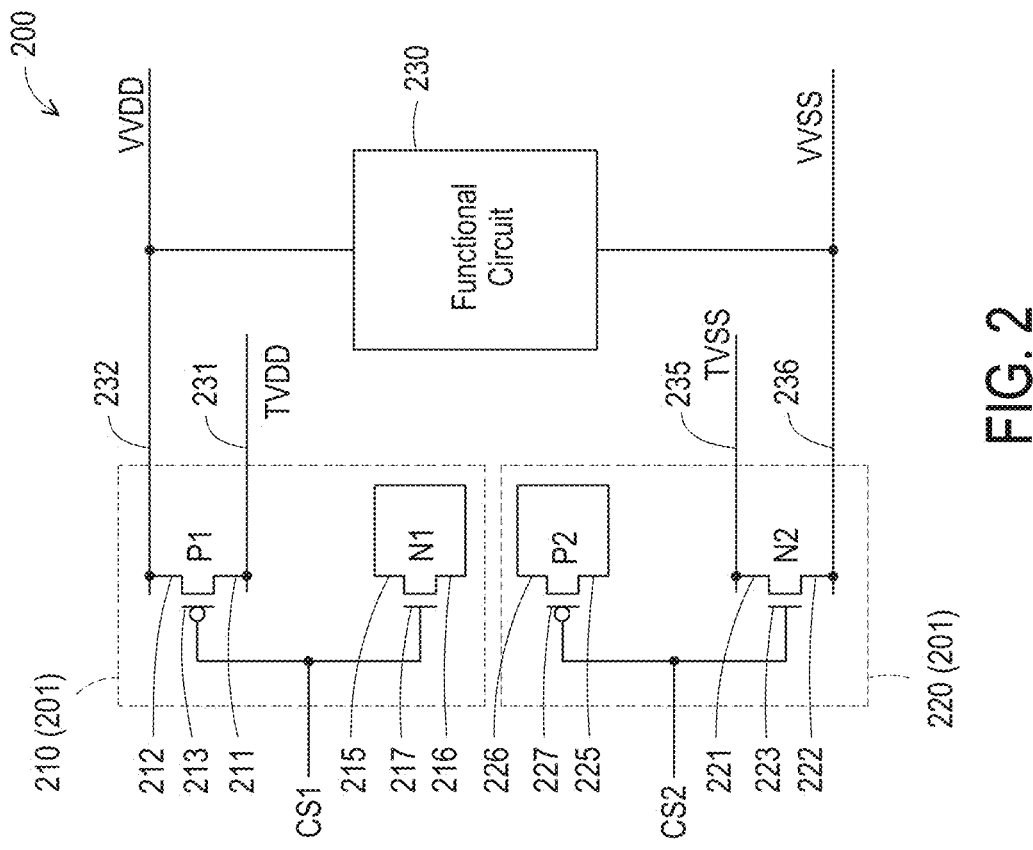
FIG. 2 is a schematic block diagram of a circuit region of an IC device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Source/drain(s) may refer to a source or a drain, individually or collectively dependent upon the context.

In some embodiments, an IC device comprises a substrate having a power control circuit. The power control circuit comprises at least one of a header circuit or a footer circuit. The IC device further comprises first and second front side power rails on a front side of the substrate, and first and second back side power rails on a back side of the substrate. A first feed through via (FTV) extending through the substrate, and coupling the first front side power rail to the first back side power rail. A second FTV extending through the substrate, and coupling the second front side power rail to the second back side power rail. The power control circuit is controllable to electrically connect the first front side power rail to the second front side power rail, or electrically disconnect the first front side power rail from the second front side power rail. In at least one embodiment, the described configuration permits power supply to be provided from the back side (e.g., from the first back side power rail)

to the front side (e.g., to the first front side power rail) where the power supply is either further provided to one or more functional circuits (e.g., through the second front side power rail) when the power control circuit is in a switched-ON state, or is cutoff from the one or more functional circuits when the power control circuit is in a switched-OFF state. As a result, in one or more embodiments, it is possible to provide power supply from the back side of an IC device, while freeing up most of the front side of the IC device for signal routing. In at least one embodiment, FTVs are configured as various cells to be incorporated or added to an existing power control circuit cell, to obtain one or more new power control circuit cells with the capability to receive power supply from the back side and provide power switching at the front side as described. As a result, in one or more embodiments, it is possible to quickly and/or easily provide power control circuits to fit various situations, power requirements, IC designs, or the like. Further advantages and/or effects of one or more embodiments are described herein.

Figure 1:
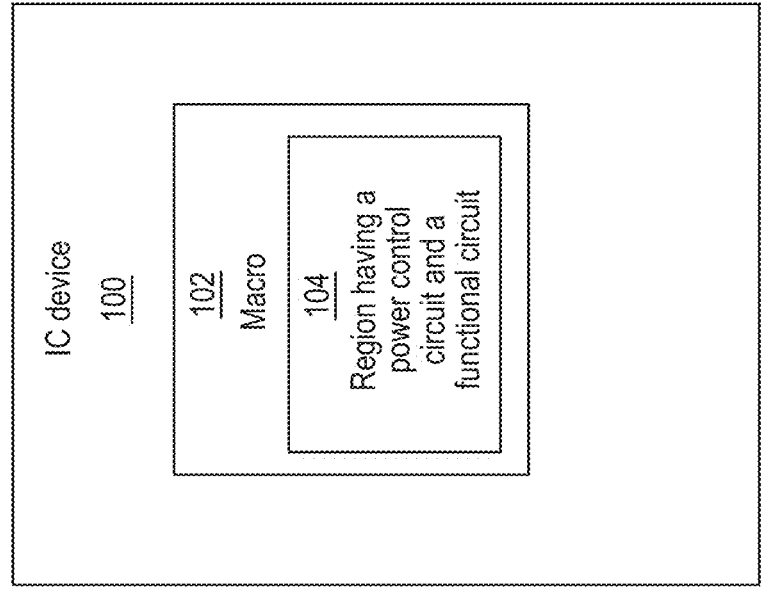
FIG. 1 is a block diagram of an IC device, in accordance with some embodiments.

FIG. 1 is a block diagram of an IC device 100, in accordance with some embodiments.

In FIG. 1, the IC device 100 comprises, among other things, a macro 102. In some embodiments, the macro 102 comprises one or more of a memory, a power grid, a cell or cells, an inverter, a latch, a buffer and/or any other type of circuit arrangement that may be represented digitally in a cell library. In some embodiments, the macro 102 is understood in the context of an analogy to the architectural hierarchy of modular programming in which subroutines/procedures are called by a main program (or by other subroutines) to carry out a given computational function. In this context, the IC device 100 uses the macro 102 to perform one or more given functions. Accordingly, in this context and in terms of architectural hierarchy, the IC device 100 is analogous to the main program and the macro 102 is analogous to subroutines/procedures. In some embodiments, the macro 102 is a soft macro. In some embodiments, the macro 102 is a hard macro. In some embodiments, the macro 102 is a soft macro which is described digitally in register-transfer level (RTL) code. In some embodiments, synthesis, placement and routing have yet to have been performed on the macro 102 such that the soft macro can be synthesized, placed and routed for a variety of process nodes. In some embodiments, the macro 102 is a hard macro which is described digitally in a binary file format (e.g., Graphic Database System II (GDSII) stream format), where the binary file format represents planar geometric shapes, text labels, other information and the like of one or more layout-diagrams of the macro 102 in hierarchical form. In some embodiments, synthesis, placement and routing have been performed on the macro 102 such that the hard macro is specific to a particular process node.

The macro 102 includes a region 104 which comprises a functional circuit, and a power control circuit as described herein. In some embodiments, the region 104 comprises a substrate having circuitry formed thereon, in a front-end-of-line (FEOL) fabrication. Furthermore, above and/or below the substrate, the region 104 comprises various metal layers that are stacked over and/or under insulating layers in a Back End of Line (BEOL) fabrication. The BEOL provides a power network and/or routing for circuitry of the IC device 100, including the macro 102 and the region 104.

FIG. 2 is a schematic block diagram of a circuit region of an IC device 200, in accordance with some embodiments. In at least one embodiment, the circuit region in FIG. 2 corresponds to a portion of the region 104 in FIG. 1.

The IC device 200 comprises a power control circuit 201 which comprises at least one of a header circuit or a footer circuit. In the example configuration in FIG. 2, the power control circuit 201 comprises both a header circuit 210 and a footer circuit 220. In at least one embodiment, either the header circuit 210 or the footer circuit 220 is omitted. The IC device 200 further comprises a functional circuit 230 operable by a power supply voltage from at least one of the header circuit 210 or the footer circuit 220, as described herein.

The header circuit 210 comprises a first transistor P1 and a second transistor N1 of different types. The footer circuit 220 comprises a first transistor N2 and a second transistor P2 of different types. In the example configuration in FIG. 2, the transistors P1, P2 are P-type transistors, and the transistors N1, N2 are N-type transistors. Examples of transistors in the header circuit 210 and/or the footer circuit 220 include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. In some embodiments, a PMOS transistor is referred to as a transistor of a first or second type, and an NMOS transistor is referred to as a transistor of the second or first type.

In the header circuit 210, the first transistor P1 comprises a first terminal 211 electrically coupled to a first power rail 231, a second terminal 212 electrically coupled to a second power rail 232, and a gate terminal 213 configured to receive a control signal CS1. The second transistor N1 comprises first and second terminals 215, 216 coupled together so that the transistor N1 is electrically coupled as a dummy transistor. In some embodiments, the transistor N1 is omitted, resulting in the header circuit 210 comprising only P-type transistors. In some embodiments, the first terminal of a transistor is a source or a drain of the transistor, and the second terminal of the transistor is the drain or the source of the transistor. The first and second terminals of a transistor are sometimes referred to as source/drains of the transistor.

The transistor P1 is configured to, in response to the control signal CS1, connect or disconnect the power rails 231, 232, to provide or cutoff power supply to the functional circuit 230. The power rail 231 is configured to receive a power supply voltage True VDD (herein "TVDD"). The power rail 231 is sometimes referred to as "TVDD power rail." In some embodiments, TVDD is a positive voltage generated by an external voltage supply outside the IC device 200. In some embodiments, TVDD is generated by an internal voltage supply included in the IC device 200. When the transistor P1 is turned ON by a first logic level, e.g., logic "0," of the control signal CS1, TVDD on the TVDD power rail 231 is provided, through the turned ON transistor P1, as a power supply voltage Virtual VDD (herein "VVDD") on the power rail 232. The power rail 232 is referred to sometimes as "VVDD power rail." When the transistor P1 is turned OFF by a second logic level, e.g., logic "1," of the control signal CS1, the VVDD power rail 232 is disconnected from the TVDD power rail 231, and power supply to the functional circuit 230 is cutoff. In some embodiments, the VVDD power rail 232 is floating when the transistor P1 is turned OFF. In some embodiments, the control signal CS1 is generated by an external circuit outside the IC device 200.

In some embodiments, the control signal CS1 is generated by a power management circuit included in the IC device 200.

In the footer circuit 220, the first transistor N2 comprises a first terminal 221 electrically coupled to a first power rail 235, a second terminal 222 electrically coupled to a second power rail 236, and a gate terminal 223 configured to receive a control signal CS2. The second transistor P2 comprises first and second terminals 225, 226 electrically coupled together so that the transistor P2 is electrically coupled as a dummy transistor. In some embodiments, the transistor P2 is omitted, resulting in the footer circuit 220 comprising only N-type transistors.

The transistor N2 is configured to, in response to the control signal CS2, connect or disconnect the power rails 235, 236, to provide or cutoff power supply to the functional circuit 230. The power rail 235 is configured to receive a power supply voltage True VSS (herein "TVSS"). The power rail 235 is sometimes referred to as "TVSS power rail." In some embodiments, TVSS is the ground voltage. In some embodiments, TVSS is a reference voltage other than the ground voltage. In at least one embodiment, the reference voltage other than the ground voltage is generated by an external circuit outside the IC device 200, or by an internal voltage supply included in the IC device 200. When the transistor N2 is turned ON by a first logic level, e.g., logic "1," of the control signal CS2, TVSS on the TVSS power rail 235 is provided, through the turned ON transistor N2, as a power supply voltage Virtual VSS (herein "VVSS") on the power rail 236. The power rail 236 is sometimes referred to as "VVSS power rail." When the transistor N2 is turned OFF by a second logic level, e.g., logic "0," of the control signal CS2, the VVSS power rail 236 is disconnected from the TVSS power rail 235, and power supply to the functional circuit 230 is cutoff. In some embodiments, the VVSS power rail 236 is floating when the transistor N2 is turned OFF. In some embodiments, the control signal CS2 is generated by an external circuit outside the IC device 200. In some embodiments, the control signal CS2 is generated by a power management circuit included in the IC device 200. In some embodiments, the control signal CS2 is the same as the control signal CS1. In at least one embodiment, the control signal CS2 is different from the control signal CS1.

The functional circuit 230 is configured to be operable by VVDD and VVSS correspondingly on the VVDD power rail 232 and the VVSS power rail 236, to perform one or more functions of the IC device 200. In at least one embodiment, when either VVDD or VVSS is removed from the corresponding VVDD power rail 232 or VVSS power rail 236 by switching OFF the corresponding header circuit 210 or footer circuit 220, the functional circuit 230 becomes inactive or disabled, and stops performing the one or more functions. As a result, it is possible to reduce power consumption of the IC device 200 when one or more functions provided by the functional circuit 230 is/are not required. In some embodiments, the functional circuit 230 comprises one or more active devices, passive devices, logic circuits, or the like, configured to operate on VVDD and VVSS. Examples of logic circuits include, but are not limited to, AND, OR, NAND, NOR, XOR, INV, AND-OR-Invert (AOI), OR-AND-Invert (OAI), MUX, Flip-flop, BUFF, Latch, delay, clock, memory, or the like. Example memory cells include, but are not limited to, a static random access memory (SRAM), a dynamic RAM (DRAM), a resistive RAM (RRAM), a magnetoresistive RAM (MRAM), a read only memory (ROM), or the like. Examples of active devices or active elements include, but are not limited to, transistors, diodes, or the like. Examples of passive elements include, but are not limited to, capacitors, inductors, fuses, resistors, or the like.

In the example configuration in FIG. 2, the power control circuit includes both the header circuit 210 and footer circuit 220, and power supply to the functional circuit 230 is controlled, e.g., provided or cutoff, by at least one of the header circuit 210 or the footer circuit 220 in accordance with the corresponding control signal CS1 or control signal CS2.

In some embodiments, the power control circuit of the IC device 200 includes the header circuit 210, but the footer circuit 220 is omitted. In an example, the VVSS power rail 236 is omitted, and the functional circuit 230 is electrically coupled to the TVSS power rail 235. In another example, the VVSS power rail 236 is electrically coupled to the TVSS power rail 235 by a conductor, instead of a switch or a transistor. Power supply to the functional circuit 230 is controlled, e.g., provided or cutoff, by the header circuit 210 in accordance with the control signal CS1.

In some embodiments, the power control circuit of the IC device 200 includes the footer circuit 220, but the header circuit 210 is omitted. In an example, the VVDD power rail 232 is omitted, and the functional circuit 230 is electrically coupled to the TVDD power rail 231. In another example, the VVDD power rail 232 is electrically coupled to the TVDD power rail 231 by a conductor, instead of a switch or a transistor. Power supply to the functional circuit 230 is controlled, e.g., provided or cutoff, by the footer circuit 220 in accordance with the control signal CS2.

The TVDD power rail 231 belongs to a TVDD power domain of the IC device 200. In some embodiments, the TVDD power domain comprises multiple TVDD power rails including the TVDD power rail 231. The VVDD power rail 232 belongs to a VVDD power domain of the IC device 200. In some embodiments, the VVDD power domain comprises multiple VVDD power rails including the VVDD power rail 232. In some embodiments, the IC device 200 comprises multiple header circuits each corresponding to the header circuit 210, and configured to controllably connect or disconnect a TVDD power rail to or from a corresponding VVDD power rail.

The TVSS power rail 235 belongs to a TVSS power domain of the IC device 200. In some embodiments, the TVSS power domain comprises multiple TVSS power rails including the TVSS power rail 235. The VVSS power rail 236 belongs to a VVSS power domain of the IC device 200. In some embodiments, the VVSS power domain comprises multiple VVSS power rails including the VVSS power rail 236. In some embodiments, the IC device 200 comprises multiple footer circuits each corresponding to the footer circuit 220, and configured to controllably connect or disconnect a TVSS power rail to or from a corresponding VVSS power rail.

Figure 3:
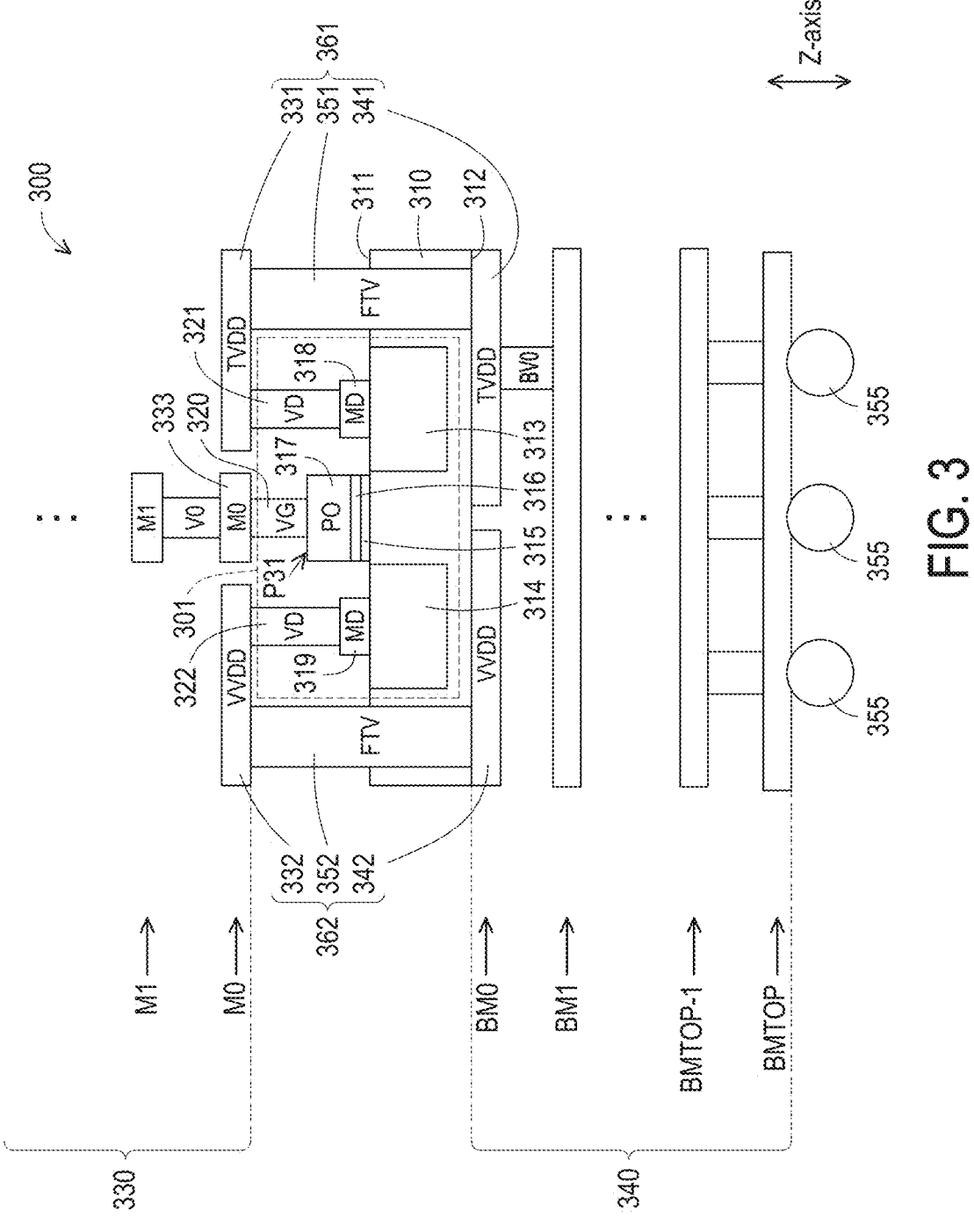
FIG. 3 is a schematic cross-sectional view of an IC device, in accordance with some embodiments.

FIG. 3 is a schematic cross-sectional view of an IC device 300 having a power control circuit 301, in accordance with some embodiments. In at least one embodiment, the power control circuit 301 corresponds to the power control circuit 201. In the example configuration in FIG. 3, the power control circuit 301 comprises a header circuit corresponding to the header circuit 210. In some embodiments, the power control circuit 301 comprises a footer circuit corresponding to the footer circuit 220. In some embodiments, the power control circuit 301 comprises both a header circuit and a footer circuit. For simplicity, one or more header circuits in accordance with some embodiments are described herein in detail. Footer circuits in accordance with some embodiments are configured similarly to the header circuits. For example, it is possible to obtain a footer circuit by replacing TVDD, VVDD, P-type, N-type, and PMOS in a header circuit correspondingly with TVSS, VVSS, N-type, P-type, and NMOS.

The power control circuit 301, hereinafter referred to as the header circuit 301, comprises one or more P-type transistors coupled together to correspond to the transistor P1 in FIG. 2. For simplicity, one P-type transistor, e.g., a PMOS transistor P31, is illustrated in FIG. 3. The example cross-section in FIG. 3 is a combination of multiple cross-sections taken along different planes transverse to each other.

The IC device 300 comprises a substrate 310 over which the header circuit 301 and one or more functional circuits of the IC device 300 are formed. The substrate 310 has a front side 311 and a back side 312 opposite one another along a Z-axis, which coincides with a thickness direction of the substrate 310. In some embodiments, the substrate 310 is a semiconductor substrate or a dielectric substrate. Example materials of a semiconductor substrate include, but are not limited to, silicon, silicon germanium (SiGe), Gallium arsenic, or other suitable semiconductor materials. Example materials of a dielectric substrate include, but are not limited to, SiO or other suitable dielectric materials. In some embodiments, N-type and P-type dopants are added to doped regions of the substrate 310 and/or isolation structures are formed between adjacent doped regions. For example, P-type and N-type dopants are added to the substrate 310 to correspondingly form P-doped regions and N-doped regions corresponding to active regions for PMOS transistors and NMOS transistors. The dopants further form N-type wells (i.e., N wells), in which the P-doped regions are formed, and/or P-type wells (i.e., P wells), in which the N-doped regions are formed. In some embodiments, isolation structures are formed between adjacent P well/P-doped regions and N well/N-doped regions. For simplicity, isolation structures are omitted from FIG. 3. In the example configuration in FIG. 3, the substrate 310 comprises P-doped regions 313, 314 which configure source/drains of the transistor P31 in the header circuit 301.

The IC device 300 further comprises gate stacks for transistors in the IC device 300. For example, the gate stack for the transistor P31 of the header circuit 301 comprises gate dielectric layers 315, 316, and a gate electrode 317. In at least one embodiment, a gate dielectric layer replaces multiple gate dielectric layers 315, 316. Example materials of the gate dielectric layer or layers include $HfO_2$, $ZrO_2$, or the like. Example materials of the gate electrode 317 include polysilicon, metal, or the like. Gate electrodes are schematically illustrated in the drawings with the label "PO."

The IC device 300 further comprises contact structures over and in electrical contact with the source/drains of transistors in the IC device 300. Contact structures are sometimes referred to as metal-to-device (MD) contacts, and are schematically illustrated in the drawings with the label "MD." An MD contact includes a conductive material formed over a corresponding portion, e.g., a source/drain, in the corresponding active region to configure an electrical connection from one or more devices formed in the active region to internal circuitry of the IC device or to outside circuitry. In the example configuration in FIG. 3, MD contacts 318, 319 are over and coupled to the source/drains 313, 314 of the transistor P31 of the header circuit 301.

The IC device 300 further comprises conductive vias over and in electrical contact with the corresponding gate electrodes and MD contacts. A via over and in electrical contact with an MD contact is sometimes referred to as via-to-device (VD) via. A via over and in electrical contact with a gate electrode is sometimes referred to as via-to-gate (VG) via. VD vias are schematically illustrated in the drawings with the label "VD." VG vias are schematically illustrated in the drawings with the label "VG." In the example configuration in FIG. 3, a VG via 320, and VD vias 321, 322 are correspondingly over and in electrical contact with the gate electrode 317, and MD contacts 318, 319. An example material of MD contacts, VD and VG vias includes metal. Other configurations are within the scopes of various embodiments.

The IC device 300 further comprises a front side redistribution structure 330 which is over the VD, VG vias. The front side redistribution structure 330 comprises a plurality of metal layers and a plurality of via layers arranged alternatingly in the thickness direction of the substrate 310, i.e., along the Z-axis. The front side redistribution structure 330 further comprises various interlayer dielectric (ILD) layers (not shown) in which the metal layers and via layers are embedded. The metal layers and via layers of the front side redistribution structure 330 are configured to electrically couple various elements or circuits of the IC device 300 with each other, and with external circuitry. The lowermost metal layer immediately over and in electrical contact with the VD, VG vias is an M0 (metal-zero) layer, a next metal layer immediately over the M0 layer is an M1 layer, a next metal layer immediately over the M1 layer is an M2 layer, or the like. A via layer Vn is arranged between and electrically couples the Mn layer and the Mn+1 layer, where n is an integer from zero and up. For example, a via-zero (V0) layer is the lowermost via layer which is arranged between and electrically couples the M0 layer and the M1 layer. Other via layers are V1, V2, or the like. The M0 layer is the lowermost metal layer over, or the closest metal layer to, the front side 311 of the substrate 310. For simplicity, metal layers and via layers above the M1 layer are omitted in FIG. 3.

In the example configuration in FIG. 3, the M0 layer comprises various M0 conductive patterns, including a first front side power rail 331, a second front side power rail 332, and an M0 conductive pattern 333. The first front side power rail 331 is coupled to the source/drain 313 of the transistor P31 through the MD contact 318 and VD via 321. The second front side power rail 332 is coupled to the source/drain 314 of the transistor P31 through the MD contact 319 and VD via 322. The M0 conductive pattern 333 is coupled to the gate electrode 317 of the transistor P31, and is configured to supply a control signal corresponding to the control signal CS1 switch the transistor P31 ON or OFF. Although not illustrated, the IC device 300 comprises one or more dielectric layers between the M0 layer and the substrate 310.

The IC device 300 further comprises a back side redistribution structure 340 on the back side 312 of the substrate 310. The back side redistribution structure 340 comprises a plurality of back side metal layers and a plurality of back side via layers arranged alternatingly in the thickness direction of the substrate 310, i.e., along the Z-axis. The back side redistribution structure 340 further comprises various interlayer dielectric (ILD) layers (not shown) in which the back side metal layers and back side via layers are embedded. The back side metal layers and back side via layers of the back side redistribution structure 340 are configured to supply power and/or signals from external circuitry to various elements or circuits of the IC device 300. The back side metal layer immediately adjacent the back side 312 of the substrate 310 is a BM0 layer, a next back side metal layer is a BM1 layer, or the like. A back side via layer BVn is arranged between and electrically couples the BMn layer and the BMn+1 layer, where n is an integer from zero and up. For example, a via layer BV0 is the back side via layer arranged between and electrically couples the BM0 layer and the BM1 layer. Other back side via layers are BV1, BV2, or the like. The back side metal layer farthest from the substrate 310 is designated as the BMTOP layer, and the next back side metal layer is designated as the BMTOP-1 layer. The BM0 layer is the closest back side metal layer to the substrate 310. In the example configuration in FIG. 3, the BM0 layer comprises various BM0 conductive patterns, including a first back side power rail 341 and a second back side power rail 342.

The IC device 300 further comprises a first FTV 351 and a second FTV 352. The first FTV 351 extends along the Z-axis through the substrate 310, and couples the first front side power rail 331 to the first back side power rail 341. The second FTV 352 extends along the Z-axis through the substrate 310, and couples the second front side power rail 332 to the second back side power rail 342.

The IC device 300 further comprises a plurality of solder bumps 355 over and coupled to corresponding conductive patterns of the BMTOP layer. The solder bumps 355 are configured to mount the IC device 300 on one or more external devices, to provide power supply to the IC device 300, and/or to exchange data or signals between the IC device 300 and the one or more external devices. For example, TVDD is provided from an external device to one or more solder bumps 355, then through a power network of conductive patterns and vias in the back side redistribution structure 340 to the first back side power rail 341, then through the first FTV 351 to the first front side power rail 331.

As described herein, the header circuit 301 is coupled to the first front side power rail 331 and second front side power rail 332, and is controllable, e.g., by a control signal supplied to the gate electrode 317 of the transistor P31, to electrically connect the first front side power rail 331 and second front side power rail 332, or to electrically disconnect the first front side power rail 331 from the second front side power rail 332. When the transistor P31 is turned ON, corresponding to the header circuit 301 being in a switched ON state, the first front side power rail 331 is electrically connected to the second front side power rail 332. As a result, TVDD on the first front side power rail 331 is provided as VVDD on the second front side power rail 332.

VVDD on the second front side power rail 332 is further provided through the second FTV 352 to the second back side power rail 342. Although not illustrated in FIG. 3, the second front side power rail 332 and the second back side power rail 342 extend to one or more functional circuits of the IC device 300 to provide VVDD for operation of the one or more functional circuits. In some embodiments, a width of BM0 conductive patterns is greater than a width of M0 conductive patterns, for example, as described with respect to FIG. 4A. As a result, the resistance on the second back side power rail 342 is lower than on the second front side power rail 332, and it is possible and/or advantageous in one or more embodiments to deliver VVDD on the second back side power rail 342 over a wider area and/or over a greater distance than on the second front side power rail 332.

The first front side power rail 331, the first FTV 351, and the first back side power rail 341 correspond to the TVDD power rail 231 described with respect to FIG. 2, and belong to the TVDD power domain of the IC device 300. Power rails belonging to the TVDD power domain are referred to herein as TVDD power rails. FTVs belonging to the TVDD power domain are referred to herein as T-FTVs, and/or designated with the label "T" in the drawings. The second front side power rail 332, the second FTV 352, and the second back side power rail 342 correspond to the VVDD power rail 232 described with respect to FIG. 2, and belong to the VVDD power domain of the IC device 300. Power rails belonging to the VVDD power domain are referred to herein as VVDD power rails. FTVs belonging to the VVDD power domain are referred to herein as V-FTVs, and/or designated with the label "V" in the drawings. The first FTV 351, a portion of the first front side power rail 331 over the first FTV 351, and a portion of the first back side power rail 341 under the first FTV 351 together configure an FTV structure 361 which corresponds to an FTV cell described herein. The FTV structure 361 belongs to the TVDD power domain, and is also referred to as a T-FTV structure. The second FTV 352, a portion of the second front side power rail 332 over the second FTV 352, and a portion of the second back side power rail 342 under the second FTV 352 together configure another FTV structure 362. The FTV structure 362 belongs to the VVDD power domain, and is also referred to as a V-FTV structure.

The configurations described with respect to FIG. 3 are examples. Other configurations are within the scopes of various embodiments. For example, in at least one embodiment, the IC device 300 comprises more than one TVDD power domains, and/or each TVDD power domain of the IC device 300 comprises more than one TVDD power rails. In at least one embodiment, the IC device 300 comprises more than one VVDD power domains, and/or each VVDD power domain of the IC device 300 comprises more than one VVDD power rails. In at least one embodiment, one TVDD power rail is controllably connected to or disconnected from more than one VVDD power rails, by one or more header circuits.

Figure 4A:
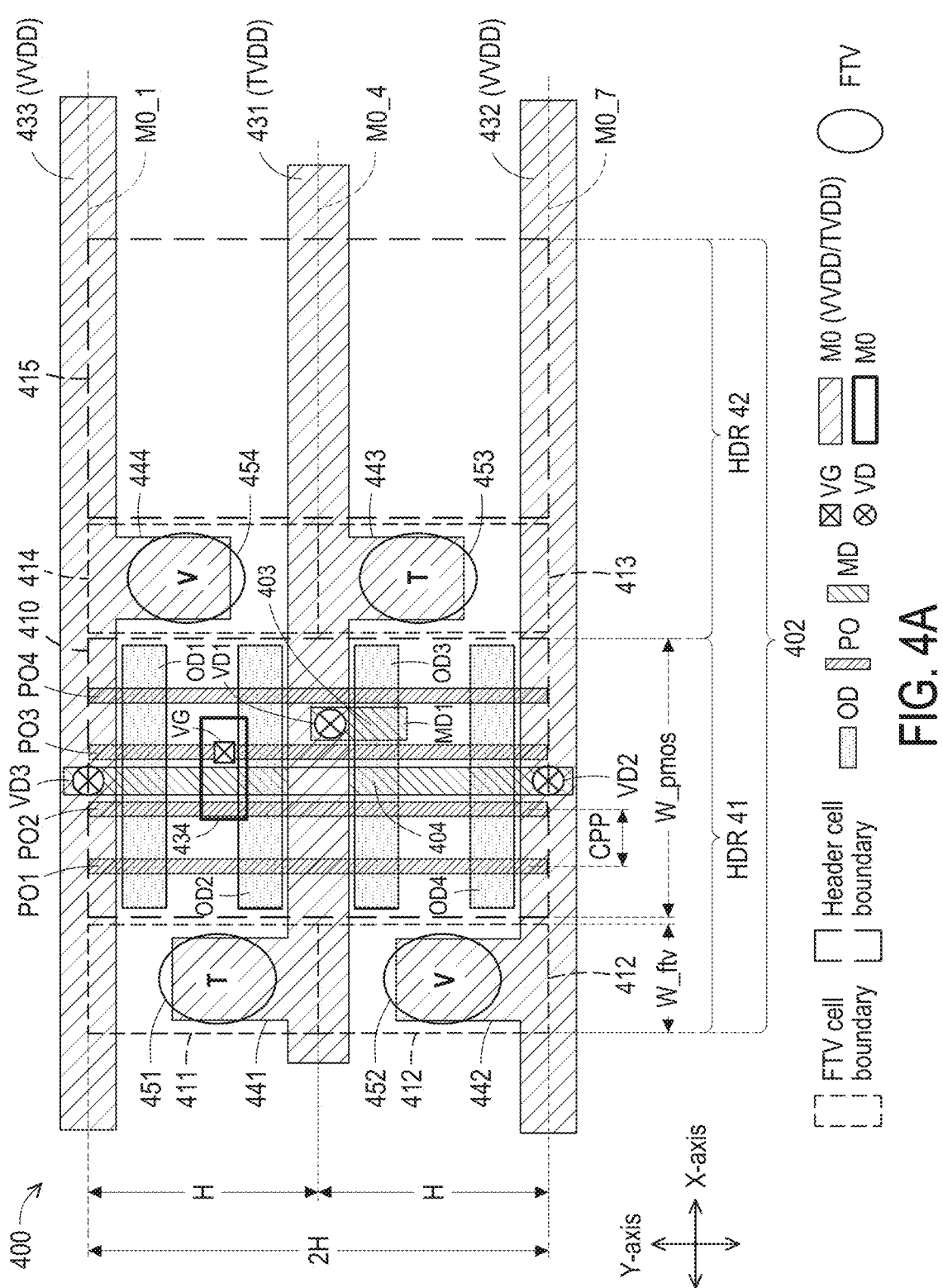
FIGS. 4A-4B are schematic views of various layers in a layout diagram of an IC device, in accordance with some embodiments.
Figure 4B:
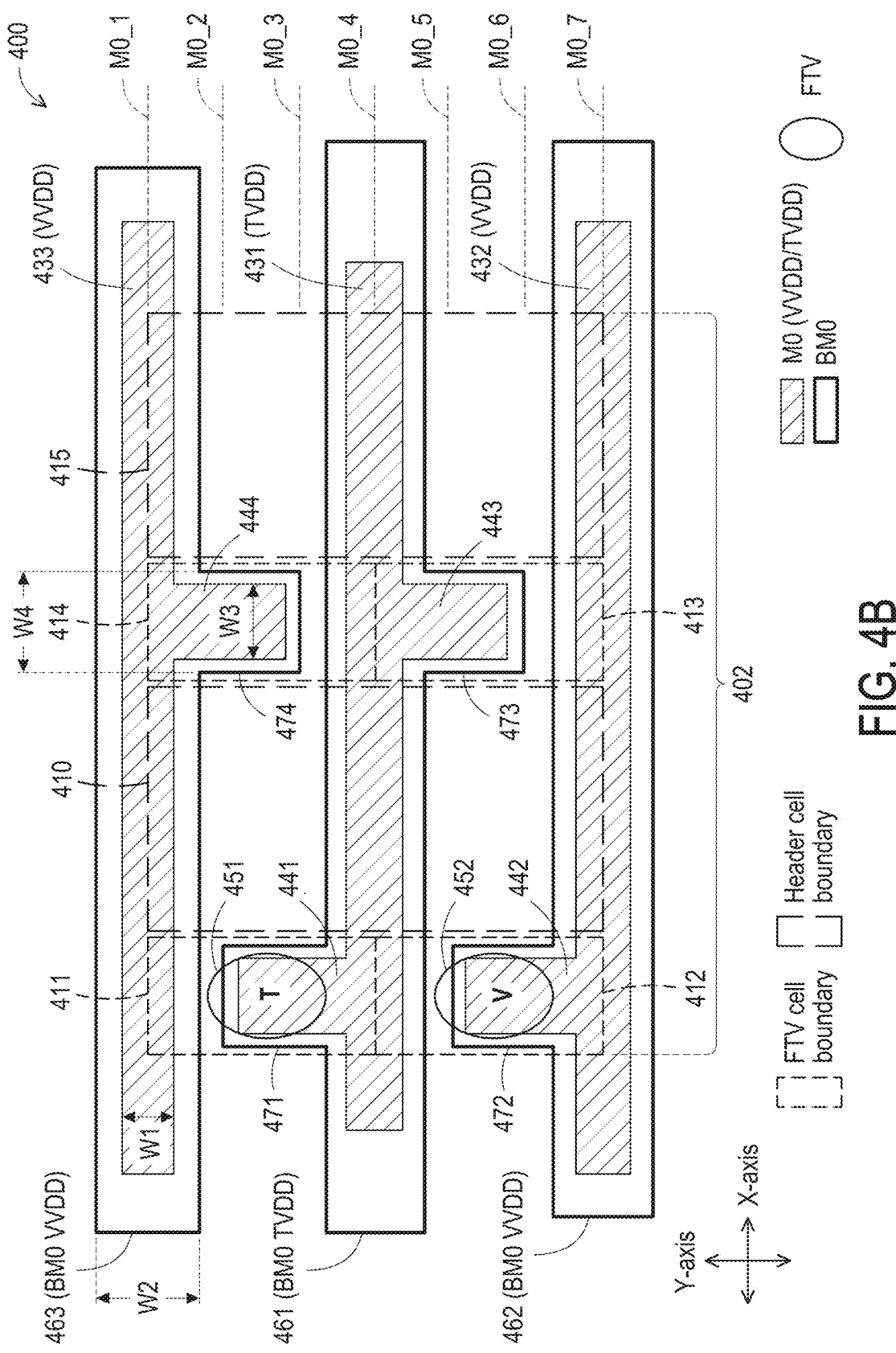

FIGS. 4A-4B are schematic views of various layers in a layout diagram 400 of an IC device, in accordance with some embodiments. In some embodiments, the layout diagram 400 is stored on a non-transitory computer-readable medium. In at least one embodiment, the layout diagram 400 corresponds to one or more of the IC devices 100, 200, 300 described herein.

In FIG. 4A, an example header circuit region 402 of the layout diagram 400 is illustrated. The header circuit region is a region including one or more header cells. A header cell is a layout of one or more header circuits. In some embodiments, a header cell is pre-designed and stored in a cell library on a non-transitory computer-readable medium. In at least one embodiment, a header cell is generated, e.g., by an electronic design automation (EDA) system as described herein, from existing cells of a cell library. In the example configuration in FIG. 4A, the header circuit region 402 comprises two header cell units HDR 41 and HDR 42 which are similarly configured. A detailed description of the header cell unit HDR 41 is given herein. Certain features of the header cell unit HDR 42 are described, whereas other features similar to the header cell unit HDR 41 are omitted. The number N of header cell units in the header circuit region 402 depends on one or more factors, including, but not limited to, power requirements of an IC device corresponding to the layout diagram 400, design rules, or the like. In the example configuration in FIG. 4A, N=2. In some embodiments, the header circuit region 402 has one header cell unit (N=1), or has more than two header cell units (N>2).

In the example configuration in FIG. 4A, the header cell unit HDR 41 comprises a header cell 410, and FTV cells 411, 412. The header cell unit HDR 42 comprises FTV cells 413, 414 and a header cell 415. The header cell 415 corresponds to the header cell 410, and detailed features of the header cell 415 are omitted in FIG. 4A for simplicity. The FTV cells 413, 414 correspond to the FTV cells 411, 412. In some embodiments, the header cell unit HDR 42 is obtained by flipping the header cell unit HDR 41 across an X-axis. In at least one embodiment, the FTV cells 413, 414 is obtained by flipping the corresponding FTV cells 411, 412 across the X-axis. In at least one embodiment, the FTV cells 411, 412 have the same configuration, and are different in their connections, correspondingly as a T-FTV and a V-FTV, to corresponding TVDD and VVDD power rails, as described herein. In at least one embodiment, the FTV cells 413, 414 have the same configuration, and are different in their connections, correspondingly as a T-FTV and a V-FTV, to corresponding TVDD and VVDD power rails, as described herein. In at least one embodiment, an FTV cell is stored in a cell library, and depending on where the FTV cell is placed in a layout diagram, i.e., depending on which type of power rail, TVDD or VVDD, the FTV cell is coupled to, the FTV cell correspondingly becomes a T-FTV cell or V-FTV cell. In the example configuration in FIG. 4A, the FTV cells 411, 413 configure T-FTVs and are sometimes referred to as T-FTV cells, and the FTV cells 412, 414 configure V-FTVs and are sometimes referred to as V-FTV cells.

In at least one embodiment, the header cell unit HDR 41 is a new header cell obtained, e.g., using an EDA tool or system, by placing the header cell 410 in abutment with the FTV cells 411, 412. In the example configuration in FIG. 4A, a boundary of the header cell 410 has a left edge placed in abutment with, i.e., to coincide with, right edges of boundaries of the FTV cells 411, 412. A bottom edge of the boundary of the FTV cell 411 is placed in abutment with a top edge of the boundary of the FTV cell 412. The header cell unit HDR 42 is obtained by placing the header cell 415 in abutment with the FTV cells 413, 414 in a similar manner. The header cell unit HDR 42 is further placed in abutment with the header cell unit HDR 41, e.g., with a right edge of the boundary of the header cell 410 being placed in abutment with left edges of boundaries of the FTV cells 413, 414. Top edges of the boundaries of FTV cell 411, header cell 410, FTV cell 414, header cell 415 are aligned along a track M0_1. Bottom edges of the boundaries of the FTV cell 412, header cell 410, FTV cell 413, header cell 415 are aligned along a track M0_7. The top edges of the boundaries of the FTV cell 412, FTV cell 413 and the bottom edges of the boundaries of the FTV cell 411, FTV cell 414 are aligned along a track M0_4. Although the boundaries of various cells or arrays are placed in abutment, in FIG. 4A, the boundaries are illustrated to be slightly apart for clarity. In at least one embodiment, by simply adding one or more FTV cells to a preexisting header cell, it is possible to quickly and/or easily provide a new header cell to fit various situations, power requirements, IC designs, or the like.

The header cell 410 in the header cell unit HDR 41 comprises a plurality of active regions OD1-OD4. Active regions are sometimes referred to as oxide-definition (OD) regions, and are schematically illustrated in the drawings with the label "OD." In at least one embodiment, the active regions OD1-OD4 are over a front side of a substrate, and include source/drains of transistors, as described with respect to FIG. 3. The active regions OD1-OD4 are elongated along a first axis, e.g., the X-axis. The active regions OD1-OD4 are configured to form one or more PMOS devices, and are sometimes referred to as "PMOS active regions." A header cell is sometimes referred to as a PMOS array. In a footer cell, active regions corresponding to the active regions OD1-OD4 are configured to form one or more NMOS devices, and are sometimes referred to as "NMOS active regions." A footer cell is sometimes referred to as an NMOS array. As described with respect to FIG. 5B, in standard cells in a functional circuit region including one or more functional circuits, active regions corresponding to one of the active regions OD1-OD2 and one of the active regions OD3-OD4 are NMOS active regions. In some embodiments, a PMOS active region is referred to as an active region of a first or second semiconductor type, and an NMOS active region is referred to as an active region of the second or first semiconductor type.

The header cell 410 in the header cell unit HDR 41 further comprises a plurality of gate regions PO1-PO4 over the active regions OD1-OD4. The gate regions PO1-PO4 are elongated along a second axis, e.g., a Y-axis, which is transverse to the X-axis. The gate regions PO1-PO4 are arranged along the X-axis at a regular pitch designated at CPP (contacted poly pitch) in FIG. 4A. CPP is a center-to-center distance along the X-axis between two directly adjacent gate regions, e.g., the gate regions PO1, PO2 in FIG. 4A. Two gate regions are considered directly adjacent where there are no other gate regions therebetween. The each of the gate regions PO1-PO4 corresponds to a gate electrode layer or a gate stack as described with respect to FIG. 3. Each of the gate regions PO1-PO4 configures, together one of the active regions OD1-OD4, a PMOS transistor or PMOS device corresponding to the transistor P31 described with respect to FIG. 3. Multiple PMOS devices configured by the gate regions PO1-PO4 and the active regions OD1-OD4 are coupled together and correspond to the transistor P1 described with respect to FIG. 1. The described numbers of gate regions and/or active regions in the header cell unit HDR 41 are examples. Other numbers of gate regions and/or active regions in a header cell are within the scopes of various embodiments, and depend on one or more factors. For example, the number of gate regions in a header cell is selected based on the required driving strength of the corresponding header circuit. As the number of gate regions is increased, the driving strength is increased, but the chip or wafer area occupied by the header circuit is also increased. In at least one embodiment, a selection of the number of gate regions in a header cell is a design consideration for balancing between performance (e.g., increased driving strength) and area cost.

The header cell 410 in the header cell unit HDR 41 further comprises MD contacts over corresponding source/drains in the active regions OD1-OD4. In the example configuration in FIG. 4A, a PMOS transistor configured by the gate region PO3 and the active region OD3 has source/drains 403, 404 in the active region OD3 and on opposite sides of the gate region PO3. An MD contact MD1 is over the source/drain 403, and configures an electrical connection from the source/drain 403 to a TVDD power rail 431 as described herein. An MD contact MD2 is elongated along the Y-axis, and across all of the active regions OD1-OD4. The MD contact MD2 is over the source/drain 404, and configures an electrical connection from the source/drain to VVDD power rails 432, 433 as described herein. As a result, the transistor configured by the gate region PO3 and the active region OD3 is coupled on one hand to the TVDD power rail 431, and on the other hand to the VVDD power rails 432, 433, for controllably connecting or disconnecting the TVDD power rail 431 to or from the VVDD power rails 432, 433, as described herein. The described and/or illustrated MD contacts are examples, and other MD contacts in the header cell unit HDR 41 are omitted for simplicity. In some embodiments, the MD contact MD2 is elongated along the Y-axis similarly to the MD contact MD1 to be over all of the active regions OD1-OD4 for coupling the underlying source/drains in the active regions OD1-OD4 to the TVDD power rail 431. In some embodiments, the header cell unit HDR 41 comprises multiple elongated MD contacts similar to the MD contact MD1, and the multiple elongated MD contacts are arranged alternatingly with the gate regions PO1-PO4 along the X-axis. A pitch, i.e., a center-to-center distance along the X-axis, between directly adjacent MD contacts is the same as the pitch CPP between directly adjacent gate regions. Two MD contacts are considered directly adjacent where there are no other MD contacts therebetween.

The header cell 410 in the header cell unit HDR 41 further comprises a via VG over the gate region PO3, and configures an electrical connection from the gate region PO3 to an M0 conductive pattern 434 for a control signal to switch ON or OFF the corresponding header circuit. Other VG vias are omitted for simplicity. In at least one embodiment, the M0 conductive pattern 434 is elongated along the X-axis to be over all of the gate regions PO1-PO4, and further VG vias are included in the header cell unit HDR 41 to configure further electrical connections from the gate regions PO1, PO2, PO4 to the M0 conductive pattern 434. As a result, a control signal supplied along the M0 conductive pattern 434 is applied to the gate electrodes of all PMOS transistors in the header cell unit HDR 41 for switching ON or OFF all of the PMOS transistors of the header cell unit HDR 41 together.

The header cell 410 in the header cell unit HDR 41 further comprises a via VD1 configuring an electrical connection from the MD contact MD1 to the TVDD power rail 431, and vias VD2, VD3 configuring electrical connections from the MD contact MD2 correspondingly to the VVDD power rails 432, 433. Other VD vias are omitted for simplicity. In at least one embodiment, each of the PMOS transistors in the header cell unit HDR 41 has a source/drain coupled to the TVDD power rail 431, and another source/drain coupled to the VVDD power rails 432, 433.

The M0 layer over the header circuit region 402 of the layout diagram 400 comprises the TVDD power rail 431, the VVDD power rails 432, 433, and the M0 conductive pattern 434 as described. The TVDD power rail 431 and the VVDD power rails 432, 433 are elongated along the X-axis. The TVDD power rail 431 is between the VVDD power rails 432, 433 along the Y-axis. In some embodiments, the TVDD power rail 431 corresponds to the first front side power rail 331, and each of the VVDD power rails 432, 433 corresponds to the second front side power rail 332 described with respect to FIG. 3.

The M0 layer over the header circuit region 402 of the layout diagram 400 further comprises a conductive pattern 441 projecting from the TVDD power rail 431 along the Y-axis toward the VVDD power rail 433, a conductive pattern 442 projecting from the VVDD power rail 432 along the Y-axis toward the TVDD power rail 431, a conductive pattern 443 projecting from the TVDD power rail 431 along the Y-axis toward the VVDD power rail 432, and a conductive pattern 444 projecting from the VVDD power rail 433 along the Y-axis toward the TVDD power rail 431. In some embodiments, the conductive patterns 441-444 are referred to as "jogs."

The header circuit region 402 further comprises a T-FTV 451, a V-FTV 452, a T-FTV 453, a V-FTV 454 correspondingly overlapping the conductive patterns 441-444 along a third axis, e.g., the Z-axis, transverse to both the X-axis and the Y-axis. In some embodiments, the T-FTV 451, T-FTV 453 correspond to the first FTV 351, and the V-FTV 452, V-FTV 454 correspond to the second FTV 352 described with respect to FIG. 3. In the example configuration in FIG. 4A, the T-FTVs and V-FTVs are arranged in a staggering manner along both the X-axis and Y-axis. This configuration makes it possible for an FTV to serve multiple header cells on opposite sides of the FTV. For example, each of the T-FTV 453 and V-FTV 454 is configured to serve both header cell 410 and header cell 415.

The header circuit region 402 of the layout diagram 400 further comprises various BM0 conductive patterns in the BM0 layer. For simplicity, BM0 conductive patterns are not illustrated in FIG. 4A, but are illustrated in and described with respect to FIG. 4B.

In FIG. 4B, M0 conductive patterns, BM0 conductive patterns, and several FTVs in the header circuit region 402 of the layout diagram 400 are illustrated. In the header circuit region 402, the pattern or configuration of the BM0 conductive patterns is the same as the pattern or configuration of the corresponding M0 conductive patterns. For example, the BM0 layer comprises a BM0 TVDD power rail 461, BM0 VVDD power rails 462, 463, and BM0 conductive patterns (or BM0 jogs) 471-474 corresponding to and overlapping, e.g., along the Z-axis, the TVDD power rail 431, VVDD power rails 432, 433, and conductive patterns 441-444 of the M0 layer. In the example configuration in FIG. 4B, over the header circuit region 402, the entireties of the M0 conductive patterns 431-433, 441-444 are overlapped by the corresponding BM0 conductive patterns 461-463, 471-474.

A difference between the M0 conductive patterns and the BM0 conductive patterns is that the BM0 conductive patterns are larger (or wider) than the corresponding M0 conductive patterns. For example, the VVDD power rail 433 and BM0 VVDD power rail 463 extend along the X-axis and have corresponding widths W1, W2 along the Y-axis. The width W2 of the BM0 VVDD power rail 463 is larger than the width W1 of the corresponding VVDD power rail 433 in the M0 layer. The corresponding jogs, i.e., the conductive pattern 444 and the BM0 conductive pattern 474, extend along the Y-axis and have corresponding widths W3, W4 along the X-axis. The width W4 of the BM0 conductive pattern 474 is larger than the width W3 of the corresponding conductive pattern 444 in the M0 layer. Similarly, the BM0 TVDD power rail 461, BM0 VVDD power rail 462, and BM0 conductive patterns 471-473 have greater widths than the corresponding TVDD power rail 431, VVDD power rail 432, and conductive pattern 441-443 of the M0 layer. In some embodiments, the wider BM0 conductive patterns reduce resistance and/or power loss of the power network on the back side of an IC device corresponding to the layout diagram 400.

As illustrated in FIG. 4B, the T-FTV 451 overlaps the conductive pattern 441 and BM0 conductive pattern 471. In an IC device corresponding to the layout diagram 400, e.g., in the IC device 300, the first FTV 351 corresponds to the T-FTV 451, a portion of the first front side power rail 331 immediately over the first FTV 351 corresponds to the conductive pattern 441, and a portion of the first back side power rail 341 immediately under the first FTV 351 corresponds to the BM0 conductive pattern 471. The conductive pattern 441, T-FTV 451, and BM0 conductive pattern 471 are included in the FTV cell 411 which configures a T-FTV structure coupling a back side power rail, e.g., the BM0

TVDD power rail 461, to a front side power rail, e.g., the TVDD power rail 431. In some embodiments, the T-FTV structure configured by the FTV cell 411 corresponds to the T-FTV structure 361.

In a similar manner, the V-FTV 452 overlaps the conductive pattern 442 and BM0 conductive pattern 472. In an IC device corresponding to the layout diagram 400, e.g., in the IC device 300, the second FTV 352 corresponds to the V-FTV 452, a portion of the second front side power rail 332 immediately over the second FTV 352 corresponds to the conductive pattern 442, and a portion of the second back side power rail 342 immediately under the second FTV 352 corresponds to the BM0 conductive pattern 472. The conductive pattern 442, V-FTV 452, and BM0 conductive pattern 472 are included in the FTV cell 412 which configures a V-FTV structure coupling a back side power rail, e.g., the BM0 VVDD power rail 462, to a front side power rail, e.g., the VVDD power rail 432. In some embodiments, the V-FTV structure configured by the FTV cell 412 corresponds to the V-FTV structure 362. The FTV cell 413 is configured similarly to the FTV cell 411, and the FTV cell 414 is configured similarly to the FTV cell 412. Detailed descriptions and/or illustrations of the FTV cell 413, FTV cell 414 are omitted for simplicity.

The front side power rails 431, 432, 433 in the M0 layer and the back side power rails 461, 462, 463 in the BM0 layer are elongated along corresponding tracks M0_1, M0_4, M0_7 among a plurality of tracks M0_1, M0_2, . . . M0_7 of the layout diagram 400. The plurality of tracks M0_1, M0_2, . . . M0_7 are M0 tracks which are regularly spaced from each other along the Y-axis. In a functional circuit region of the layout diagram 400, standard cells, e.g., cells other than header cells and footer cells, include one or more M0 conductive patterns along the tracks M0 tracks such as the tracks M0_1, M0_2, . . . M0_7. For example, although in the header circuit region 402, tracks M0_2, M0_3, M0_5, M0_6 are not occupied by M0 conductive patterns, one of more of these tracks M0_2, M0_3, M0_5, M0_6 are occupied by one or more corresponding M0 conductive patterns in standard cells in the functional circuit region for signal, and/or power routing. For another example, in standard cells in the functional circuit region, front side and back side power rails along track M0_4 are correspondingly disconnected from the TVDD power rail 431, BM0 TVDD power rail 461, and are configured to supply VSS, as described with respect to FIG. 5B. The described numbers of tracks in FIG. 3 are examples. Other M0 track configurations are within the scopes of various embodiments.

Referring to both FIGS. 4A-4B, a power delivery path in the header circuit region 402 is from the BM0 TVDD power rail 461, to the BM0 conductive pattern 471, then to the T-FTV 451, then to the conductive pattern 441, then to the TVDD power rail 431, then to the via VD1, then to the MD contact MD1, then to the source/drain 403, then to the source/drain 404 when the corresponding PMOS transistor is turned ON, then to the MD contact MD2, then to the via VD2, then to the VVDD power rail 432, then to the conductive pattern 442, then to the V-FTV 452, then to the BM0 conductive pattern 472, and then to the BM0 VVDD power rail 462. In some embodiments, this power delivery path in the header circuit region 402 corresponds to a power delivery path in the IC device 300 of FIG. 3, from the first back side power rail 341, then to the first FTV 351, then to the first front side power rail 331, then to the VD via 321, then to the MD contact 318, then to the source/drain 313, then to the source/drain 314 when the transistor P31 is turned ON, then to the MD contact 319, then to the VD via

322, then to the second front side power rail 332, then to the second FTV 352, then to the second back side power rail 342.

Return to FIG. 4A, each of the FTV cells 411-414 has a height H (or a single cell height) along the Y-axis, and a width W_ftv along the X-axis. Each of the header cells 410, 415 has a double cell height 2H along the Y-axis, and a width W_pmos along the X-axis. The cell height H corresponds to the height of a standard cell having two active regions, e.g., one PMOS active region and one NMOS active region, along the Y-axis. The double cell height 2H corresponds to the combined height of two single-cell-height standard cells stacked along the Y-axis, or the height of a standard cell having four active regions, e.g., two PMOS active region and two NMOS active region, along the Y-axis. Although all active regions OD1-OD4 in the header cell 410 are PMOS active regions, the height of the header cell 410 corresponds to the height of a double-cell-height standard cell having four active regions. The described heights of the FTV cells and/or header cells are examples. Other cell height configurations are within the scopes of various embodiments.

In some embodiments, the width W_pmos of each header cell 410, 415 is from 1 CPP to 100 CPPs, i.e., each header cell 410, 415 comprises from 1 gate region to 100 gate regions. In some embodiments, the width W_pmos of the header cell 410 is different from that of the header cell 415. The width W_pmos of (or the number of gate regions in) each header cell and/or the number N of header cell units in the header circuit region 402 depend on various power requirements and/or other design considerations of IC devices corresponding to the layout diagram 400. For example, at a higher number N of header cell units in the header circuit region 402, the ratio of FTV cell per standard cell is increased, with improved power delivery performance but at higher chip area cost. In some embodiments, the width W_ftv of each of the FTV cells 411-414 is from 1 CPP to 10 CPPs. At a greater width W_ftv, a resistance of the corresponding FTV and associated power loss are reduced, but the chip area occupied by the FTV is increased. In at least one embodiment, the width W_ftv is determined as a balance between power delivery performance and chip area cost. In a specific example, the width W_pmos is 6 CPPs, and the width W_ftv is 3 CPPs. The dimension of the FTV in an FTV cell depends on various factors including, but not limited to, manufacturing process capability, width W_ftv, or the like. An FTV with a larger size has a lower resistance and provides better power performance. In some embodiments, the FTV is circular and has a diameter from 0.5 CPP to 10 CPPs.

Figure 5A:
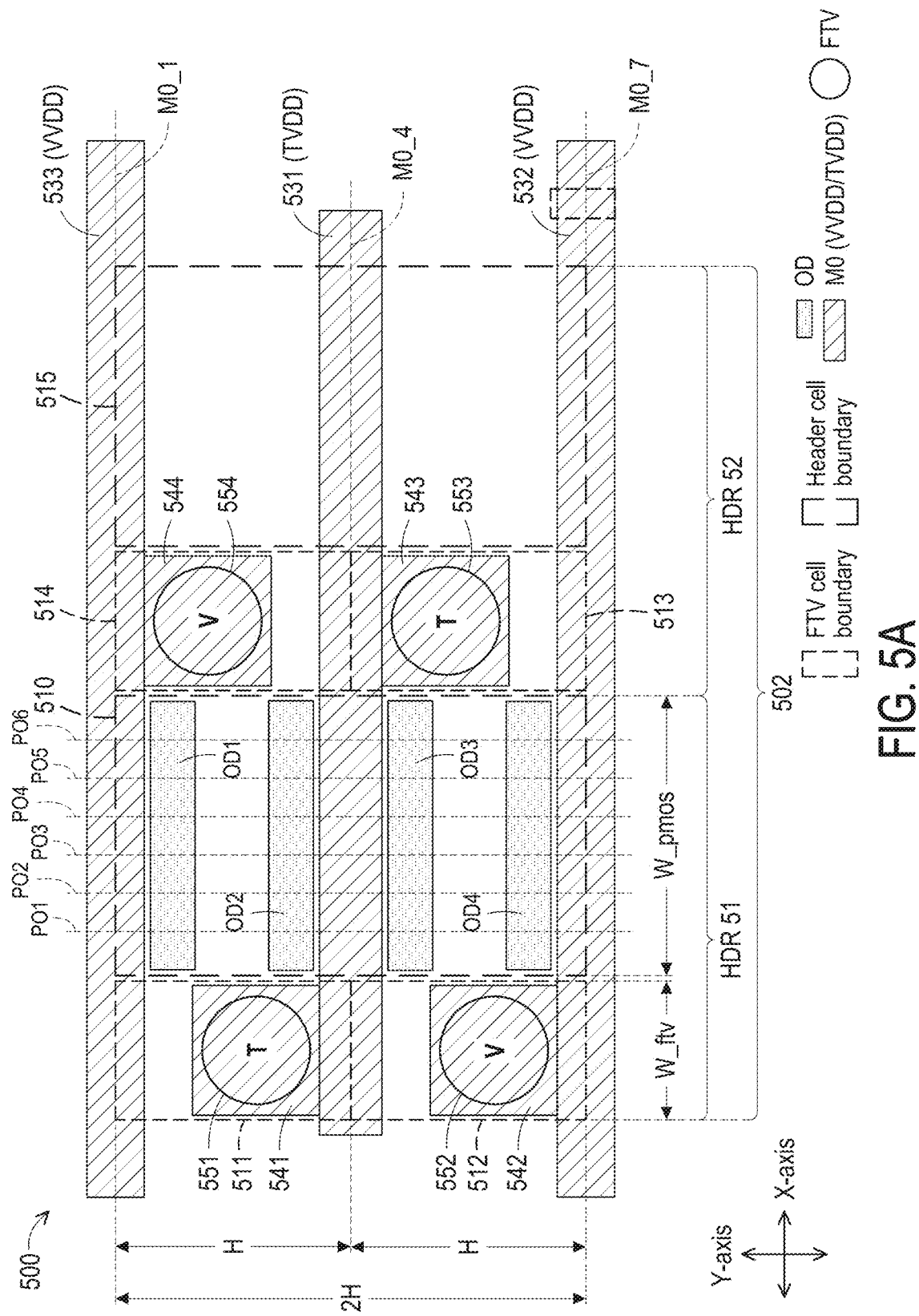
FIGS. 5A-5B are schematic views of a layout diagram of an IC device, in accordance with some embodiments.

FIG. 5A is a schematic view of a layout diagram 500 of an IC device, in accordance with some embodiments. In some embodiments, the layout diagram 500 is stored on a non-transitory computer-readable medium. In at least one embodiment, the layout diagram 500 corresponds to one or more of the IC devices 100, 200, 300 described herein. Components of the layout diagram 500 having corresponding components in the layout diagram 400 are designated by the same reference numerals, or by the reference numerals of the layout diagram 400 increased by one hundred.

The layout diagram 500 comprises a header circuit region 502 corresponding to the header circuit region 402. The header circuit region 502 comprises header cell units HDR 51, HDR 52 corresponding to header cell units HDR 41, HDR 42. The header cell units HDR 51, HDR 52 comprise header cells 510, 515 and FTV cells 511-514 corresponding to the header cells 410, 415 and FTV cells 411-414. An M0 layer in the header circuit region 502 comprises a TVDD power rail 531, VVDD power rails 532, 533, and conductive patterns 541-544 corresponding to the TVDD power rail 431, VVDD power rails 432, 433, and conductive patterns 441-444. The header circuit region 502 further comprises FTVs 551-554 corresponding to the FTVs 451-454. A BM0 layer in the header circuit region 502 comprises BM0 power rails (i.e., back side power rails) and BM0 conductive patterns (or jogs) which overlap and have the same pattern or configuration as the M0 power rails 531-533 and M0 conductive patterns 541-544, in a manner similar to that described with respect to FIG. 4B. Each of the FTV cells 511-514 comprises the corresponding M0 conductive pattern (or jog) 541-544, the corresponding FTV 551-554, and the corresponding BM0 conductive pattern (not shown).

A difference between the header cells 510, 515 and the header cells 410, 415 is that each of the header cells 510, 515 comprises six gate regions schematically indicated by corresponding tracks PO1-PO6 in FIG. 5A. Other features of the header cells 510, 515, such as MD contacts, VD vias, VG vias are omitted for simplicity. The described number of six gate regions in each of the header cells 510, 515 is an example. Other numbers of gate regions in a header cell are within the scopes of various embodiments.

A difference between the FTV cells 511-514 and the FTV cells 411-414 is that each of the M0 conductive patterns 541-544 occupies the full width W_ftv of the corresponding FTV cells 511-514, whereas each of the M0 conductive patterns 441-444 does not occupies the full width W_ftv of the corresponding FTV cells 411-414. As a result, in one or more embodiments, at the same width W_ftv, the M0 conductive patterns 541-544 are wider than the M0 conductive patterns 441-444, which in turn, permit the corresponding FTVs 551-554 to be larger than the FTVs 451-454. Although not illustrated in FIG. 5A, in the FTV cells 511-514, the corresponding BM0 conductive patterns (or jogs) underlying the FTVs 551-554 are at least as wide as, or are wider than, the BM0 conductive patterns 471-474. Accordingly, for the same area cost (i.e., the same height H and the same width W_ftv), the FTV cells 511-514 provide better power delivery performance than the FTV cells 411-414. In at least one embodiment, one or more advantages described herein are achievable by the layout diagram 500, and/or an IC device corresponding to the layout diagram 500.

Figure 5B:
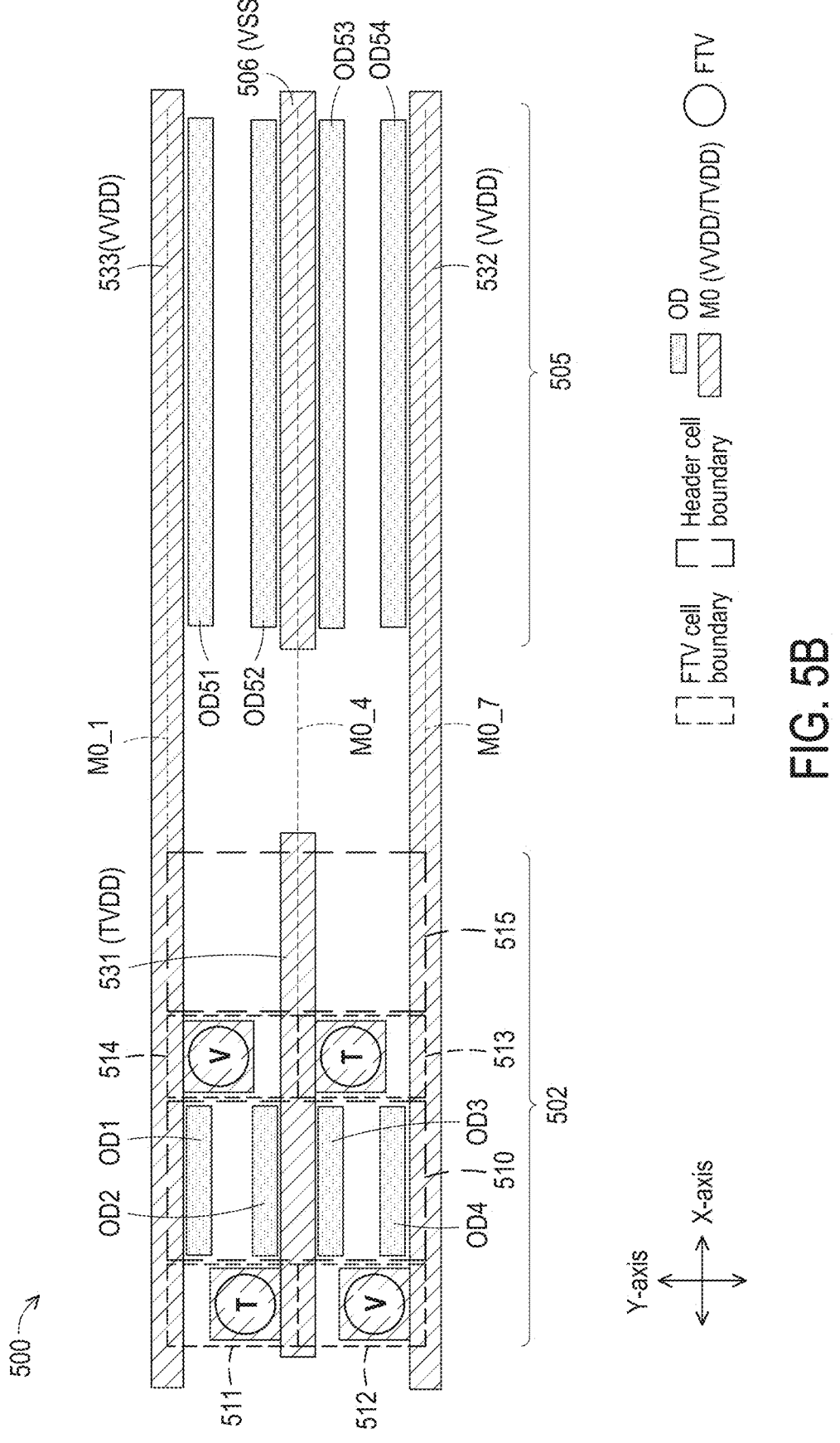

FIG. 5B is a schematic view of the layout diagram 500 including the header circuit region 502 and a functional circuit region 505, in accordance with some embodiments.

The functional circuit region 505 comprises a plurality of transistors formed over active regions OD51-OD54. Two of the active regions OD51-OD54 are PMOS active regions for forming PMOS transistors, and the other two of the active regions OD51-OD54 are NMOS active regions for forming NMOS transistors. For example, the active regions OD51, OD54 are PMOS active regions, and the active regions OD52, OD53 are NMOS active regions. Other configurations are within the scopes of various embodiments. For example, the functional circuit region 505 comprises more than four active regions in one or more embodiments. The functional circuit region 505 comprises further features (not shown) which configure and/or couple the transistors of the functional circuit region 505 into one or more functional circuits, and/or couple the one or more functional circuits of the functional circuit region 505 to other circuitry of the IC device and/or to external circuitry. Examples of unshown features of the functional circuit region 505 include, but are not limited to, gate regions, MD contacts, VD vias, VG vias, conductive patterns and vias in one or more metal layers and/or via layers of a front side redistribution structure, or the like.

The one or more functional circuits in the functional circuit region 505 need power supply to operate. In the example configuration in FIG. 5B, the VVDD power rails 532, 533 extend along the corresponding tracks M0_1, M0_7 from the header circuit region 502 to the functional circuit region 505 to provide VVDD for operation of the one or more functional circuits in the functional circuit region 505. In some embodiments, VVDD further is supplied by BM0 VVDD power rails underlying the VVDD power rails 532, 533. The M0 layer of the layout diagram 500 further comprises an M0 conductive pattern 506 along the same track M0_4 as the TVDD power rail 531, but is disconnected from the TVDD power rail 531. The M0 conductive pattern 506 is configured as a VSS power rail for supplying VSS to the one or more functional circuits in the functional circuit region 505. In some embodiments, VSS is the ground voltage, or a predetermined reference voltage.

Figures 5C, 5D:
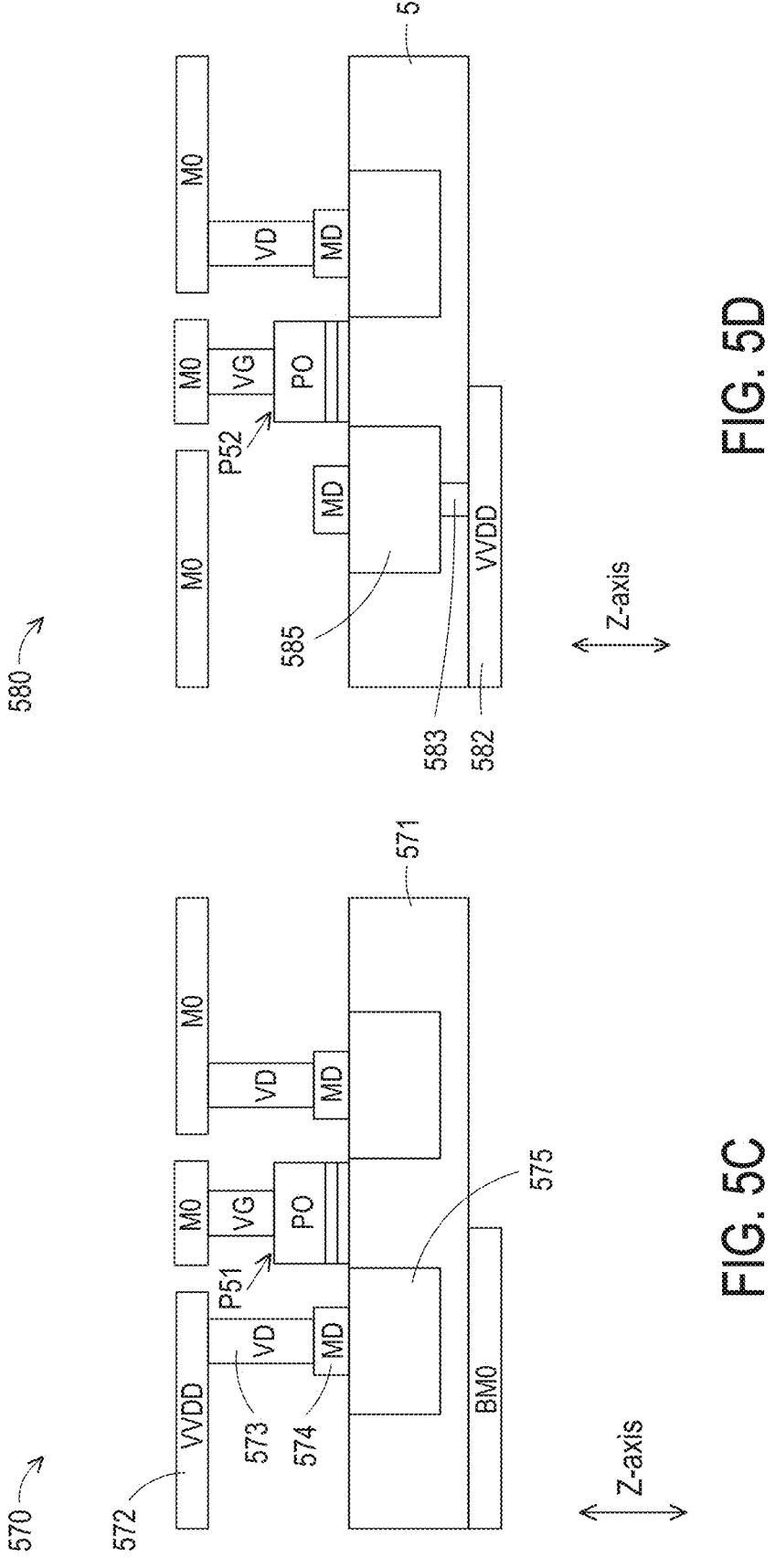
FIGS. 5C-5E are various schematic cross-sectional views in one or more functional circuit regions of one or more IC devices, in accordance with some embodiments.
Figure 5E:
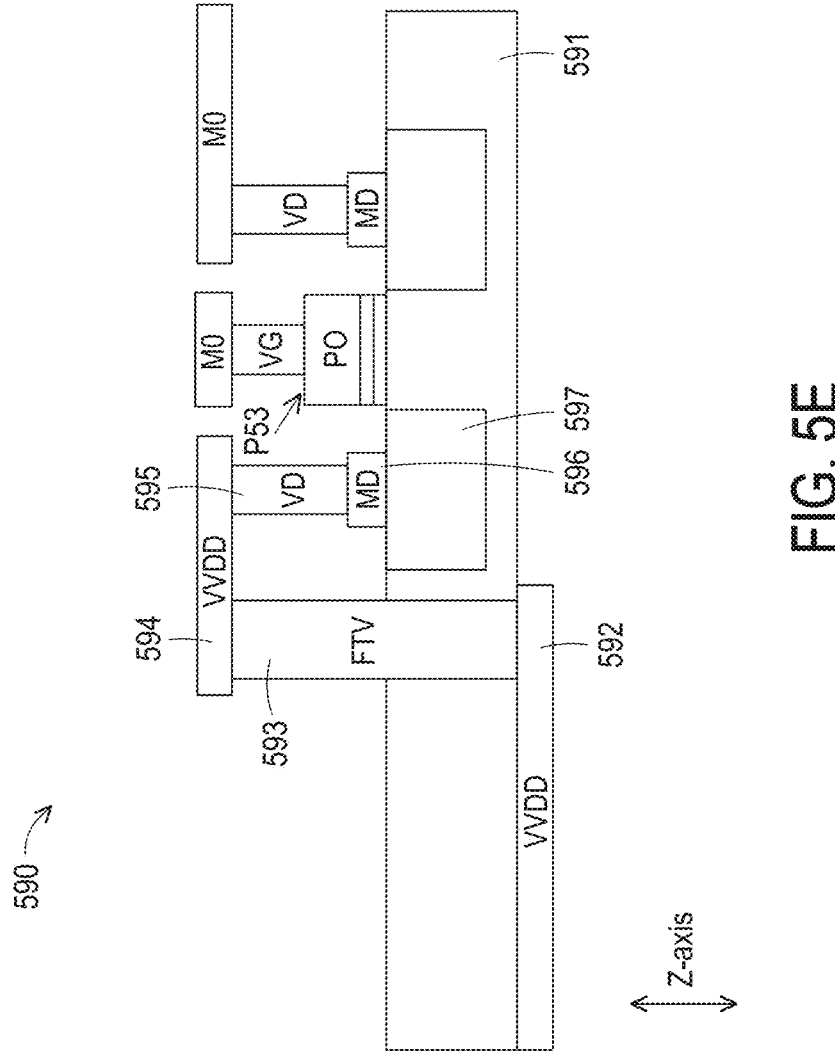

FIGS. 5C-5E are various schematic cross-sectional views in one or more functional circuit regions of one or more IC devices, in accordance with some embodiments. The schematic cross-sectional views in FIGS. 5C-5E show various examples in which VVDD from a header circuit region is delivered to a transistor in a functional circuit region.

In FIG. 5C, a transistor P51 in a functional circuit region of an IC device 570 is formed over a substrate 571 of the IC device 570. In some embodiments, the transistor P51, IC device 570, and substrate 571 correspond to the transistor P31, IC device 300, and substrate 310. In the example configuration in FIG. 5C, power supply is provided to the transistor P51 from the front side. For example, a front side VVDD power rail 572 extends from a header circuit region into the functional circuit region of the IC device 570 to provide VVDD to various transistors in the functional circuit region of the IC device 570. The front side VVDD power rail 572 is coupled through a VD via 573, an MD contact 574 to a source/drain 575 of the transistor P51 to provide VVDD to the transistor P51. In some embodiments, the front side VVDD power rail 572 corresponds to one or more front side VVDD power rails described herein.

In FIG. 5D, a transistor P52 in a functional circuit region of an IC device 580 is formed over a substrate 581 of the IC device 580. In some embodiments, the transistor P52, IC device 580, and substrate 581 correspond to the transistor P31, IC device 300, and substrate 310. In the example configuration in FIG. 5D, power supply is provided to the transistor P52 from the back side. For example, a back side VVDD power rail 582 extends from a header circuit region into the functional circuit region of the IC device 580 to provide VVDD to various transistors in the functional circuit region of the IC device 580. The back side VVDD power rail 582 is coupled through a back side via 583 to a source/drain 585 of the transistor P52 to provide VVDD from the back side to the transistor P52. In some embodiments, the back side VVDD power rail 582 corresponds to one or more back side VVDD power rails described herein. In at least one embodiment, the back side VVDD power rail 582 is wider than a front side power rail, thereby reducing power loss in the power delivery network.

In FIG. 5E, a transistor P53 in a functional circuit region of an IC device 590 is formed over a substrate 591 of the IC device 590. In some embodiments, the transistor P53, IC device 590, and substrate 591 correspond to the transistor P31, IC device 300, and substrate 310. In the example configuration in FIG. 5E, power supply is delivered on the back side of the substrate 591 to a vicinity of the transistor P53, and then provided to the front side of the substrate 591 for subsequent supply to the transistor P53 from the front side. For example, a back side VVDD power rail 592 extends from a header circuit region into the functional circuit region, or to a location adjacent the functional circuit region, of the IC device 590. The back side VVDD power rail 592 is coupled through an FTV 593 to a front side power rail 594 to provide VVDD to the front side power rail 594. The front side VVDD power rail 594 is coupled through a VD via 595, an MD contact 596 to a source/drain 597 of the transistor P53 to provide VVDD to the transistor P53. In some embodiments, the back side VVDD power rail 592 corresponds to one or more back side VVDD power rails described herein, and/or the FTV 593 corresponds to one or more FTVs described herein. In at least one embodiment, the back side VVDD power rail 592 is wider than a front side power rail, thereby reducing power loss in the power delivery network.

Figure 6A:
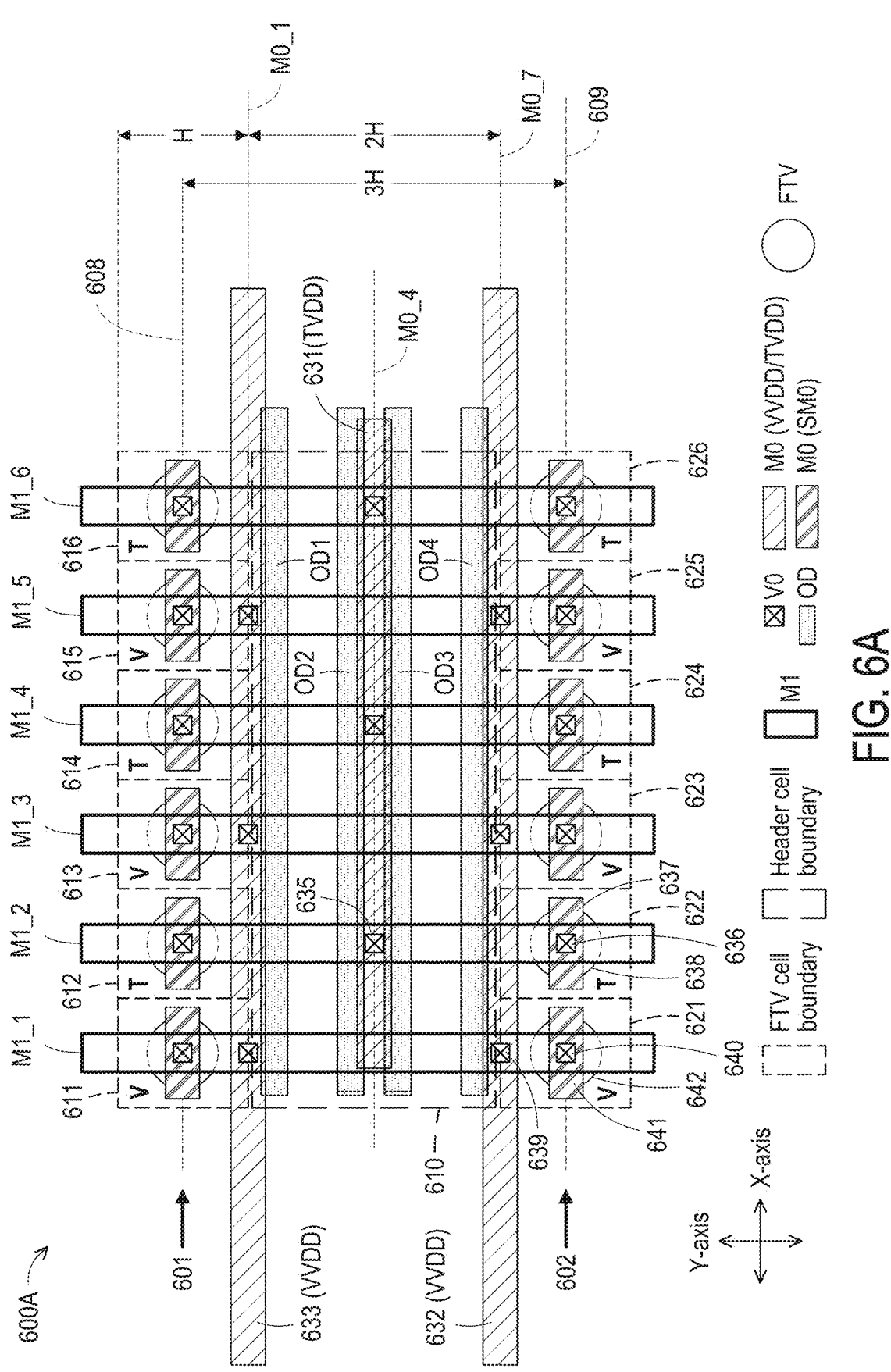
FIG. 6A is a schematic view of a layout diagram of an IC device, in accordance with some embodiments.

FIG. 6A is a schematic view of a layout diagram 600A of an IC device, in accordance with some embodiments. In some embodiments, the layout diagram 600A is stored on a non-transitory computer-readable medium. In at least one embodiment, the layout diagram 600A corresponds to one or more of the IC devices 100, 200 described herein.

In FIG. 6A, a layout of a header cell unit is illustrated. The header cell unit comprises a header cell 610, a first row 601 of FTV cells 611-616 placed in abutment with a top edge of the header cell 610, and a second row 602 of FTV cells 621-626 placed in abutment with a bottom edge of the header cell 610. Adjacent FTV cells in each of the first row 601 and second row 602 are placed in abutment. For example, a right edge of the FTV cell 611 is placed in abutment with a left edge of the FTV cell 612. Each of the first row 601 and second row 602 of FTV cells includes T-FTV cells and V-FTV cells alternatingly arranged along the X-axis. For example, the FTV cells 611, 613, 615, 621, 623, 625 are V-FTV cells, and the FTV cells 612, 614, 616, 622, 624, 626 are T-FTV cells. In at least one embodiment, all of the FTV cells 611-616, 621-626 have the same configuration of an FTV cell stored in a cell library. Depending on where the FTV cell is placed in a layout diagram, i.e., depending on which type of power rail, TVDD or VVDD, the FTV cell is coupled to, the placed FTV cell correspondingly becomes a T-FTV cell or V-FTV cell. Each of the FTV cells 611-616, 621-626 has a single cell height H.

The header cell 610 corresponds to the header cells 410, 510, and comprises PMOS active regions OD1-OD4. A number of gate regions in the header cell 610 is determined based on various factors, such as power requirements and/or area cost as described herein. Other features of the header cell 610, such as MD contacts, VD vias, VG vias are omitted for simplicity. The header cell 610 has a double cell height 2H, and a width W_pmos (not shown in FIG. 6A).

On the front side, the layout diagram 600A comprises a plurality of M0 conductive patterns, a plurality of V0 vias, and a plurality of M1 conductive patterns.

The M0 conductive patterns in the layout diagram 600A comprise a TVDD power rail 631, VVDD power rails 632, 633, and a plurality of SM0 conductive patterns each included in a corresponding FTV cell among the FTV cells 611-616, 621-626. For example, SM0 conductive patterns 637, 641 are correspondingly included in the FTV cells 622, 621. Other SM0 conductive patterns are not numbered in FIG. 6A for simplicity. The SM0 conductive patterns of the FTV cells in the first row 601 are arranged along a M0 track 608, and the SM0 conductive patterns of the FTV cells in the second row 602 are arranged along a M0 track 609. A cell height between the M0 tracks 608, 609 is 3H. The SM0 conductive patterns in abutting FTV cells, e.g., the SM0 conductive patterns 637, 641, are spaced from each other along the X-axis by a spacing defined by one or more design rules to avoid short circuit, as described with respect to FIG. 6C.

The layout diagram 600A further comprises a plurality of M1 conductive patterns M1_1, M1_2, . . . M1_6 which extend along the Y-axis, and arranged side by side along the X-axis.

The layout diagram 600A further comprises a plurality of V0 vias each coupling one of the M0 conductive patterns to a corresponding M1 conductive pattern. For example, a V0 via 635 couples the TVDD power rail 631 to the M1 conductive pattern M1_2, a V0 via 636 is included in the FTV cell 622, and couples the SM0 conductive pattern 637 to the M1 conductive pattern M1_2, a V0 via 640 is included in the FTV cell 621, and couples the SM0 conductive pattern 641 to the M1 conductive pattern M1_1, and a V0 via 639 couples the VVDD power rail 632 to the M1 conductive pattern M1_1. Other V0 vias are not numbered in FIG. 6A for simplicity.

Although not illustrated in FIG. 6A, on the back side, the layout diagram 600A further comprises a plurality of BM0 conductive patterns, a plurality of BV0 vias, and a plurality of BM1 conductive patterns corresponding to and overlapping the M0 conductive patterns, V0 vias, and M1 conductive patterns on the front side. In at least one embodiment, the layout of the BM0 conductive patterns, BV0 vias, and BM1 conductive patterns on the back side is obtained when, in the layout of the front side in FIG. 6A, M0 is replaced with BM0, V0 is replaced with BV0, and M1 is replaced with BM1. For example, the BM0 conductive patterns on the back side comprise a BM0 TVDD power rail corresponding to and overlapping the TVDD power rail 631, two BM0 VVDD power rails corresponding to and overlapping the VVDD power rails 632, 633, and a plurality of SBM0 conductive patterns each corresponding to and overlapping one of the SM0 conductive patterns in the FTV cells 611-616, 621-626. The BM1 conductive patterns on the back side comprise a plurality of BM1 conductive patterns each elongated along the Y-axis, corresponding to and overlapping one of the M1 conductive patterns M1_1, M1_2, . . . M1_6. The BV0 vias on the back side comprises a plurality of BV0 vias each coupling one of the BM0 conductive patterns to a corresponding BM1 conductive pattern. For example, a BV0 via corresponding to the V0 via 635 couples the BM0 TVDD power rail corresponding to the TVDD power rail 631 with the BM1 conductive pattern corresponding to the M1 conductive pattern M1_2. In at least one embodiment, a difference between the front side and back side is that the BM0 conductive patterns and BM1 conductive patterns on the back side are wider or larger than the corresponding M0 conductive patterns and M1 conductive patterns on the front side, in a manner similar to that described with respect to FIG. 4B.

The layout diagram 600A further comprises a plurality of FTVs each included in one corresponding FTV cell among the FTV cells 611-616, 621-626. For example, FTVs 638, 642 are correspondingly included in the FTV cells 622, 621. Other FTVs are not numbered in FIG. 6A for simplicity. The FTV in each FTV cell among the FTV cells 611-616, 621-626 couples the corresponding SM0 conductive pattern and the corresponding BSM0 conductive pattern. For example, the FTV 638 in the FTV cells 622 couples the SM0 conductive pattern 637 to the corresponding BSM0 conductive pattern underlying the SM0 conductive pattern 637. In at least one embodiment, one or more advantages described herein are achievable by the layout diagram 600A, and/or an IC device corresponding to the layout diagram 600A.

Figure 6B:
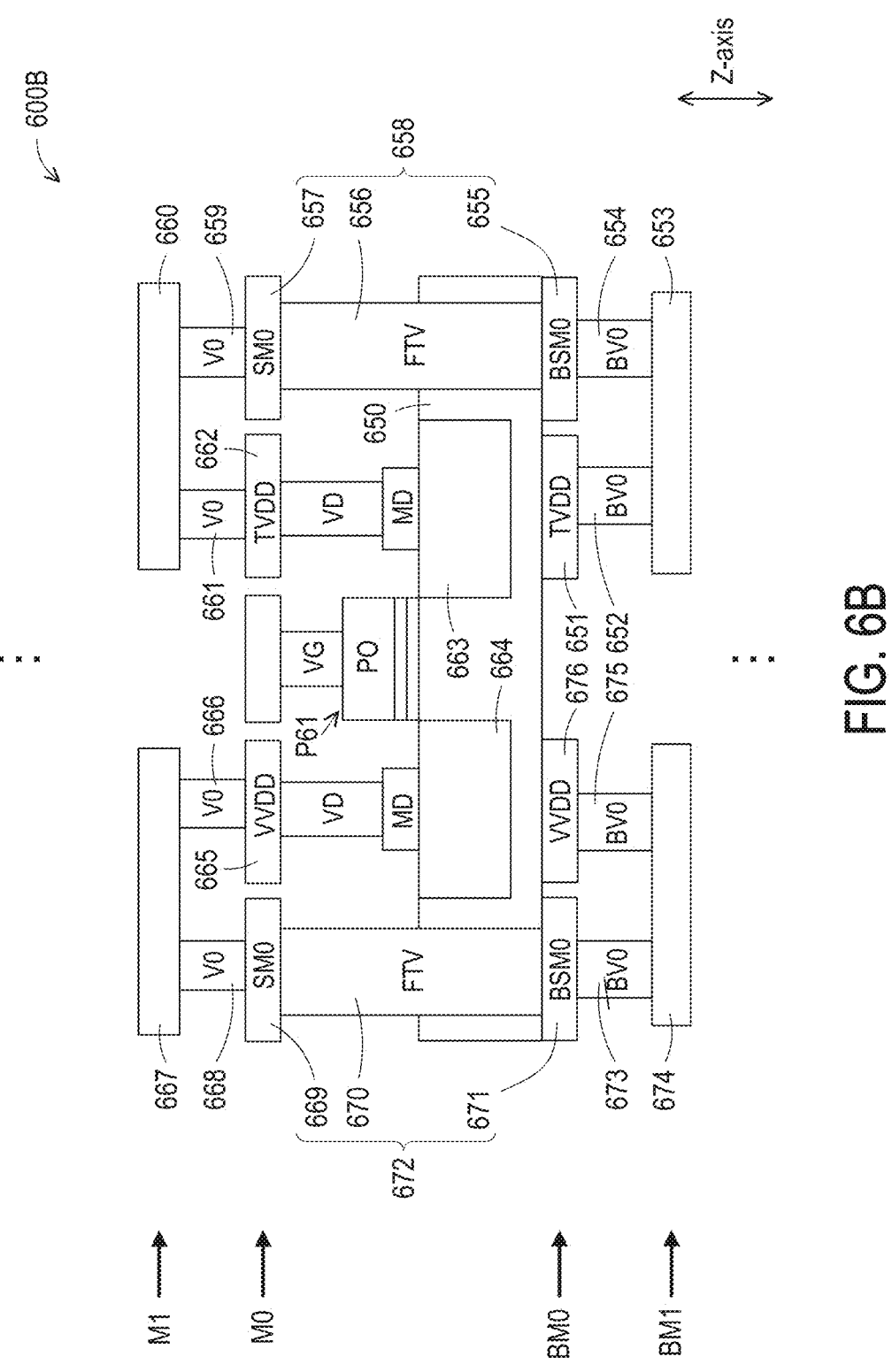
FIG. 6B is a schematic cross-sectional view of an IC device, in accordance with some embodiments.

FIG. 6B is a schematic cross-sectional view in a header circuit region of an IC device 600B, in accordance with some embodiments. In at least one embodiment, the IC device 600B corresponds to the layout diagram 600A. The cross-sectional view in FIG. 6B shows features, conductive patterns, vias, connections associated with a transistor P61 in a header cell formed over a substrate 650 of the IC device 600B. In at least one embodiment, the header cell formed over the substrate 650 corresponds to the header cell 610, and the transistor P61 corresponds to a transistor in the header cell 610 and/or the transistor P31 in FIG. 3.

Referring to both FIGS. 6A-6B, a first portion of a power delivery path in the IC device 600B is from a BM0 TVDD power rail 651, to a BV0 via 652, then to a BM1 conductive pattern 653, then to a BV0 via 654, then to a BSM0 conductive pattern 655, then to an FTV 656, then to an SM0 conductive pattern 657. The BSM0 conductive pattern 655, FTV 656, SM0 conductive pattern 657 together form an FTV structure 658 which is a T-FTV structure. In some embodiments, the first portion of the power delivery path in the IC device 600B corresponds to a first portion of a power delivery path in the layout diagram 600A which is from the BM0 TVDD power rail (not shown) corresponding to the TVDD power rail 631, to the BV0 via (not shown) corresponding to the V0 via 635, then to the BM1 conductive pattern (not shown) corresponding to the M1 conductive pattern M1_2, then to the BV0 via (not shown) corresponding to the V0 via 636, then to the BSM0 conductive pattern (not shown) corresponding to the SM0 conductive pattern 637, then to the FTV 638, then to the SM0 conductive pattern 637. The BSM0 conductive pattern (not shown) corresponding to the SM0 conductive pattern 637, the FTV 638, and the SM0 conductive pattern 637 in the T-FTV cell 622 in FIG. 6A correspond to the T-FTV structure 658 in FIG. 6B.

A subsequent, second portion of the power delivery path in the IC device 600B is further from SM0 conductive pattern 657, to a V0 via 659, then to an M1 conductive pattern 660, then to a V0 via 661, then to a TVDD power rail 662. In some embodiments, the second portion of the power delivery path in the IC device 600B corresponds to a second portion of the power delivery path in the layout diagram 600A which is from the SM0 conductive pattern 637, to the V0 via 636, then to the M1 conductive pattern M1_2, then to the V0 via 635, then to the TVDD power rail 631.

A subsequent, third portion of the power delivery path in the IC device 600B is further from the TVDD power rail 662, through a VD via and an MD contact to a source/drain 663 of the transistor P61, then to another source/drain 664 of the transistor P61 when the transistor P61 is turned ON, then through a further MD contact and a further VD via to a VVDD power rail 665. In some embodiments, the third portion of the power delivery path in the IC device 600B corresponds to a third portion of the power delivery path in the layout diagram 600A which is from the TVDD power rail 631, through a VD via and an MD contact (e.g., as described with respect to the via VD1 and MD contact MD1 in FIG. 4A) to a source/drain of transistor corresponding to the transistor P61, then to another source/drain of the corresponding transistor when the corresponding transistor is turned ON, then through a further MD contact and a further VD via (e.g., as described with respect to the via VD2 and MD contact MD2 in FIG. 4A) to the VVDD power rail 632.

A subsequent, fourth portion of the power delivery path in the IC device 600B is further from the VVDD power rail 665, to a V0 via 666, then to an M1 conductive pattern 667, then to a V0 via 668, then to an SM0 conductive pattern 669, then to an FTV 670, then to a BSM0 conductive pattern 671. The SM0 conductive pattern 669, FTV 670, and BSM0 conductive pattern 671 together form an FTV structure 672 which is a V-FTV structure. In some embodiments, the fourth portion of the power delivery path in the IC device 600B corresponds to a fourth portion of the power delivery path in the layout diagram 600A which is from the VVDD power rail 632, to the V0 via 639, then to the M1 conductive pattern M1_1, then to the V0 via 640, then to the SM0 conductive pattern 641, then to the FTV 642, then to the BSM0 conductive pattern (not shown) corresponding to the SM0 conductive pattern 641. The SM0 conductive pattern 641, the FTV 642, and the BSM0 conductive pattern (not shown) corresponding to the SM0 conductive pattern 641 in the T-FTV cell 621 in FIG. 6A correspond to the V-FTV structure 672 in FIG. 6B.

A subsequent, fifth portion of the power delivery path in the IC device 600B is further from the BSM0 conductive pattern 671, to a BV0 via 673, then to a BM1 conductive pattern 674, then to a BV0 via 675, then to a BM0 VVDD power rail 676. In some embodiments, the fifth portion of the power delivery path in the IC device 600B corresponds to a fifth portion of the power delivery path in the layout diagram 600A which is from the BSM0 conductive pattern (not shown) corresponding to the SM0 conductive pattern 641, then to the BV0 via (not shown) corresponding to the V0 via 640, then to the BM1 conductive pattern (not shown) corresponding to the M1 conductive pattern M1_1, then to the BV0 via (not shown) corresponding to the V0 via 639, then to the BM0 VVDD power rail (not shown) corresponding to the VVDD power rail 632.

Figure 6C:
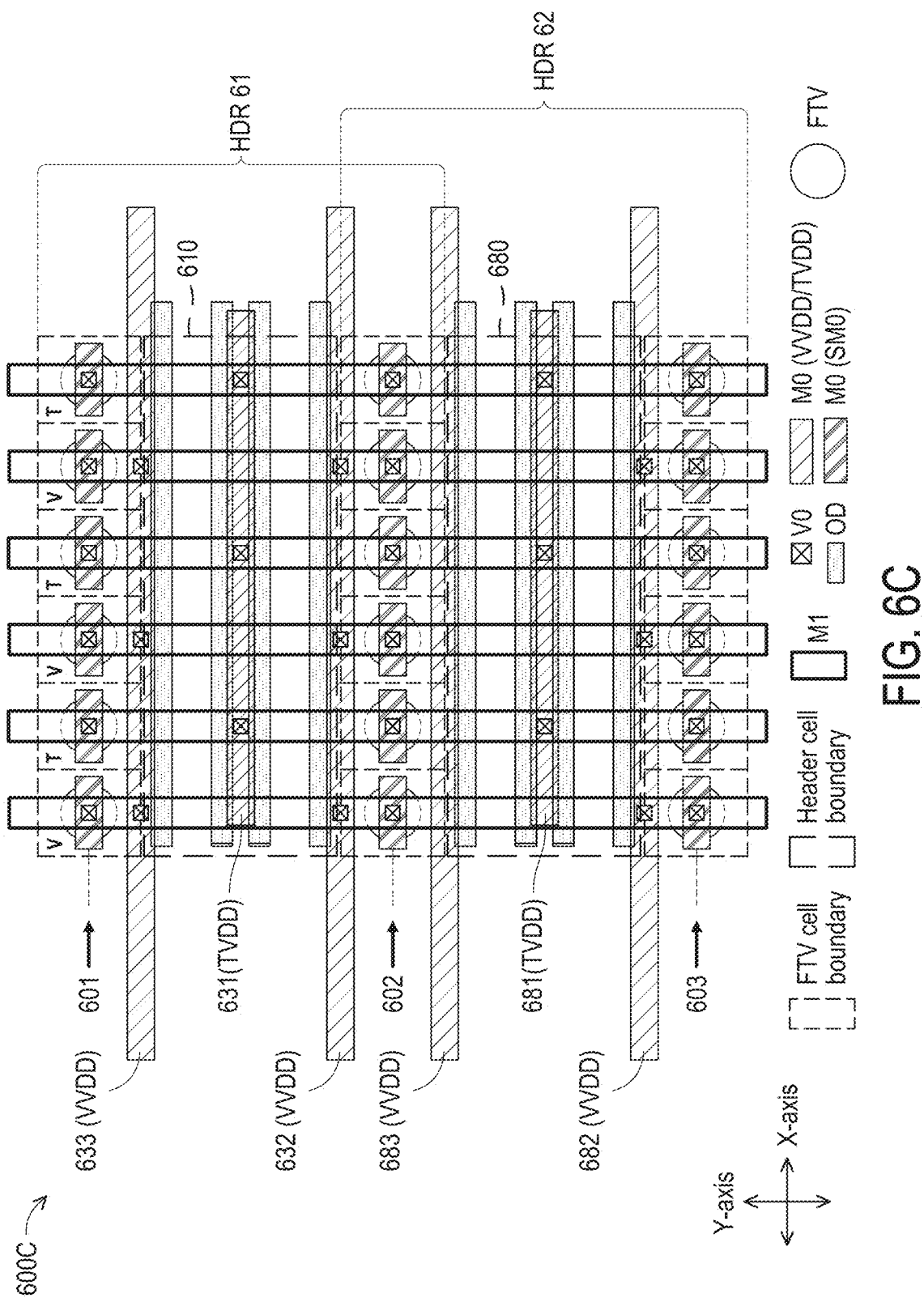
FIG. 6C is a schematic view of a layout diagram of an IC device, in accordance with some embodiments.

FIG. 6C is a schematic view of a layout diagram 600C of an IC device, in accordance with some embodiments. In some embodiments, the layout diagram 600C is stored on a non-transitory computer-readable medium. In at least one embodiment, the layout diagram 600C corresponds to one or more of the IC devices 100, 200, 600B described herein.

The layout diagram 600C comprises two header cell units HDR 61, HDR 62 each corresponding to the layout diagram 600A. Specifically, the header cell unit HDR 61 comprises the first row 601 and second row 602 of FTV cells, the header cell 610, the TVDD power rail 631, and the VVDD power rails 632, 633. The header cell unit HDR 62 shares the second row 602 of FTV cells with the header cell unit HDR 61. The header cell unit HDR 62 further comprises a third row 603 of FTV cells, a header cell 680, a TVDD power rail 681, and VVDD power rails 682, 683. In the header cell unit HDR 62, the second row 602 and third row 603 of FTV cells, the header cell 680, the TVDD power rail 681 and the VVDD power rails 682, 683 correspond to the first row 601 and second row 602 of FTV cells in the header cell unit HDR 61, the header cell 610, the TVDD power rail 631 and the VVDD power rails 632, 633. In some embodiments, one or more additional header cell units similar to the header cell unit HDR 61, HDR 62 are added, along the Y-axis, at the top or bottom of the layout diagram 600C in the described manner, i.e., two adjacent header cell units share a row of FTV cells. In at least one embodiment, one or more advantages described herein are achievable by the layout diagram 600C, and/or an IC device corresponding to the layout diagram 600C.

Figure 6D:
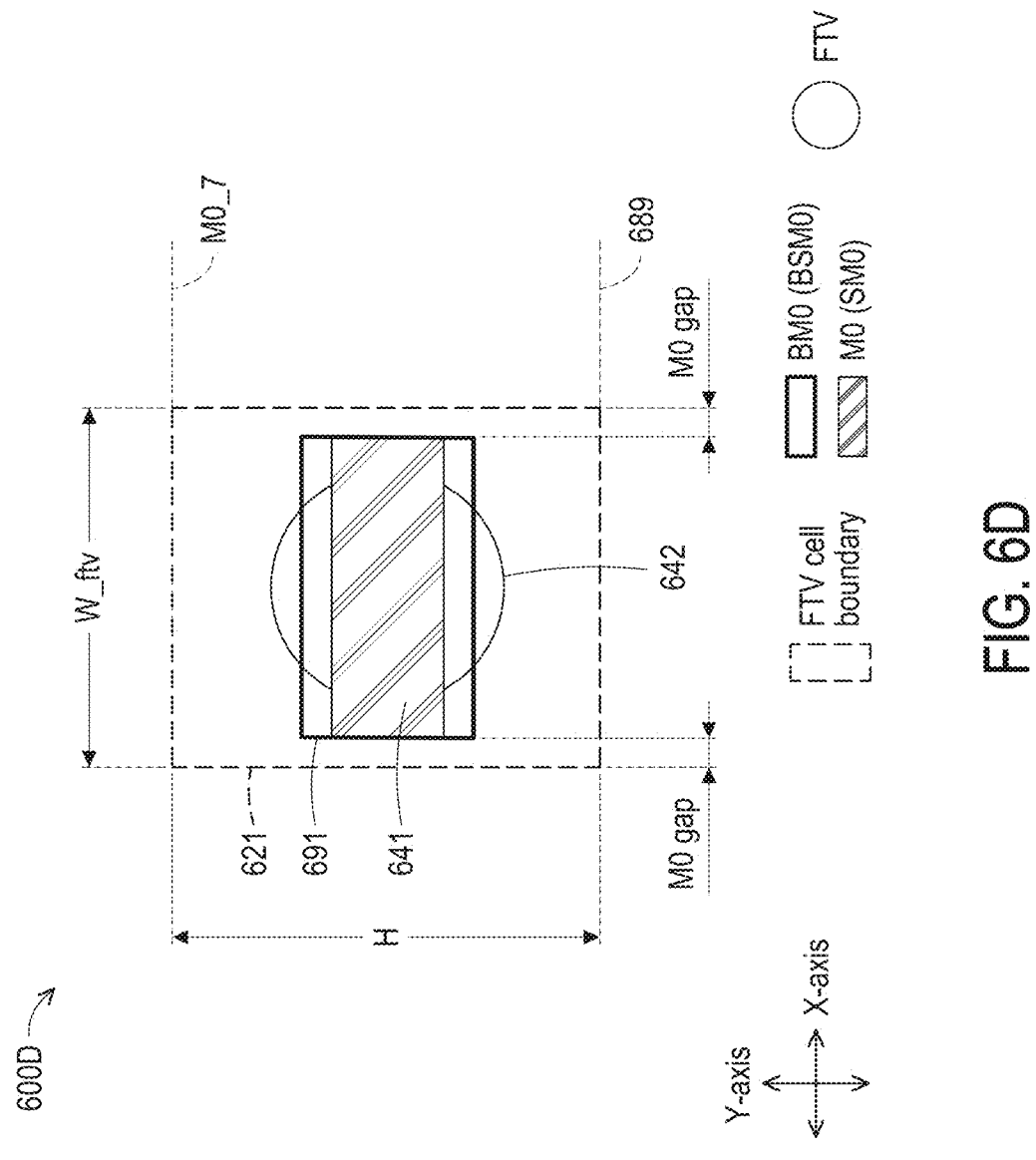
FIG. 6D is a schematic view of a layout diagram of a feed through via (FTV) cell, in accordance with some embodiments.

FIG. 6D is a schematic view of a layout diagram 600D of an FTV cell, in accordance with some embodiments. In some embodiments, the layout diagram 600D is applicable to at least one, or any, of the FTV cells 611-616, 621-626 in FIG. 6A, and/or the FTV cells in FIG. 6C. For example, as illustrated in FIG. 6D, the layout diagram 600D is described with respect to the FTV cell 621 in FIG. 6A.

The FTV cell 621 comprises the SM0 conductive pattern 641, the FTV 642, and the BSM0 conductive pattern 691 corresponding to and underlying the SM0 conductive pattern 641. In an example IC device including the FTV cell 621, e.g., the IC device 600B, the SM0 conductive pattern 641, the FTV 642 and the BSM0 conductive pattern 691 correspond to the SM0 conductive pattern 669, the FTV 670 and the BSM0 conductive pattern 671. The height of the FTV cell 621 is H, which is the distance along the Y-axis between the top edge and the bottom edge of the FTV cell 621. The top edge of the FTV cell 621 coincides with the track M0_7. The bottom edge of the FTV cell 621 coincides with a line 689. In at least one embodiment, the line 689 is another M0 track. The width W_ftv of the FTV cell 621 along the X-axis is as described with respect to FIG. 4A.

As described with respect to FIG. 6A, to satisfy one or more design rules for preventing a short circuit between the SM0 conductive pattern 641 and an SM0 conductive pattern of an FTV cell abutting the FTV cell 621 along the X-axis, the SM0 conductive pattern 641 is spaced from left and right edges of the FTV cell 621 by a spacing, i.e., an M0 gap. The size (dimension) of the M0 gap depends on one or more design rules. In at least one embodiment, the size of the M0 gap is from 1 nm to 5 CPPs. In the example configuration in FIG. 6D, the same M0 gap is applicable to the SM0 conductive pattern 641 and BSM0 conductive pattern 691. In at least one embodiment, the BSM0 conductive pattern 691 is spaced along the X-axis from the left and right edges of the FTV cell 621 by a spacing different from the M0 gap. In some embodiments, the spacing of the BSM0 conductive pattern 691 from the left and right edges of the FTV cell 621 is from 1 nm to 5 CPPs.

Figure 7:
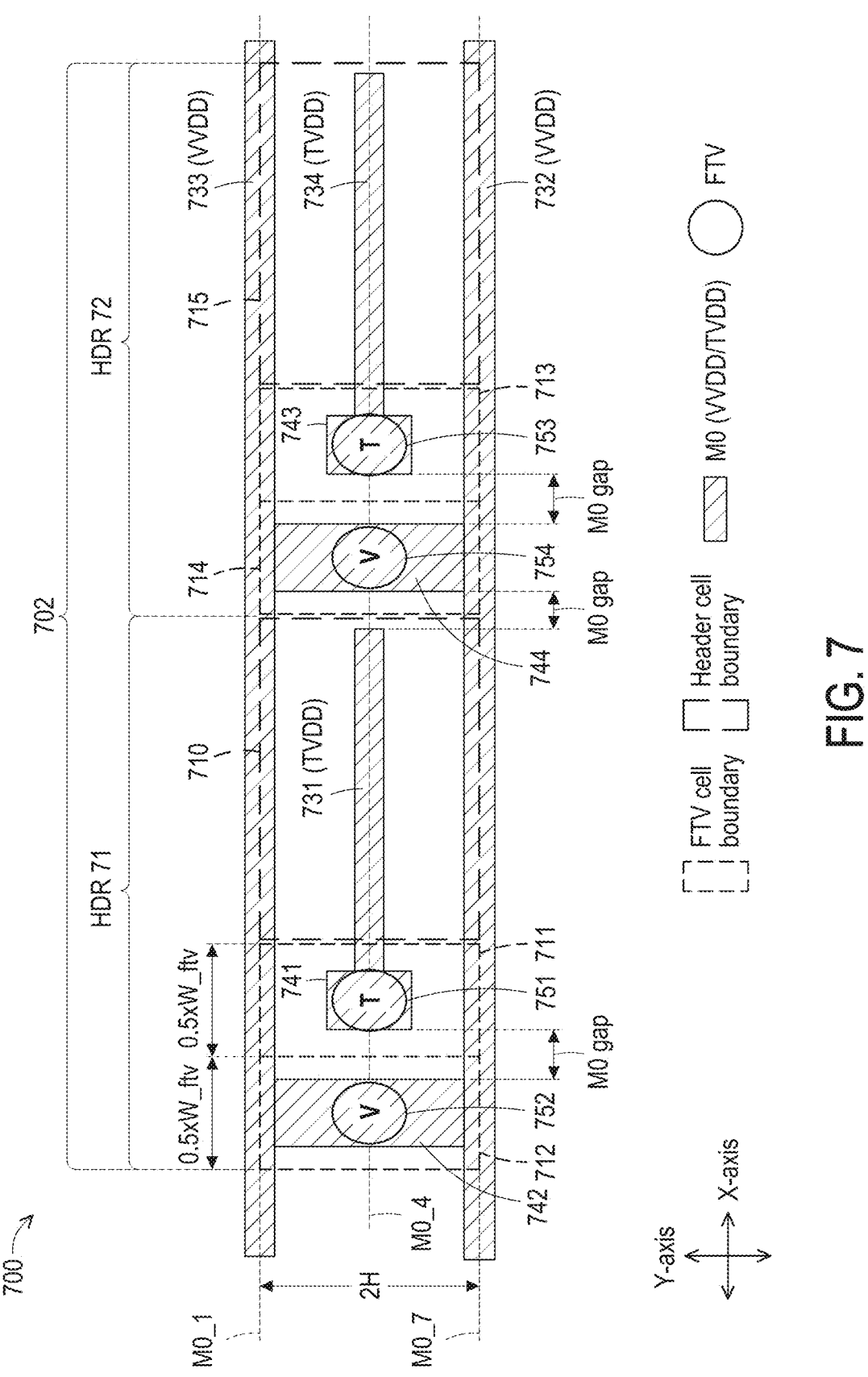
FIGS. 7-9 are schematic views of layout diagrams of one or more IC devices, in accordance with some embodiments.

FIG. 7 is a schematic view of a layout diagram 700 of an IC device, in accordance with some embodiments. In some embodiments, the layout diagram 700 is stored on a non-transitory computer-readable medium. In at least one embodiment, the layout diagram 700 corresponds to one or more of the IC devices 100, 200, 300 described herein. Components of the layout diagram 700 having corresponding components in the layout diagram 400 are designated by the same reference numerals, or by the reference numerals of the layout diagram 400 increased by three hundred.

The layout diagram 700 comprises a header circuit region 702 corresponding to the header circuit region 402. The header circuit region 702 comprises header cell units HDR 71, HDR 72 corresponding to header cell units HDR 41, HDR 42. In some embodiments, the header cell units HDR 71, HDR 72 have the same configuration. The header cell unit HDR 71 comprises a header cell 710 corresponding to the header cell 410, a T-FTV cell 711, and a V-FTV cell 712. The header cell unit HDR 72 comprises a header cell 715 corresponding to the header cell 415, a T-FTV cell 713, and a V-FTV cell 714. In some embodiments, the T-FTV cells 711, 713 have the same configuration, and/or the V-FTV cells 712, 714 have the same configuration.

An M0 layer in the header circuit region 702 comprises TVDD power rails 731, 734 correspondingly in the header cell units HDR 71, HDR 72. The M0 layer in the header circuit region 702 further comprises VVDD power rails 732, 733 common for both the header cell units HDR 71, HDR 72, and M0 conductive patterns 741-744 correspondingly in the FTV cells 711-714. The header circuit region 702 further comprises FTVs 751-754 correspondingly in the FTV cells 711-714. A BM0 layer in the header circuit region 702 comprises BM0 power rails (i.e., back side power rails) and BM0 conductive patterns which overlap and have the same pattern or configuration as the M0 power rails 731-734 and M0 conductive patterns 741-744, in a manner similar to that described with respect to FIG. 4B. Each of the FTV cells 711-714 comprises the corresponding M0 conductive pattern 741-744, the corresponding FTV 751-754, and the corresponding BM0 conductive pattern (not shown).

In the T-FTV cell 711, the M0 conductive pattern 741 projects along the Y-axis from the TVDD power rail 731 towards both of the VVDD power rails 732, 733, without touching the VVDD power rails 732, 733. The TVDD power rail 731 extends along the X-axis from the M0 conductive pattern 741 toward the header cell unit HDR 72, and is discontinued within the header cell 710 without reaching the header cell unit HDR 72. The BM0 power rail underlying the TVDD power rail 731 is discontinued in a similar manner. In the V-FTV cell 712, the M0 conductive pattern 742 extends along the Y-axis to connect the VVDD power rails 732, 733. Each of the T-FTV cell 711 and V-FTV cell 712 has a cell height H and a width of half the width W_ftv.

In the T-FTV cell 713, the M0 conductive pattern 743 projects along the Y-axis from the TVDD power rail 734 towards both of the VVDD power rails 732, 733, without touching the VVDD power rails 732, 733. The TVDD power rail 734 extends along the X-axis from the M0 conductive pattern 743 away from the header cell unit HDR 71, and is discontinued within the header cell 715. The BM0 power rail underlying the TVDD power rail 734 is discontinued in a similar manner. In the V-FTV cell 714, the M0 conductive pattern 744 extends along the Y-axis to connect the VVDD power rails 732, 733. Each of the T-FTV cell 713 and V-FTV cell 714 has a cell height H and a width of half the width W_ftv.

The TVDD power rail 731 and the underlying BM0 power rail are configured to provide TVDD to the header cell 710, but not to the header cell 715 or another header cell arranged on the left of the V-FTV cell 712. The TVDD power rail 734 and the underlying BM0 power rail are configured to provide TVDD to the header cell 715, but not to the header cell 710 or another header cell arranged on the right of the header cell 715. To prevent short circuits, each of a spacing between the M0 conductive patterns 742, 741, a spacing between the TVDD power rail 731 and the M0 conductive pattern 744, and a spacing between the M0 conductive patterns 744, 743 corresponds to the M0 gap described with respect to FIG. 6D.

In some embodiments, in a manner similar to that described with respect to FIGS. 3, 4A, 4B, TVDD is provided from the back side to the TVDD power rails 731, 734 by the corresponding FTVs 751, 753. When the header cells 710, 715 are switched ON, VVDD is provided to the common VVDD power rails 732, 733, then returned to the back side through the FTVs 752, 754. In at least one embodiment, one or more advantages described herein are achievable by the layout diagram 700, and/or an IC device corresponding to the layout diagram 700.

Figure 8:
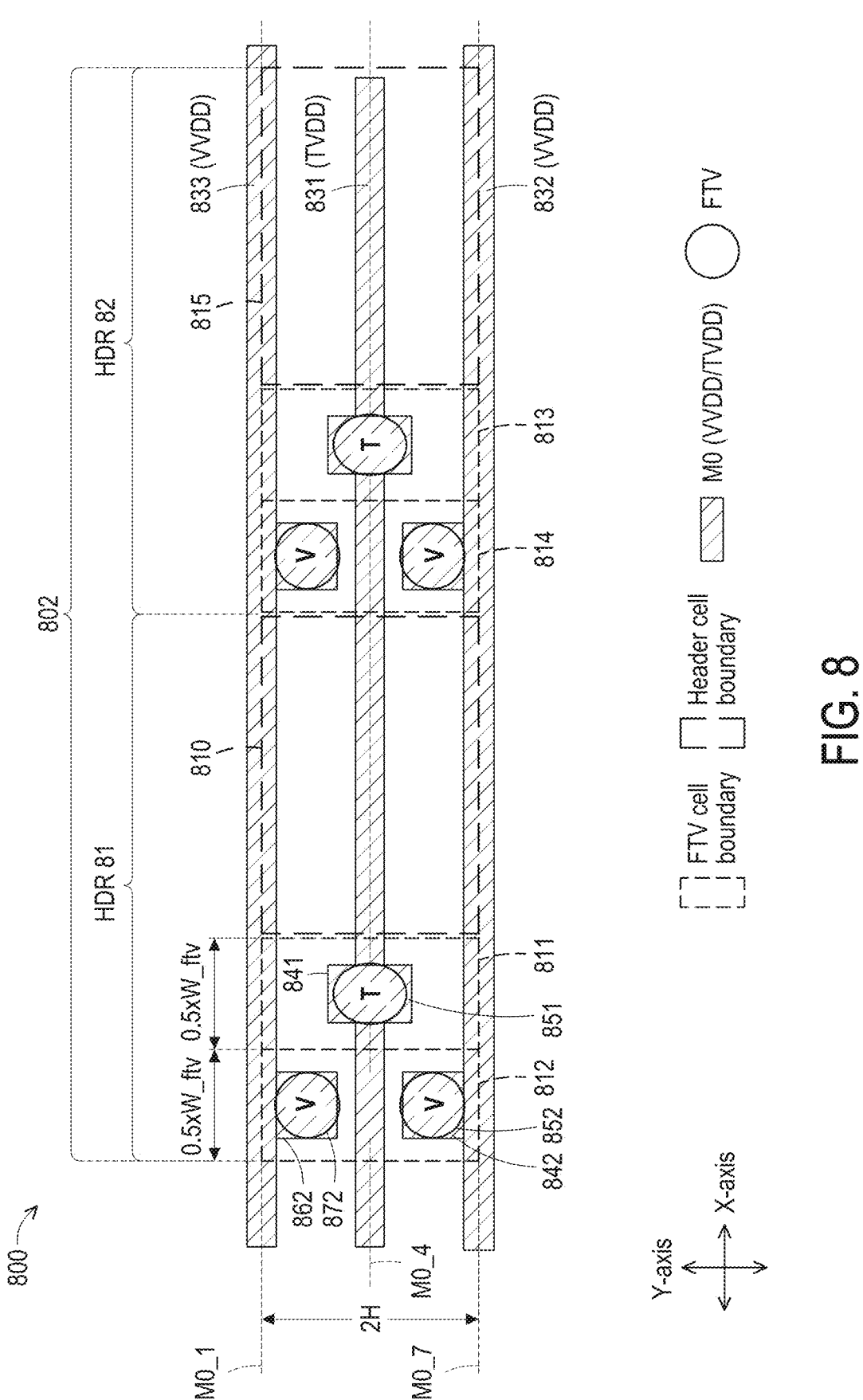

FIG. 8 is a schematic view of a layout diagram 800 of an IC device, in accordance with some embodiments. In some embodiments, the layout diagram 800 is stored on a non-transitory computer-readable medium. In at least one embodiment, the layout diagram 800 corresponds to one or more of the IC devices 100, 200, 300 described herein. Components of the layout diagram 800 having corresponding components in the layout diagram 400 are designated by the same reference numerals, or by the reference numerals of the layout diagram 400 increased by four hundred.

The layout diagram 800 comprises a header circuit region 802 corresponding to the header circuit region 402. The header circuit region 802 comprises header cell units HDR 81, HDR 82 corresponding to header cell units HDR 41, HDR 42. In some embodiments, the header cell units HDR 81, HDR 82 have the same configuration. The header cell unit HDR 81 comprises a header cell 810 corresponding to the header cell 410, a T-FTV cell 811, and a V-FTV cell 812. The header cell unit HDR 82 comprises a header cell 815 corresponding to the header cell 415, a T-FTV cell 813, and a V-FTV cell 814. In some embodiments, the T-FTV cells 811, 813 have the same configuration, and/or the V-FTV cells 812, 814 have the same configuration.

An M0 layer in the header circuit region 802 comprises a TVDD power rail 831 and VVDD power rails 832, 833 all of the which are common for both the header cell units HDR 81, HDR 82. The M0 layer in the header cell unit HDR 81 further comprises an M0 conductive pattern 841 in the T-FTV cell 811, and M0 conductive patterns 842, 862 in the V-FTV cell 812. The header cell unit HDR 81 further comprises FTVs 851, 852, 872 correspondingly under the M0 conductive patterns 841, 842, 862. A BM0 layer in the header cell unit HDR 81 comprises BM0 power rails (i.e., back side power rails) and BM0 conductive patterns which overlap and have the same pattern or configuration as the M0 power rails 831-833 and M0 conductive patterns 841, 842, 862, in a manner similar to that described with respect to FIG. 4B. The T-FTV cell 811 comprises the M0 conductive pattern 841, the FTV 851, and the BM0 conductive pattern (not shown) corresponding to the M0 conductive pattern 841. The V-FTV cell 812 comprises the M0 conductive patterns 842, 862, the FTVs 852, 872, and the BM0 conductive patterns (not shown) corresponding to the M0 conductive patterns 842, 862.

In the T-FTV cell 811, the M0 conductive pattern 841 projects along the Y-axis from the TVDD power rail 831 towards both the VVDD power rails 832, 833, without touching the VVDD power rails 832, 833. The TVDD power rail 831 extends along the X-axis, and is common to both header cell units HDR 81, HDR 82. In the V-FTV cell 812, the M0 conductive patterns 842, 862 extend along the Y-axis from the corresponding VVDD power rails 832, 833 toward the TVDD power rail 831, without touching the TVDD power rail 831. Each of the T-FTV cell 811 and V-FTV cell 812 has a cell height H and a width of half the width W_ftv. The T-FTV cell 813 has a similar configuration to the T-FTV cell 811, and is not described in detail herein. The V-FTV cell 814 has a similar configuration to the V-FTV cell 812, and is not described in detail herein.

In some embodiments, in a manner similar to that described with respect to FIGS. 3, 4A, 4B, TVDD is provided from the back side to the TVDD power rail 831 by the FTV 851 and the corresponding FTV in the T-FTV cell 813. When the header cells 810, 815 are switched ON, VVDD is provided to the VVDD power rails 832, 833, then returned to the back side through the FTVs 852, 872 and the corresponding FTVs in the V-FTV cell 814. In the layout diagram 700, the VVDD power rails 732, 733 are electrically connected with each other by the M0 conductive patterns 742, 744. In the layout diagram 800, the VVDD power rails 832, 833 are electrically connected with each other, e.g., by MD contacts, in the header cells 810, 815, in a manner similar to that described with respect to FIG. 4A. In at least one embodiment, one or more advantages described herein are achievable by the layout diagram 800, and/or an IC device corresponding to the layout diagram 800.

Figure 9:
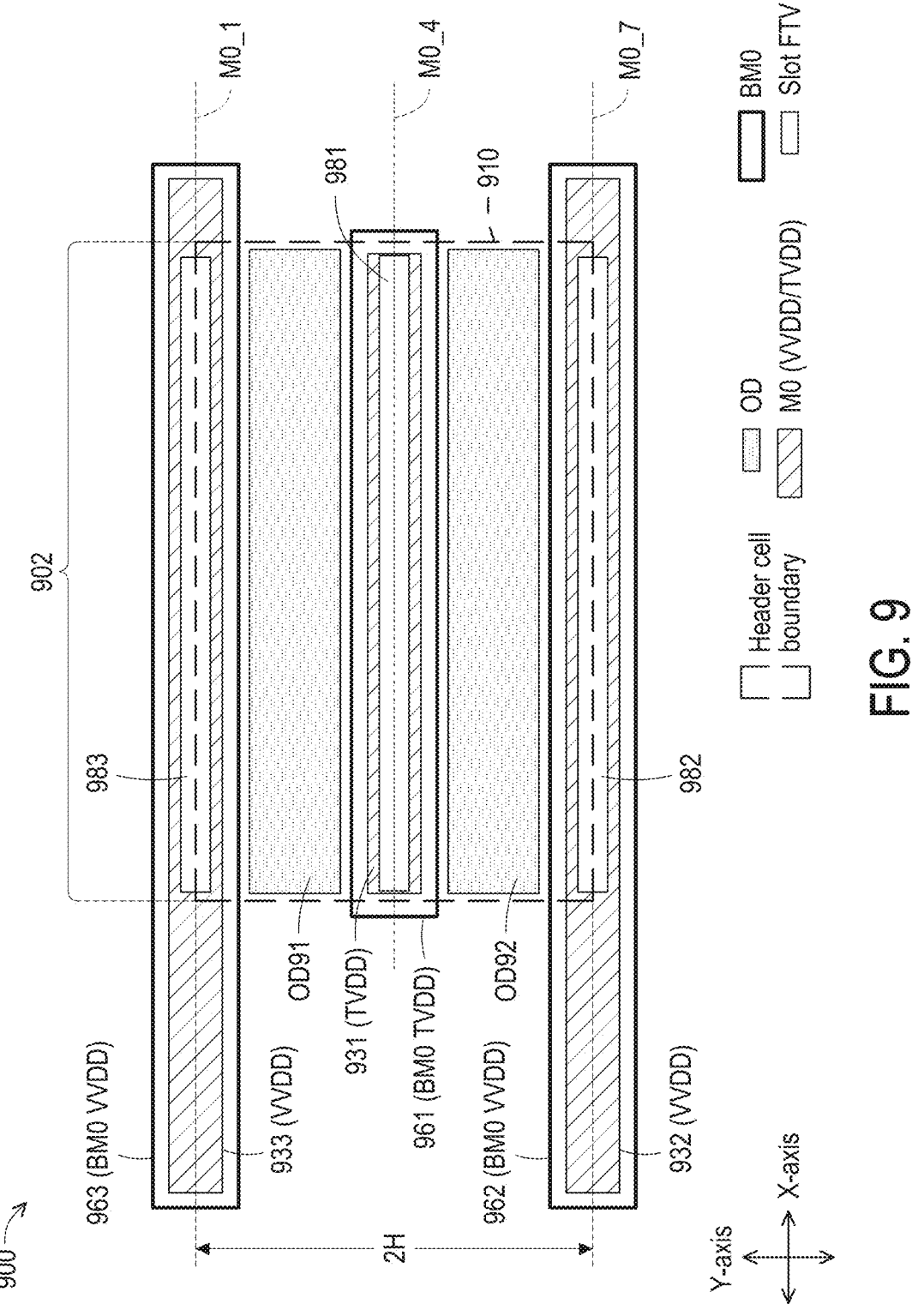

FIG. 9 is a schematic view of a layout diagram 900 of an IC device, in accordance with some embodiments. In some embodiments, the layout diagram 900 is stored on a non-transitory computer-readable medium. In at least one embodiment, the layout diagram 900 corresponds to one or more of the IC devices 100, 200, 300 described herein. Components of the layout diagram 900 having corresponding components in the layout diagram 400 are designated by the same reference numerals, or by the reference numerals of the layout diagram 400 increased by five hundred.

The layout diagram 900 comprises a header circuit region 902 corresponding to the header circuit region 402. The header circuit region 902 comprises a header cell 910 comprising active regions OD91, OD92 configured to form PMOS transistors for a header circuit as described herein. An M0 layer in the header circuit region 902 comprises a TVDD power rail 931 and VVDD power rails 932, 933. A BM0 layer in the header circuit region 902 comprises BM0 TVDD power rail 961 and BM0 VVDD power rails 962, 963. The BM0 power rails 961-963 are correspondingly under and wider than the power rails 931-933.

The header circuit region 902 further comprises slot FTVs 981-983 continuously extending along the X-axis, over substantially the whole width of the header cell 910. The slot FTVs 981-983 correspondingly couple the BM0 power rails 961-963 on the back side to the power rails 931-933 on the front side. In an IC device corresponding to the layout diagram 900, each of the slot FTVs 981-983 is a wall that extends along the Z-axis from the BM0 layer through the substrate to the M0 layer, and also extends continuously along the X-axis. In at least one embodiment, because the BM0 power rails 961-963 on the back side are wider than the power rails 931-933 on the front side, the width of the slot FTVs 981-983 is limited to the width of the power rails 931-933.

In some embodiments, in a manner similar to that described with respect to FIGS. 3, 4A, 4B, TVDD is provided from the BM0 TVDD power rail 961 to the TVDD power rail 931 by the slot FTV 981. When the header cell 910 is switched ON, VVDD is provided to the VVDD power rails 932, 933, then returned to the BM0 VVDD power rails 962, 963 on the back side through the corresponding slot FTVs 982, 983. In some embodiments, the FTVs, including slot FTVs, described herein do not occupy areas of active regions. As a result, it is possible in one or more embodiments to supply power from the back side without affecting chip areas usable for transistors and/or other active devices. In at least one embodiment, one or more advantages described herein are achievable by the layout diagram 900, and/or an IC device corresponding to the layout diagram 900.

FIGS. 10A-10D are schematic views of various functional circuit regions in layout diagrams of one or more IC devices, in accordance with some embodiments. In some embodiments, the layout diagrams in FIGS. 10A-10D correspond, in one or more aspects, to the layout diagrams in FIGS. 5A, 6A, 6C, 9.

Figure 10A:
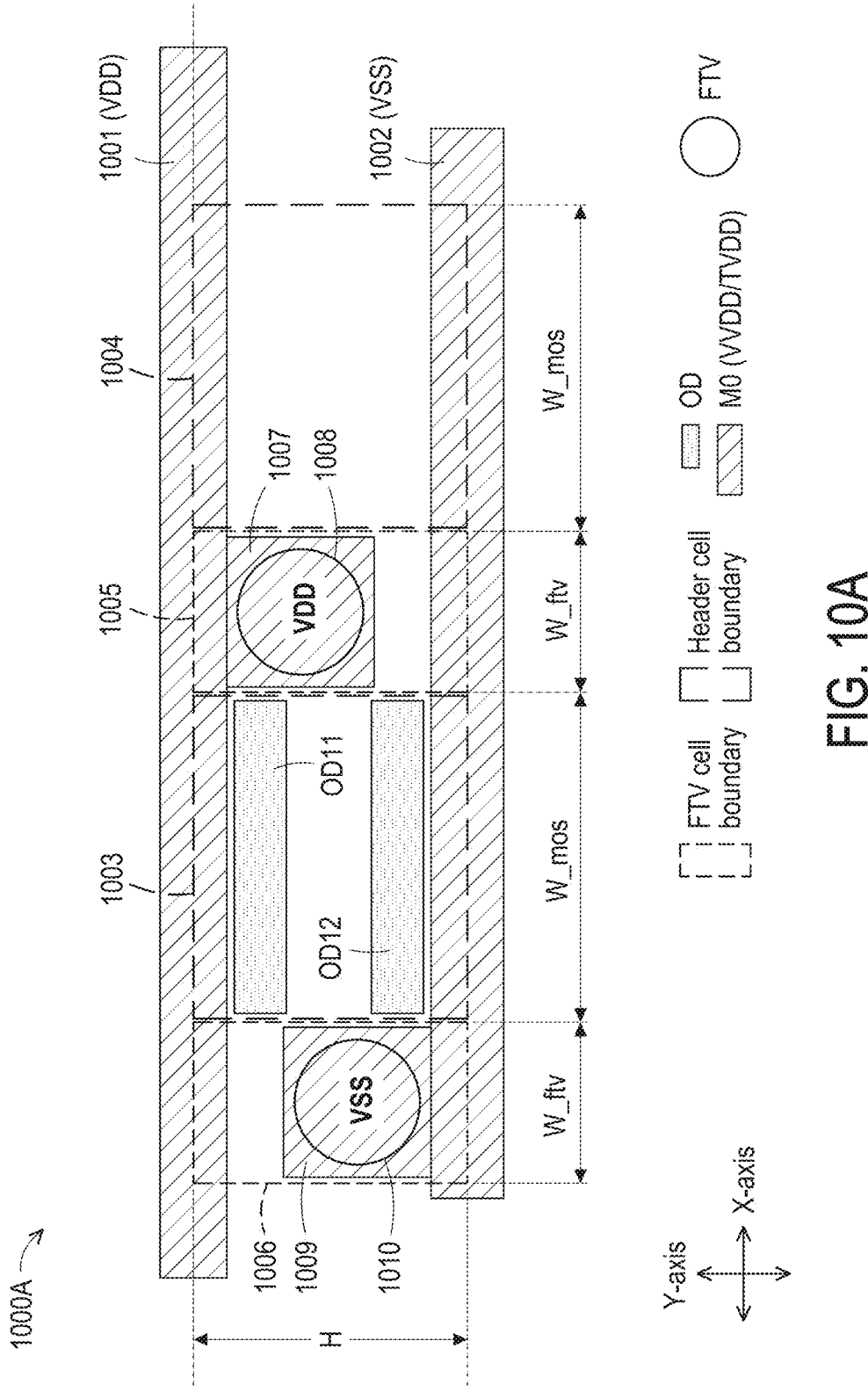
FIGS. 10A-10D are schematic views of layout diagrams of various functional circuit regions in one or more IC devices, in accordance with some embodiments.

FIG. 10A is a schematic view of a layout diagram 1000A of an IC device, in accordance with some embodiments. In some embodiments, the layout diagram 1000A is stored on a non-transitory computer-readable medium. In at least one embodiment, the layout diagram 1000A corresponds to one or more of the IC devices 100, 200, 300 described herein.

The layout diagram 1000A comprises a VDD power rail 1001, a VSS power rail 1002, functional circuit regions 1003, 1004, and FTV cells 1005, 1006. A boundary of a functional circuit region is designated in the drawings as "MOS area boundary." In some embodiments, a voltage VDD on the VDD power rail 1001 is VVDD or a voltage derived from VVDD. In at least one embodiment, when a header circuit is switched OFF and VVDD is removed, VDD is also removed from the corresponding VDD power rail which becomes floating. In some embodiments, a voltage VSS on the VSS power rail 1002 is VVSS or is derived from VVSS. In at least one embodiment, when a footer circuit is switched OFF and VVSS is removed, VSS is also removed from the corresponding VSS power rail which becomes floating. In at least one embodiment, the VDD power rail 1001 is on the same M0 track as and is continuous to a VVDD power rail, and/or the VSS power rail 1002 is on the same M0 track as and is disconnected from a TVDD power rail, as described with respect to FIG. 5B.

The functional circuit region 1003 includes active regions OD11, OD12, and has a cell height H. One of the active regions OD11, OD12 is a P-type active region, and the other is an N-type active region. For example, the active region OD11 is a PMOS active region, and the active region OD12 is an NMOS active region. The described active region configuration, as well as the cell height H of the functional circuit region 1003, are examples. Other configurations are within the scopes of various embodiments. In some embodiments, the functional circuit region 1004 is similar to the functional circuit region 1003 in terms of active region configuration and cell height. In the example configuration in FIG. 10A, the functional circuit regions 1003, 1004 have the same width W_mos along the X-axis. In at least one embodiment, the functional circuit regions 1003, 1004 have different widths along the X-axis. In some embodiments, the functional circuit regions 1003, 1004 are configured to form different functional circuits with different operations and/or functions. In some embodiments, the width W_mos is from 1 CPP to 100 CPPs, and is determined by one or more factors discussed with respect to the width W_pmos.

An M0 layer in the layout diagram 1000A comprises the power rails 1001, 1002, and M0 conductive patterns (or jogs) 1007, 1009. The M0 conductive pattern 1007 projects along the Y-axis from the power rails 1001 toward, but without reaching, the power rail 1002. The M0 conductive pattern 1009 projects along the Y-axis from the power rails 1002 toward, but without reaching, the power rail 1001. A BM0 layer in the layout diagram 1000A comprises BM0 power rails (i.e., back side power rails) and BM0 conductive patterns (or jogs) which overlap and have the same pattern or configuration as the M0 power rails 1001, 1002 and M0 conductive patterns 1007, 1009, in a manner similar to that described with respect to FIG. 4B. The layout diagram 1000A further comprises FTV structures 1008, 1010 correspondingly coupling the M0 conductive patterns 1007, 1009 to the underlying BM0 conductive patterns (not shown). Each of the FTV cells 1005, 1006 comprises the corresponding M0 conductive pattern (or jog) 1007, 1009, the corresponding FTV 1008, 1010, and the corresponding BM0 conductive pattern (not shown).

In some embodiments, the FTV cells 1005, 1006 have the same configuration, and are different in their connections to corresponding VDD and VSS power rails. In at least one embodiment, an FTV cell is stored in a cell library, and depending on where the FTV cell is placed in a layout diagram, i.e., depending on which type of power rail, VDD or VSS, the FTV cell is coupled to, the placed FTV cell correspondingly becomes a VDD FTV cell (e.g., the FTV cell 1005) or a VSS FTV cell (e.g., the FTV cell 1006). In some embodiments, at least one of the FTV cells 1005, 1006 has the same configuration as at least one of the FTV cells 511-514.

In some embodiments, VDD is provided on the back side. For example, VDD is provided from a header circuit in a switched ON state to the BM0 power rail underlying the VDD power rail 1001, then to the BM0 conductive pattern underlying the M0 conductive pattern 1007, then to the FTV 1008, then to the M0 conductive pattern 1007 on the front side, then to the VDD power rail 1001 from which VDD is supplied to one or more functional circuits in the functional circuit regions 1003, 1005.

In some embodiments, VDD is provided on the front side. For example, VDD is provided from a header circuit in a switched ON state to the VDD power rail 1001, and then to one or more functional circuits in the functional circuit regions 1003, 1005. VDD is further provided from the VDD power rail 1001, through the FTV 1008, to the BM0 power rail underlying the VDD power rail 1001 on the back side for further distribution to other circuits.

In some embodiments, when a footer circuit is switched ON, VSS is provided on the back side or on the front side, and then further distributed in a manner similar to that described with respect to VDD. In at least one embodiment, one or more advantages described herein are achievable by the layout diagram 1000A, and/or an IC device corresponding to the layout diagram 1000A.

Figure 10B:
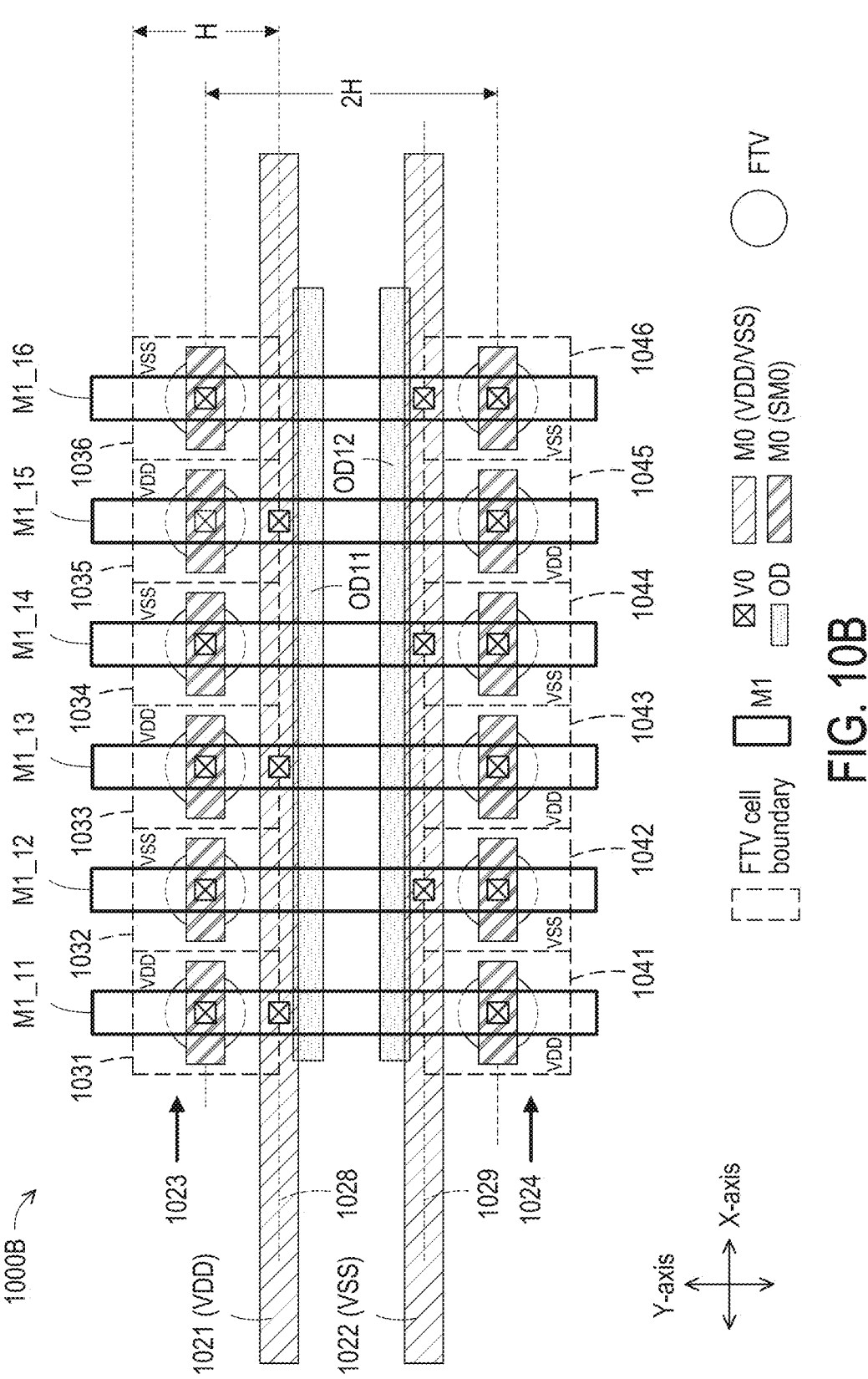

FIG. 10B is a schematic view of a layout diagram 1000B of an IC device, in accordance with some embodiments. In some embodiments, the layout diagram 1000B is stored on a non-transitory computer-readable medium. In at least one embodiment, the layout diagram 1000B corresponds to one or more of the IC devices 100, 200, 600B described herein.

The layout diagram 1000B comprises a functional circuit region corresponding to the functional circuit regions 1003, 1004 and including the active regions OD11, OD12. For simplicity, the boundary of the functional circuit region is not illustrated in FIG. 10B. The layout diagram 1000B further comprises, in the M0 layer, a VDD power rail 1021 and a VSS power rail 1022, and, in the BM0 layer, a BM0 VDD power rail underlying the VDD power rail 1021 and a BM0 VSS power rail underlying the VSS power rail 1022. The layout diagram 1000B further comprises a first row 1023 of FTV cells 1031-1036 placed along the VDD power rail 1021 and in abutment with a top edge 1028 of the functional circuit region, and a second row 1024 of FTV cells 1041-1046 placed along the VSS power rail 1022 and in abutment with a bottom edge 1029 of the functional circuit region. In at least one embodiment, the edges 1028, 1029 are M0 tracks. In some embodiments, each of the FTV cells 1031-1036, 1041-1046 has the configuration described with respect to FIG. 6D.

The layout diagram 1000B further comprises M1 conductive patterns M1_11, M1_12, . . . M1_16, and various V0 vias which couple the M1 conductive patterns M1_11, M1_12, . . . M1_16 to the power rails 1021, 1022 and SM0 conductive patterns in the FTV cells 1031-1036, 1041-1046 in a manner similar to that described with respect to FIG. 6A. The layout diagram 1000B further comprises, on the back side, corresponding BM1 conductive patterns, BV0 vias, BSM0 conductive patterns, BM0 power rails, as described with respect to FIG. 6A.

In some embodiments, VDD is provided on the back side when a header circuit is switched ON. VDD is then supplied from the back side to the VDD power rail 1021 on the front side in a manner similar to that described with respect to the first and second portions of the power delivery path in the IC device 600B (i.e., as described with respect to the part on the right of the transistor P61 in FIG. 6B).

In some embodiments, VDD is provided on the VDD power rail 1021 at the front side when a header circuit is switched ON. VDD is then supplied from the front side to the back side for further distribution to other circuits, in a manner similar to that described with respect to the fourth and fifth portions of the power delivery path in the IC device 600B (i.e., as described with respect to the part on the left of the transistor P61 in FIG. 6B).

In some embodiments, when a footer circuit is switched ON, VSS is provided on the back side or on the front side, and then further distributed in a manner similar to that described with respect to VDD. In at least one embodiment, because the layout diagram 1000B includes multiple FTVs, the resistance of the power delivery path between the back side power rails and the front side power rails is reduced, resulting in improved performance. This advantage is also achievable in one or more embodiments described with respect to the layout diagrams 600A, 600C. In at least one embodiment, one or more advantages described herein are achievable by the layout diagram 1000B, and/or an IC device corresponding to the layout diagram 1000B.

Figure 10C:
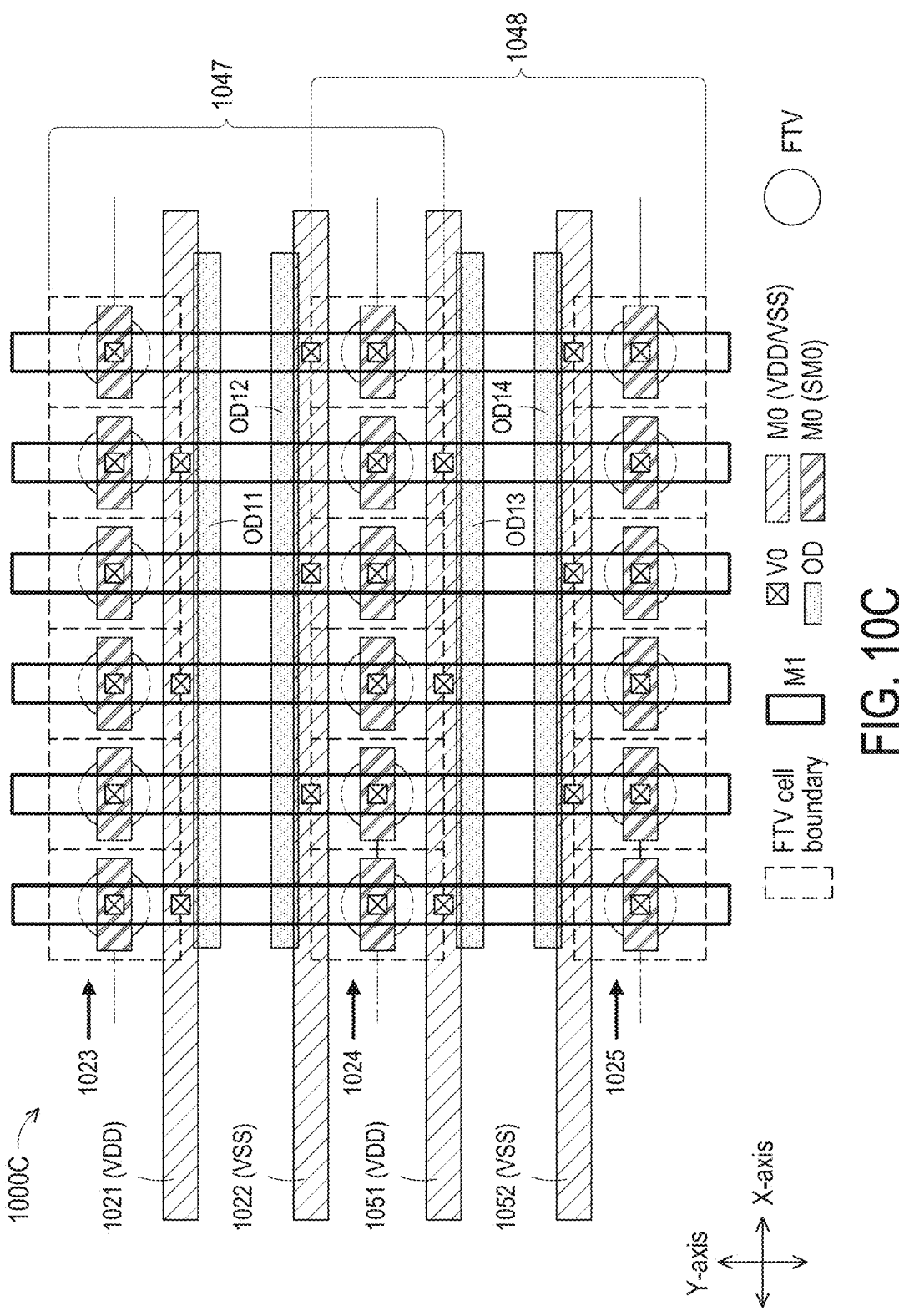

FIG. 10C is a schematic view of a layout diagram 1000C of an IC device, in accordance with some embodiments. In some embodiments, the layout diagram 1000C is stored on a non-transitory computer-readable medium. In at least one embodiment, the layout diagram 1000C corresponds to one or more of the IC devices 100, 200, 600B described herein.

The layout diagram 1000C comprises first and second units 1047, 1048 each corresponding to the layout diagram 1000B in FIG. 10B. Specifically, the first unit 1047 comprises the first row 1023 and second row 1024 of FTV cells, the functional circuit region including the active regions OD11, OD12, the VDD power rail 1021 and the VSS power rail 1022. The second unit 1048 shares the second row 1024 of FTV cells with the first unit 1047. The second unit 1048 further comprises a third row 1025 of FTV cells, a further functional circuit region including active regions OD13, OD14, a VDD power rail 1051, and a VSS power rail 1052. In the second unit 1048, the second row 1024 and third row 1025 of FTV cells, the active regions OD13, OD14, the VDD power rail 1051 and the VSS power rail 1052 correspond to the first row 1023 and second row 1024 of FTV cells in the unit 1047, the active regions OD11, OD12, the VDD power rail 1021 and the VSS power rail 1022. In some embodiments, one or more additional units similar to the first or second unit 1047, 1048 are added, along the Y-axis, at the top or bottom of the layout diagram 1000C in the described manner, i.e., two adjacent units share a row of FTV cells. VDD and VSS are supplied from the front side to the back side, or from the back side to the front side as described with respect to FIG. 10B. In at least one embodiment, one or more advantages described herein are achievable by the layout diagram 1000C, and/or an IC device corresponding to the layout diagram 1000C.

Figure 10D:
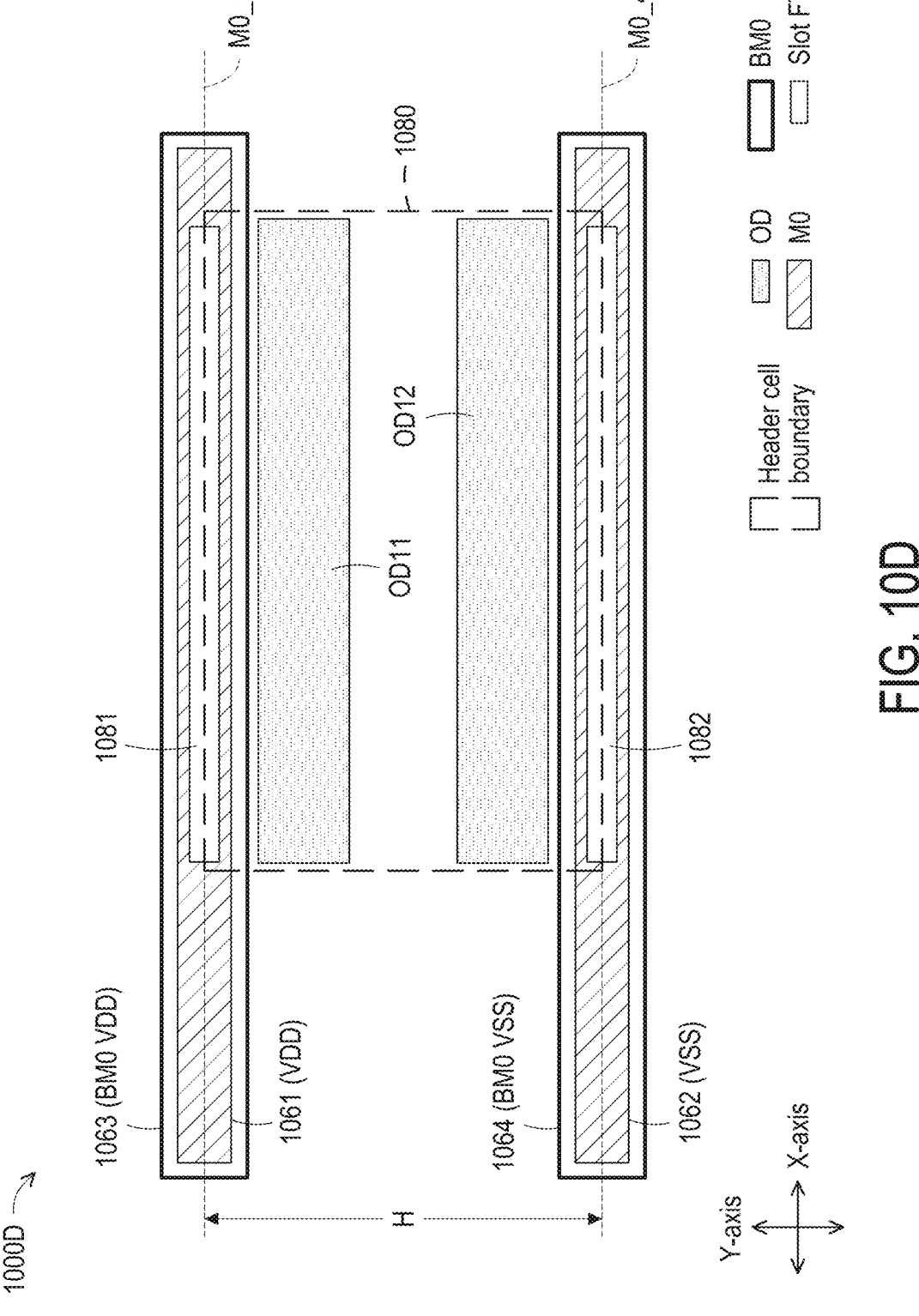

FIG. 10D is a schematic view of a layout diagram 1000D of an IC device, in accordance with some embodiments. In some embodiments, the layout diagram 1000D is stored on a non-transitory computer-readable medium. In at least one embodiment, the layout diagram 1000D corresponds to one or more of the IC devices 100, 200, 300 described herein.

The layout diagram 1000D comprises a functional circuit region 1080 corresponding to the functional circuit regions 1003, 1004 and including the active regions OD11, OD12. The layout diagram 1000D further comprises, in an M0 layer, a VDD power rail 1061 and a VSS power rail 1062. A BM0 layer in the layout diagram 1000D comprises BM0 VDD power rail 1063 and BM0 VSS power rail 1064. The BM0 power rails 1063, 1064 on the back side are correspondingly under and wider than the power rails 1061, 1062 on the front side. The layout diagram 1000D further comprises slot FTVs 1081, 1082 continuously extending along the X-axis, over substantially the whole width of the functional circuit region 1080. The slot FTVs 1081, 1082 correspondingly couple the BM0 power rails 1063, 1064 on the back side to the power rails 1061, 1062 on the front side, in a manner similar to that described with respect to FIG. 9.

In some embodiments, VDD is provided on the back side when a header circuit is switched ON. VDD is then supplied from the BM0 VDD power rail 1063 on the back side to the VDD power rail 1061 on the front side through the slot FTV 1081, to power one or more functional circuits in the functional circuit region 1080.

In some embodiments, VDD is provided on the VDD power rail 1061 at the front side when a header circuit is switched ON. VDD on the VDD power rail 1061 provides power supply for one or more functional circuits in the functional circuit region 1080. VDD is further supplied from the VDD power rail 1061 on the front side, through the slot FTV 1081, to the BM0 VDD power rail 1063 on the back side for further distribution to other circuits.

In some embodiments, when a footer circuit is switched ON, VSS is provided on the back side or on the front side, and then further distributed in a manner similar to that described with respect to VDD. In at least one embodiment, one or more advantages described herein are achievable by the layout diagram 1000D, and/or an IC device corresponding to the layout diagram 1000D.

FIGS. 11A-11D are schematic cross-sectional views of an IC device 1100 at various stages in a manufacturing process, in accordance with some embodiments. In some embodiments, the IC device 1100 corresponds to the IC device 300. Various IC devices or structures in an IC device as described with respect to one or more of FIGS. 5C-5E, 6D are manufactured in similar processes. Components of the IC device 1100 having corresponding components in the IC device 300 are designated by the same reference numerals.

Figures 11A, 11B:
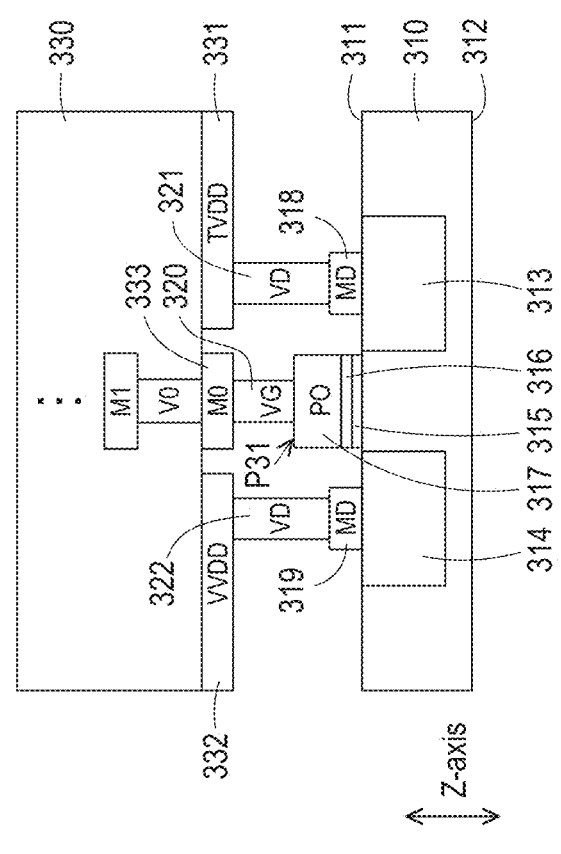
FIGS. 11A-11D are schematic cross-sectional views of an IC device at various stages in a manufacturing process, in accordance with some embodiments.

In FIG. 11A, the manufacturing process starts from a substrate 310 having opposite front side 311 and back side 312. The substrate 310 comprises, in at least one embodiment, a silicon substrate. The substrate 310 comprises, in at least one embodiment, silicon germanium (SiGe), Gallium arsenic, or other suitable semiconductor materials. In some embodiments, the substrate 310 comprises an insulating substrate or a silicon on insulator (SOI) substrate. Active regions, e.g., PMOS active regions and/or NMOS active regions, are formed in or over the front side 311 of the substrate 310, using one or more masks corresponding to one or more active regions in the layout diagrams described herein. Isolation structures (not shown) are formed in the substrate 310, e.g., by etching corresponding areas of the substrate 310 and filling the etched areas with insulating material.

Various transistors are formed over the front side 311 of the substrate 310 in a front-end-of-line (FEOL) processing. For example, at least one gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks to pattern the gate dielectric material layer and gate electrode layer into a plurality of gate structures (or gate stacks), each comprising a gate electrode, such as a gate electrode 317, and one or more underlying gate dielectric layers, such as gate dielectric layers 315, 316. The gate electrodes correspond to various gate regions described herein. In some embodiments, the patterning of the gate dielectric and gate material includes a photolithography operation.

In at least one embodiment, spacers are formed, by deposition and patterning, on opposite sides of each gate electrode. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof. Drain/sources, such as drain/sources 313, 314, are formed in the active regions of the substrate. In at least one embodiment, the drain/sources are formed by using the gate electrodes and the spacers as a mask. For example, the formation of the drain/sources is performed by an ion implantation or a diffusion process. Depending on the type of the devices or transistors, the drain/sources are doped with P-type dopants, such as boron or $BF_2$, N-type dopants, such as phosphorus or arsenic, and/or combinations thereof. As a result, transistors of both P-type and N-type are formed in one or more functional circuit regions, transistors of P-type are formed in one or more header circuit regions, and transistors of N-type are formed in one or more footer circuit regions.

MD contacts and VD/VG vias are formed over the source/drains and gate electrodes. In an example manufacturing process, a conductive layer, e.g., a metal, is deposited over the substrate with the transistors formed thereon, thereby making electrical connections to the drain/sources of the transistors. A planarizing process is performed to planarize the conductive layer, resulting in MD contacts, such as MD contacts 318, 319. Various VD vias, e.g., 321, 322, and VG vias, e.g., 320, are formed correspondingly over the MD contacts and gate electrodes. A resulting structure 1100A is obtained at the end of the FEOL processing.

In FIG. 11B, after the FEOL processing, a back-end-of-line (BEOL) processing is performed to form a redistribution structure 330 over the transistors to electrically couple various elements or circuits of the IC device 1100 with each other, and with external circuitry. In at least one embodiment, the redistribution structure 330 comprises sequentially overlying metal and via layers. The overlying metal layers and via layers correspondingly comprise metal layers M0, M1, or the like, and via layers V0, V1, or the like. For example, the formation of the M0 layer comprises depositing a metal material and patterning the deposited metal materials to form various power rails (e.g., power rails 331, 332), jogs, and/or SM0 conductive patterns in one or more header/footer circuit regions, and/or to form other M0 conductive patterns for power or signal in one or more functional circuit regions.

In at least one embodiment, the redistribution structure 330 is further manufactured sequentially layer by layer upward from the patterned M0 layer, for example, by repeatedly performing a damascene process. In such a damascene process, a dielectric layer is deposited over a patterned Mk layer (k is zero and up). The dielectric layer is patterned to form a damascene structure having underlying via holes corresponding to conductive vias of a via layer Vk to be formed later, and overlying recessed features corresponding to conductive patterns of a metal layer Mk+1 to be formed latter. An example patterning process to form the damascene structure comprises two or more photolithographic patterning and anisotropic etching steps to first form the underlying via holes, then form the overlying recessed features. A conductive material is deposited to fill in the damascene structure to obtain the conductive vias in the via layer Vk and overlying conductive patterns in the metal layer Mk+1. The described damascene process is performed one or more times to sequentially form vias and conductive patterns of higher via layers and metal layers of the redistribution structure 330 until a top metal layer is completed. A resulting structure 1100B is obtained.

Figures 11C, 11D:
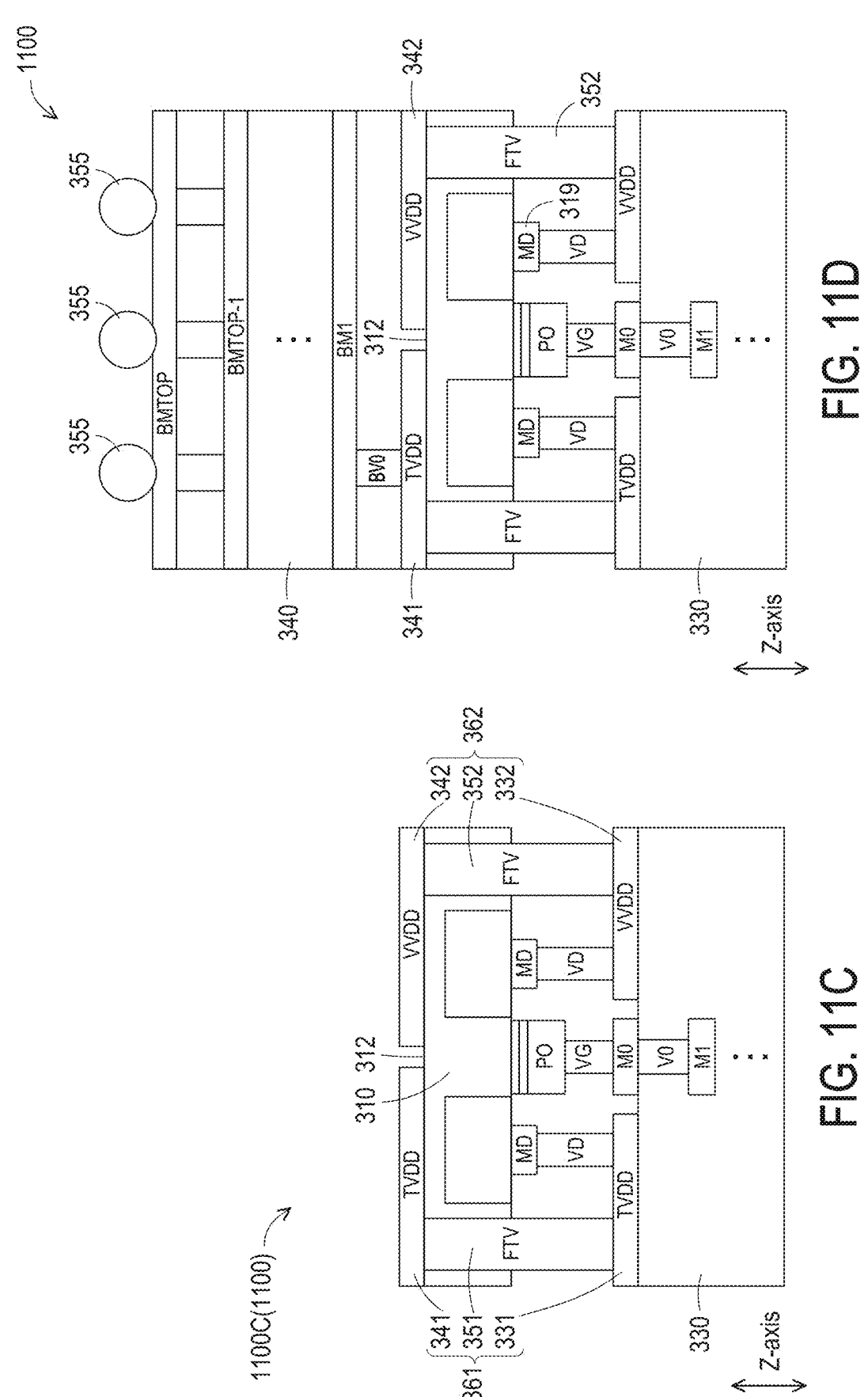

In FIG. 11C, the structure 1100B is flipped upside down and bonded to a carrier (not shown) via an adhesive to expose the back side 312 of the substrate 310. In some embodiments, a thickness portion of the substrate 310 is removed, for example, by an etch or mechanical grinding process. Via openings for FTVs are formed, e.g., by etching or laser drilling, to extend through the ground substrate 310 at various locations to expose the corresponding M0 conductive patterns, such as power rails, jogs, and/or SM0 conductive patterns. In some embodiments where the FTVs to be formed as slot FTVs, the via openings are slots formed along and exposing the corresponding M0 power rails. In some embodiments, the via openings for FTVs are formed in a damascene process which also forms, in a dielectric layer deposited over the back side 312, recessed features overlying the via openings and corresponding to various BM0 conductive patterns to be formed. A conductive material, e.g., a metal, is deposited to fill in the damascene structure to obtain FTVs (e.g., FTVs 351, 352) as well as various BM0 conductive patterns. The BM0 conductive patterns comprise BM0 power rails (e.g., BM0 power rails 341, 342), jogs and BSM0 conductive patterns in one or more header/footer circuit regions, and/or other BM0 conductive patterns for power or signal in one or more functional circuit regions. A resulting structure 1100C including FTV structures 361, 362 correspondingly coupled to front side TVDD, VVDD power rails is obtained.

In FIG. 11D, the described damascene process is performed one or more times to sequentially form vias and conductive patterns of higher back side via layers (e.g., BV0, BV1, or the like) and back side metal layers (e.g., BM1, or the like) of the back side redistribution structure 340, until a top back side metal layer (e.g., BMTOP) is completed. The back side redistribution structure 340 comprises back side TVDD, VVDD power rails correspondingly coupled to the FTV structures 361, 362. Upon completion of the back side metallization process, solder bumps 355 are bonded over corresponding BMTOP conductive patterns to provide power and/or signal inputs and/or outputs for the IC device 1100. The manufacturing process of the IC device 1100 is completed. Other structures for mounting and providing input/outputs for the IC device 1100 are within the scopes of various embodiments. In some embodiments, solder bumps (or other mounting structures) are provided on the back side, but not on the front side of the IC device 1100. In at least one embodiment, one or more advantages described herein are achievable by IC devices manufactured by the process described with respect to FIGS. 11A-11D.

Figure 12A:
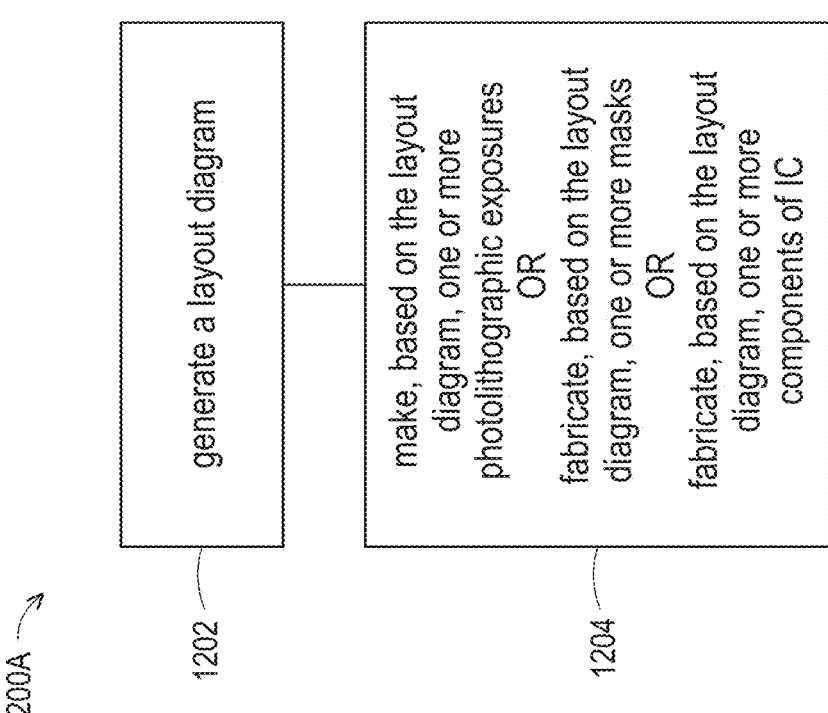

FIG. 12A is a flowchart of a method 1200A of generating a layout and using the layout to manufacture an IC device, in accordance with some embodiments.

Method 1200A is implementable, for example, using EDA system 1300 (FIG. 13, discussed below) and an integrated circuit (IC) manufacturing system 1400 (FIG. 14, discussed below), in accordance with some embodiments. Regarding method 1200A, examples of the layout include the layouts disclosed herein, or the like. Examples of an IC device to be manufactured according to method 1200A include the IC devices disclosed herein. In FIG. 12A, method 1200A includes operations 1202, 1204.

At operation 1202, a layout is generated which, among other things, include patterns represent one or more circuit regions as described with respect to one or more of FIGS. 4A-4B, 5A-5B, 6A, 6C, 7-9, 10A-10D, or the like. From operation 1202, flow proceeds to operation 1204.

At operation 1204, based on the layout, at least one of (A) one or more photolithographic exposures are made or (B) one or more semiconductor masks are fabricated or (C) one or more components in a layer of an IC device are fabricated.

Figure 12B:
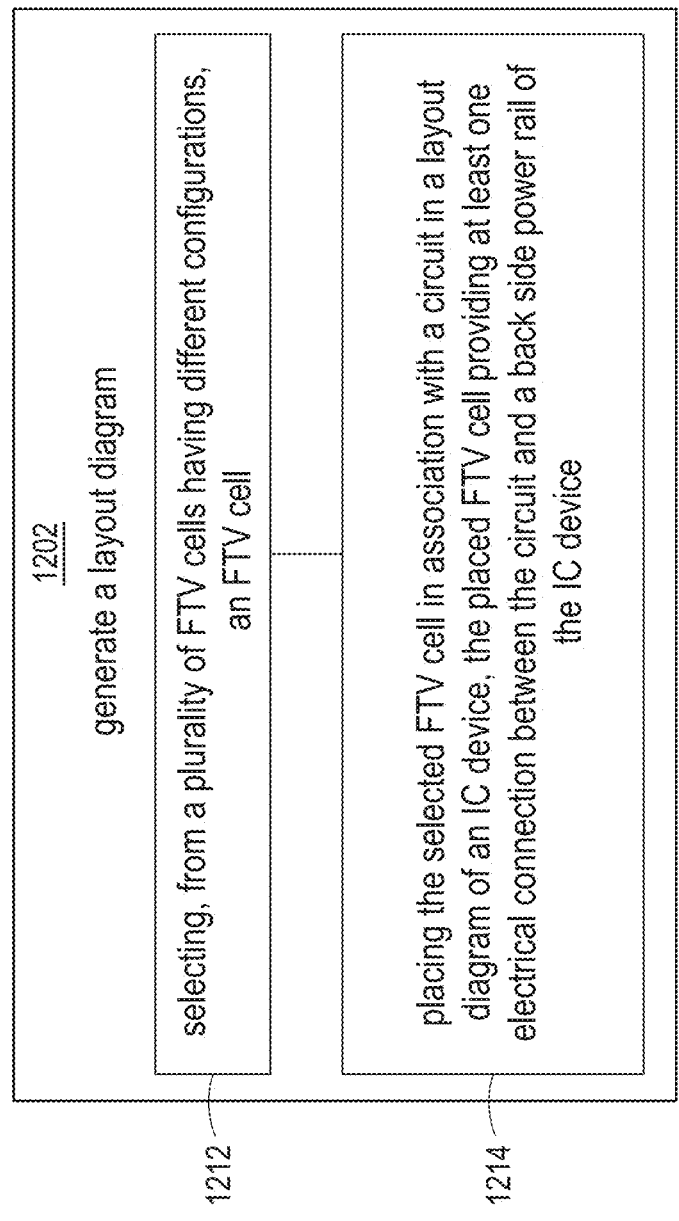

FIG. 12B is a flowchart of a method 1200B of generating a layout, in accordance with some embodiments. More particularly, the flowchart of FIG. 12B shows additional operations that demonstrates one example of procedures implementable in operation 1202 of FIG. 12A, in accordance with one or more embodiments. In FIG. 12B, operation 1202 includes operations 1212, 1214.

At operation 1212, an FTV cell is selected from a plurality of FTV cells having different configurations. In some embodiments, the FTV cells having different configurations include, but are not limited to, one or more of FTV cells 411-414, one or more of FTV cells 511-514, one or more of FTV cells 611-616, 621-626, one or more of FTV cells 711-714, one or more of FTV cells 811-814, or the like. In at least one embodiment, the FTV cells having different configurations are included in a cell library for selection by a user and/or by a processor, e.g., a processor of an EDA system as described herein. One or more criteria for selecting an FTV cell from the FTV cells having different configurations are described herein and include, but are not limited to, design rules, power requirements of the IC device being designed, resistance, a balanced consideration between performance and area cost, or the like.

At operation 1214, the selected FTV cell is placed in association with a circuit in a layout diagram of an IC device. The placed FTV cell provides at least one electrical connection between the circuit and a back side power rail of the IC device. In some embodiments, the selected FTV cell is placed in a layout diagram by an EDA system performing a placement and routing operation. In at least one embodiment, the circuit associated with the selected FTV cell is a power control circuit, e.g., a header circuit, as described with respect to FIGS. 1-9. In at least one embodiment, the circuit associated with the selected FTV cell is a functional circuit, as described with respect to FIGS. 10A-10D. In some embodiments, multiple instances of the selected FTV cell are placed in association with the circuit, to provide various electrical connections from the circuit to the back side power rail, e.g., as described with respect to FIGS. 4A, 4B, 5A, 6A, 6C, 10A, 10B, 10C. In some embodiments, several FTV cells of different configurations are selected and placed in the layout diagram of the IC device, e.g., as described with respect to FIGS. 7-8. In at least one embodiment, one or more advantages described herein are achievable by a layout diagram generated by the method 1200B, and/or by an IC device corresponding to the generated layout diagram.

FIG. 12C is a flowchart of a method 1200C of fabricating one or more components of an IC device, based on the layout, in accordance with some embodiments. More particularly, the flowchart of FIG. 12C shows additional operations that demonstrates one example of procedures implementable in operation 1204 of FIG. 12A, in accordance with one or more embodiments. In FIG. 12C, operation 1204 includes operations 1222, 1224.

At operation 1222, in an FEOL processing, a plurality of transistors of a circuit region is formed over a substrate, for example, as described with respect to FIG. 11A. In some embodiments, the circuit region comprises is a power control circuit region, e.g., a header circuit region or a footer circuit region. In at least one embodiment, the circuit region comprises a functional circuit region.

At operation 1224, in a BEOL processing, a front side redistribution structure is fabricated on a front side of the substrate, an FTV structure is formed to extend through the substrate and coupled to a front side power rail of the front side redistribution structure, and a back side redistribution structure is fabricated on a back side of the substrate to include a back side power rail coupled to the FTV structure.

For example, after the FEOL processing, a back-end-of-line (BEOL) processing comprises fabricating a front side redistribution structure 330, e.g., by repeatedly performing a damascene process, as described with respect to FIG. 11B. The BEOL processing further comprises forming an FTV structure, e.g., 361, 362, extending through the substrate and coupled to a front side power rail, e.g., front side TVDD or VVDD power rail, of the front side redistribution structure 330, as described with respect to FIG. 11C. The BEOL processing further comprises fabricating a back side redistribution structure 340, e.g., by repeatedly performing a damascene process, as described with respect to FIG. 11D. The fabricated back side redistribution structure 340 comprises a back side TVDD or VVDD power rail coupled to the FTV structure, e.g., 361 or 362. In at least one embodiment, one or more advantages described herein are achievable by an IC device manufactured in accordance with the method 1200C.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 13:
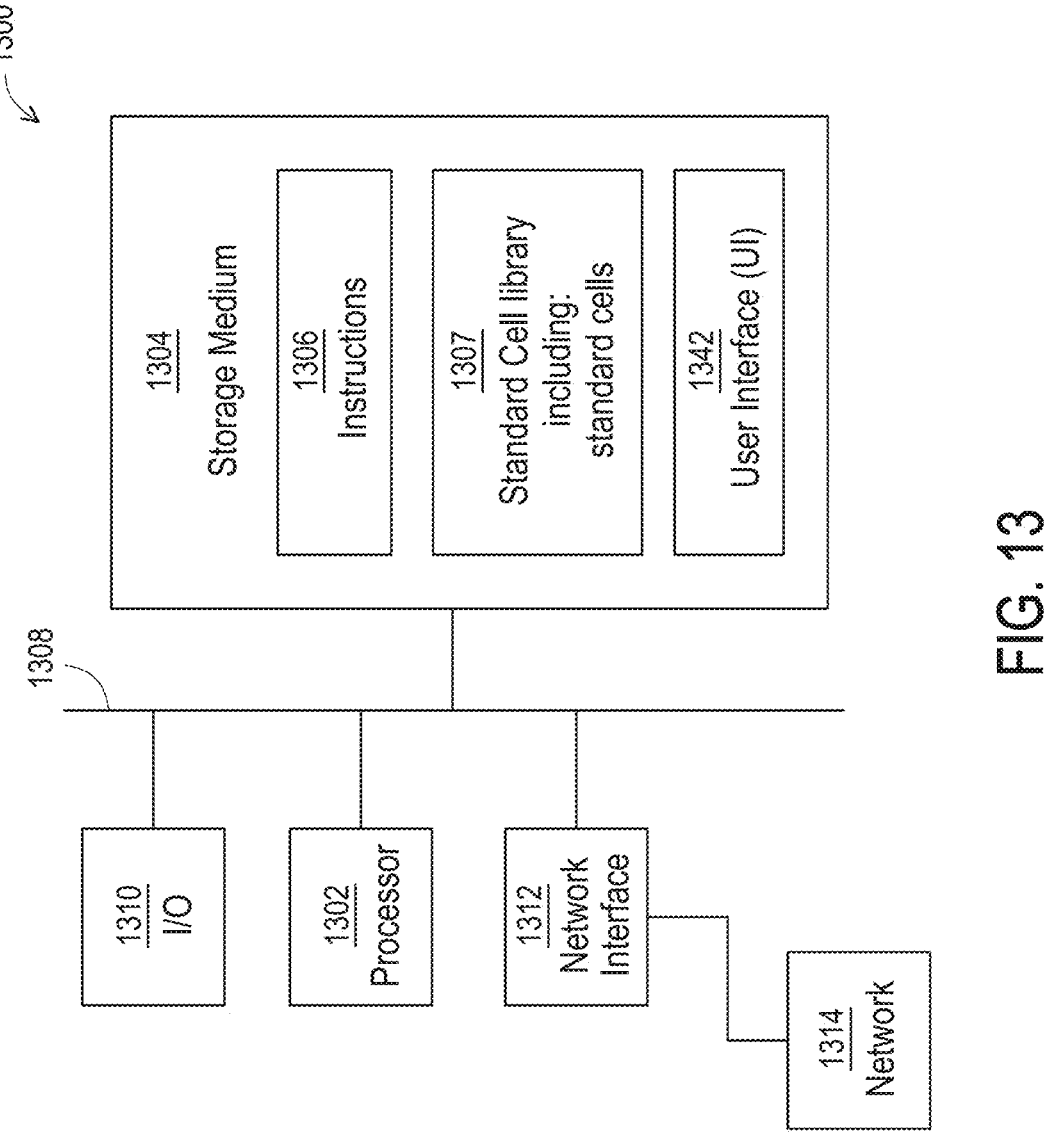
FIG. 13 is a block diagram of an electronic design automation (EDA) system in accordance with some embodiments.

FIG. 13 is a block diagram of an electronic design automation (EDA) system 1300 in accordance with some embodiments.

In some embodiments, EDA system 1300 includes an APR system. Methods described herein of designing layout diagrams represent wire routing arrangements, in accordance with one or more embodiments, are implementable, for example, using EDA system 1300, in accordance with some embodiments.

In some embodiments, EDA system 1300 is a general purpose computing device including a hardware processor 1302 and a non-transitory, computer-readable storage medium 1304. Storage medium 1304, amongst other things, is encoded with, i.e., stores, computer program code 1306, i.e., a set of executable instructions. Execution of instructions 1306 by hardware processor 1302 represents (at least in part) an EDA tool which implements a portion or all of the methods described herein in accordance with one or more embodiments (hereinafter, the noted processes and/or methods).

Processor 1302 is electrically coupled to computer-readable storage medium 1304 via a bus 1308. Processor 1302 is also electrically coupled to an I/O interface 1310 by bus 1308. A network interface 1312 is also electrically connected to processor 1302 via bus 1308. Network interface 1312 is connected to a network 1314, so that processor 1302 and computer-readable storage medium 1304 are capable of connecting to external elements via network 1314. Processor 1302 is configured to execute computer program code 1306 encoded in computer-readable storage medium 1304 in order to cause system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electro-magnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores library 1307 of standard cells including such standard cells as disclosed herein.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1312 coupled to processor 1302. Network interface 1312 allows system 1300 to communicate with network 1314, to which one or more other computer systems are connected. Network interface 1312 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1300.

System 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a UI through I/O interface 1310. The information is stored in computer-readable medium 1304 as user interface (UI) 1342.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1300. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 14:
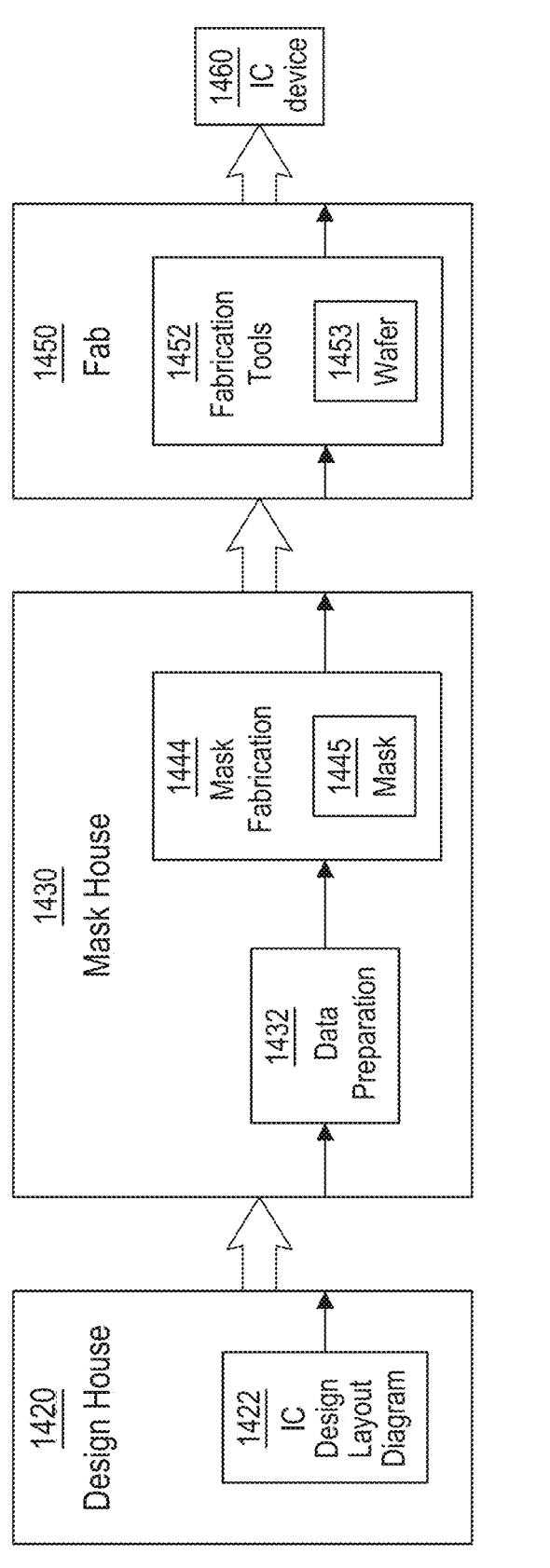
FIG. 14 is a block diagram of an IC device manufacturing system, and an IC manufacturing flow associated therewith, in accordance with some embodiments.

FIG. 14 is a block diagram of an integrated circuit (IC) manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single larger company. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns designed for an IC device 1460. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, metal lines or vias of an inter-layer interconnection, and openings for bonding pads, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place-and-route operation. IC design layout diagram 1422 is presented in one or more data files having information of the geometrical patterns. For example, IC design layout diagram 1422 can be expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The design layout diagram 1422 is manipulated by mask data preparation 1432 to comply with particular characteristics of the mask writer and/or requirements of IC fab 1450. In FIG. 14, mask data preparation 1432 and mask fabrication 1444 are illustrated as separate elements. In some embodiments, mask data preparation 1432 and mask fabrication 1444 can be collectively referred to as mask data preparation.

In some embodiments, mask data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, mask data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, mask data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of mask data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After mask data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1445 includes a transparent substrate (e.g., fused quartz) and an opaque material (e.g., chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 includes fabrication tools 1452 configured to execute various manufacturing operations on semiconductor wafer 1453 such that IC device 1460 is fabricated in accordance with the mask(s), e.g., mask 1445. In various embodiments, fabrication tools 1452 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

Details regarding an integrated circuit (IC) manufacturing system (e.g., system 1400 of FIG. 14), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises a substrate comprising a power control circuit and having opposite front and back sides, a front side metal layer, a back side metal layer, a first feed through via (FTV), and a second FTV. The front side metal layer is on the front side of the substrate, and comprises a first front side power rail, and a second front side power rail. The back side metal layer is on the back side of the substrate, and comprises a first back side power rail, and a second back side power rail. The first FTV extends through the substrate, and couples the first front side power rail to the first back side power rail. The second FTV extends through the substrate, and couples the second front side power rail to the second back side power rail. The power control circuit is coupled to the first and second front side power rails, and is controllable to electrically connect the first front side power rail to the second front side power rail, or electrically disconnect the first front side power rail from the second front side power rail.

In some embodiments, a method of manufacturing an integrated circuit (IC) device comprises fabricating a circuit over a substrate having opposite front and back sides. The method further comprises fabricating a front side redistribution structure over the front side of the substrate. The front side redistribution structure comprises first and second front side power rails extending along a first axis, and coupled to the circuit, a first conductive pattern projecting from the first front side power rail along a second axis transverse to the first axis, and a second conductive pattern projecting from the second front side power rail along the second axis. The method further comprises fabricating a plurality of feed through vias (FTVs) extending through the substrate. The plurality of FTVs comprises a first FTV coupled to the first conductive pattern, and a second FTV coupled to the second conductive pattern. The method further comprises fabricating a back side redistribution structure over the back side of the substrate. The back side redistribution structure comprises a first back side power rail coupled to the first FTV, and a second back side power rail coupled to the second FTV.

In some embodiments, an integrated circuit (IC) device comprises a substrate comprising a circuit and having opposite front and back sides, first and second back side power rails on the back side of the substrate, first and second front side power rails on the front side of the substrate and coupled to the circuit, and a plurality of feed through via (FTV) structures. Each FTV structure comprises a front side conductive pattern on the front side of the substrate, a back side conductive pattern on the back side of the substrate, and an FTV extending through the substrate, and coupling the front side conductive pattern and the back side conductive pattern. The plurality of FTV structures comprises: at least one first FTV structure having the front side conductive pattern coupled to the first front side power rail, and the back side conductive pattern coupled to the first back side power rail, and at least one second FTV structure having the front side conductive pattern coupled to the second front side power rail, and the back side conductive pattern coupled to the second back side power rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope.

What is claimed is:

1. An integrated circuit (IC) device, comprising:
    a substrate comprising a power control circuit, and having opposite front and back sides;
    a front side metal layer on the front side of the substrate, and comprising:
       a first front side power rail, and
       a second front side power rail;
    a back side metal layer on the back side of the substrate, and comprising:
       a first back side power rail, and
       a second back side power rail;
    a first feed through via (FTV) extending through the substrate, and coupling the first front side power rail to the first back side power rail; and
    a second FTV extending through the substrate, and coupling the second front side power rail to the second back side power rail,
    wherein
    the power control circuit is coupled to the first and second front side power rails, and is controllable to:
       electrically connect the first front side power rail to the second front side power rail, or
       electrically disconnect the first front side power rail from the second front side power rail,
    the first front side power rail and the second front side power rail extend along a first axis,
    the first back side power rail and the second back side power rail extend along the first axis, the back side metal layer further comprises:

a conductive pattern projecting from the first back side power rail along a second axis transverse to the first axis, and the first FTV couples the conductive pattern of the back side metal layer to the first front side power rail of the front side metal layer.

2. The IC device of claim 1, wherein the power control circuit is a header circuit comprising a P-type transistor, and the P-type transistor comprises:

a first source/drain coupled to the first front side power rail, and a second source/drain coupled to the second front side power rail.

3. The IC device of claim 1, wherein the power control circuit is a footer circuit comprising an N-type transistor, and the N-type transistor comprises:

a first source/drain coupled to the first front side power rail, and a second source/drain coupled to the second front side power rail.

4. The IC device of claim 1, further comprising:

a functional circuit on the front side of the substrate, and coupled to at least one of the second front side power rail or the second back side power rail, wherein in response to the power control circuit being in a switched-ON state in which the power control circuit electrically connects the first front side power rail to the second front side power rail, the functional circuit is operable by a power supply voltage supplied to the at least one of the second front side power rail or the second back side power rail from the first back side power rail, and in response to the power control circuit being in a switched-OFF state in which the power control circuit electrically disconnects the first front side power rail from the second front side power rail, the functional circuit is disabled, and the second front side power rail and the second back side power rail are floating.

5. The IC device of claim 1, wherein the front side metal layer further comprises:

a first conductive pattern projecting from the first front side power rail along the second axis transverse to the first axis, and a second conductive pattern projecting from the second front side power rail along the second axis, the first FTV couples the conductive pattern, which projects from the first back side power rail, to the first conductive pattern, and the second FTV couples the second back side power rail to the second conductive pattern.

6. The IC device of claim 5, wherein the back side metal layer further comprises:

a further conductive pattern projecting from the second back side power rail along the second axis, and the second FTV couples the second conductive pattern on the front side metal layer to the further conductive pattern on the back side metal layer.

7. The IC device of claim 5, wherein the first conductive pattern projects from the first front side power rail along the second axis toward the second front side power rail, and the second conductive pattern projects from the second front side power rail along the second axis toward the first front side power rail.

8. The IC device of claim 7, wherein the front side metal layer further comprises:

a third front side power rail extending along the first axis and electrically connected to the second front side power rail, wherein, along the second axis, the first front side power rail is between the second and third front side power rails, a third conductive pattern projecting from the third front side power rail along the second axis toward the first front side power rail, and a fourth conductive pattern projecting from the first front side power rail along the second axis toward the third front side power rail, the back side metal layer further comprises:

a third back side power rail extending along the first axis and electrically connected to the second back side power rail, wherein, along the second axis, the first back side power rail is between the second and third back side power rails, and the IC device further comprises:

a third FTV extending through the substrate, and coupling the third back side power rail to the third conductive pattern on the front side metal layer, and a fourth FTV extending through the substrate, and coupling the first back side power rail to the fourth conductive pattern on the front side metal layer.

9. The IC device of claim 8, wherein the substrate further comprises a further power control circuit, the further power control circuit is coupled to the first, second and third front side power rails, and is controllable to electrically connect the first front side power rail to the second and third front side power rails, or electrically disconnect the first front side power rail from the second and third front side power rails, and along the first axis, the power control circuit is between (i) the first and third conductive patterns on one side and (ii) the second and fourth conductive patterns on another side, and the first and third conductive patterns are between the power control circuit and the further power control circuit.

10. The IC device of claim 1, wherein the front side metal layer further comprises:

a third front side power rail extending along the first axis, wherein, along the second axis transverse to the first axis, the first front side power rail is between the second and third front side power rails, and a first conductive pattern extending along the second axis, and coupling the second and third front side power rails.

11. The IC device of claim 10, wherein the front side metal layer further comprises:

a second conductive pattern projecting from an end of the first front side power rail along the second axis toward the second and third front side power rails, and the first front side power rail extends along the first axis from the second conductive pattern away from the first conductive pattern.

12. The IC device of claim 1, wherein the front side metal layer further comprises:

a third front side power rail extending along the first axis, wherein, along the second axis transverse to the first axis, the first front side power rail is between the second and third front side power rails,
a first conductive pattern projecting from the first front side power rail along the second axis toward the second and third front side power rails,
a second conductive pattern projecting from the second front side power rail along the second axis toward the first and third front side power rails, and
a third conductive pattern projecting from the third front side power rail along the second axis toward the first and second front side power rails,
the back side metal layer further comprises:
a third back side power rail extending along the first axis, wherein, along the second axis, the first back side power rail is between the second and third back side power rails, and
the IC device further comprises a third FTV coupling the third conductive pattern to the third back side power rail.

13. An integrated circuit (IC) device, comprising:
a substrate comprising a circuit, and having opposite front and back sides;
first and second back side power rails on the back side of the substrate;
first and second front side power rails extending along a first axis on the front side of the substrate, and coupled to the circuit; and
a plurality of feed through via (FTV) structures each comprising:
a front side conductive pattern on the front side of the substrate,
a back side conductive pattern on the back side of the substrate, and
an FTV extending through the substrate, and coupling the front side conductive pattern and the back side conductive pattern,
wherein
the plurality of FTV structures comprises:
multiple first FTV structures each having the front side conductive pattern coupled to the first front side power rail, and the back side conductive pattern coupled to the first back side power rail, and
multiple second FTV structures each having the front side conductive pattern coupled to the second front side power rail, and the back side conductive pattern coupled to the second back side power rail,
the multiple first FTV structures and the multiple second FTV structures are arranged alternatingly along the first axis, and the multiple first FTV structures overlap the multiple second FTV structures along the first axis,
the plurality of FTV structures further comprises:
multiple third FTV structures each having the front side conductive pattern coupled to the first front side power rail, and the back side conductive pattern coupled to the first back side power rail, and
multiple fourth FTV structures each having the front side conductive pattern coupled to the second front side power rail, and the back side conductive pattern coupled to the second back side power rail,
the multiple third FTV structures and the multiple fourth FTV structures are arranged alternatingly along the first axis, and the multiple third FTV structures overlap the multiple fourth FTV structures along the first axis, and
along a second axis transverse to the first axis, the first and second front side power rails are arranged between (i) the multiple first FTV structures and the multiple second FTV structures on one side and (ii) the multiple third FTV structures and the multiple fourth FTV structures on another side.

14. The IC device of claim 13, wherein
the multiple first FTV structures, the multiple second FTV structures, the first and second back side power rails, and the first and second front side power rails are all configured to carry a same power supply voltage.

15. The IC device of claim 13, wherein
the multiple first FTV structures, the first back side power rail, and the first front side power rail are configured to carry a first power supply voltage, and
the multiple second FTV structures, the second back side power rail, and the second front side power rail are configured to carry a second power supply voltage different from the first power supply voltage.

16. The IC device of claim 13, wherein
the circuit is a power control circuit controllable to:
electrically connect the first front side power rail to the second front side power rail, or
electrically disconnect the first front side power rail from the second front side power rail.

17. The IC device of claim 16, wherein
the power control circuit is a header circuit comprising a P-type transistor, and
the P-type transistor comprises:
a first source/drain coupled to the first front side power rail, and
a second source/drain coupled to the second front side power rail.

18. The IC device of claim 16, wherein
the power control circuit is a footer circuit comprising an N-type transistor, and
the N-type transistor comprises:
a first source/drain coupled to the first front side power rail, and
a second source/drain coupled to the second front side power rail.

19. The IC device of claim 13, wherein
the circuit is a functional circuit.

20. An integrated circuit (IC) device, comprising:
a substrate comprising a circuit, and having opposite front and back sides;
first and second back side power rails on the back side of the substrate;
first and second front side power rails extending along a first axis on the front side of the substrate, and coupled to the circuit; and
a plurality of feed through via (FTV) structures each comprising:
a front side conductive pattern on the front side of the substrate,
a back side conductive pattern on the back side of the substrate, and
an FTV extending through the substrate, and coupling the front side conductive pattern and the back side conductive pattern,
wherein
the plurality of FTV structures comprises:
multiple first FTV structures each having the front side conductive pattern coupled to the first front side power rail, and the back side conductive pattern coupled to the first back side power rail, and
multiple second FTV structures each having the front side conductive pattern coupled to the second front side power rail, and the back side conductive pattern coupled to the second back side power rail, the multiple first FTV structures and the multiple second FTV structures are arranged alternatingly along the first axis, and the multiple first FTV structures overlap the multiple second FTV structures along the first axis, the multiple first FTV structures, the first back side power rail, and the first front side power rail are configured to carry a first power supply voltage, and the multiple second FTV structures, the second back side power rail, and the second front side power rail are configured to carry a second power supply voltage different from the first power supply voltage.

\* \* \* \* \*